(12) United States Patent
Kimura et al.

(10) Patent No.: US 10,658,519 B2
(45) Date of Patent: May 19, 2020

(54) SEMICONDUCTOR DEVICE, SEMICONDUCTOR WAFER, MODULE, ELECTRONIC DEVICE, AND MANUFACTURING METHOD THEREOF

(71) Applicant: SEMICONDUCTOR ENERGY LABORATORY CO., LTD., Atsugi-shi, Kanagawa-ken (JP)

(72) Inventors: Hajime Kimura, Kanagawa (JP); Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 16/377,405

(22) Filed: Apr. 8, 2019

(65) Prior Publication Data
US 2019/0229217 A1    Jul. 25, 2019

Related U.S. Application Data

(62) Division of application No. 15/455,637, filed on Mar. 10, 2017, now Pat. No. 10,333,004.

(30) Foreign Application Priority Data

Mar. 18, 2016  (JP) .................................. 2016-056297

(51) Int. Cl.
*H01L 29/786* (2006.01)
*H01L 27/12* (2006.01)
(Continued)

(52) U.S. Cl.
CPC ...... *H01L 29/7869* (2013.01); *H01L 21/0262* (2013.01); *H01L 21/324* (2013.01);
(Continued)

(58) Field of Classification Search
CPC .......... H01L 21/02252; H01L 29/7869; H01L 21/324
See application file for complete search history.

(56) References Cited

U.S. PATENT DOCUMENTS

2007/0072439 A1    3/2007  Akimoto et al.
2010/0224873 A1*   9/2010  Sakata .............. H01L 29/78606
                                                              257/43
(Continued)

FOREIGN PATENT DOCUMENTS

JP    2007-096055 A    4/2007
JP    2007-123861 A    5/2007
(Continued)

*Primary Examiner* — Jay C Chang
*Assistant Examiner* — Mikka Liu
(74) *Attorney, Agent, or Firm* — Fish & Richardson P.C.

(57) ABSTRACT

A semiconductor device including a highly reliable transistor is provided. A semiconductor device includes a transistor. The transistor includes first and second gate electrodes, first and second gate insulators, a source electrode, a drain electrode, first to sixth oxides, first and second layers, and first and second gate insulators. The third oxide is under the source electrode. The fourth oxide is under the drain electrode. The sixth oxide is under the second gate electrode. The third and fourth oxides each have a function of supplying oxygen to the second oxide. The sixth oxide has a function of supplying oxygen to the second gate insulator.

14 Claims, 59 Drawing Sheets

(51) Int. Cl.
*H01L 21/02* (2006.01)
*H01L 21/324* (2006.01)
*H01L 21/78* (2006.01)

(52) U.S. Cl.
CPC .......... *H01L 21/78* (2013.01); *H01L 27/1225* (2013.01); *H01L 29/78648* (2013.01); *H01L 29/78696* (2013.01)

(56) References Cited

U.S. PATENT DOCUMENTS

| | | | | |
|---|---|---|---|---|
| 2011/0018915 | A1* | 1/2011 | Umezaki | G09G 3/3677 345/698 |
| 2011/0031497 | A1* | 2/2011 | Yamazaki | H01L 27/1225 257/59 |
| 2011/0102018 | A1* | 5/2011 | Shionoiri | H01L 27/1225 326/98 |
| 2011/0140100 | A1 | 6/2011 | Takata et al. | |
| 2012/0119205 | A1 | 5/2012 | Taniguchi et al. | |
| 2013/0140569 | A1 | 6/2013 | Yoneda et al. | |
| 2013/0342779 | A1* | 12/2013 | Jung | G02B 6/0083 349/43 |
| 2014/0070209 | A1 | 3/2014 | Yamazaki et al. | |
| 2014/0175433 | A1 | 6/2014 | Yamazaki et al. | |
| 2014/0175436 | A1 | 6/2014 | Yamazaki | |
| 2014/0306219 | A1 | 10/2014 | Yamazaki et al. | |
| 2014/0367661 | A1* | 12/2014 | Akagawa | H01L 51/5256 257/40 |
| 2015/0070641 | A1* | 3/2015 | Uemura | G02F 1/136209 349/123 |
| 2015/0255518 | A1 | 9/2015 | Watanabe et al. | |
| 2016/0005873 | A1 | 1/2016 | Jintyou et al. | |
| 2016/0260837 | A1 | 9/2016 | Koezuka et al. | |
| 2016/0322395 | A1 | 11/2016 | Koezuka et al. | |
| 2016/0343868 | A1 | 11/2016 | Koezuka et al. | |
| 2017/0263650 | A1 | 9/2017 | Tochibayashi et al. | |
| 2017/0263782 | A1 | 9/2017 | Yamazaki | |
| 2017/0294541 | A1 | 10/2017 | Yamazaki | |
| 2017/0309752 | A1 | 10/2017 | Yamazaki et al. | |

FOREIGN PATENT DOCUMENTS

| | | |
|---|---|---|
| JP | 2011-124360 A | 6/2011 |
| JP | 2011-138934 A | 7/2011 |

\* cited by examiner

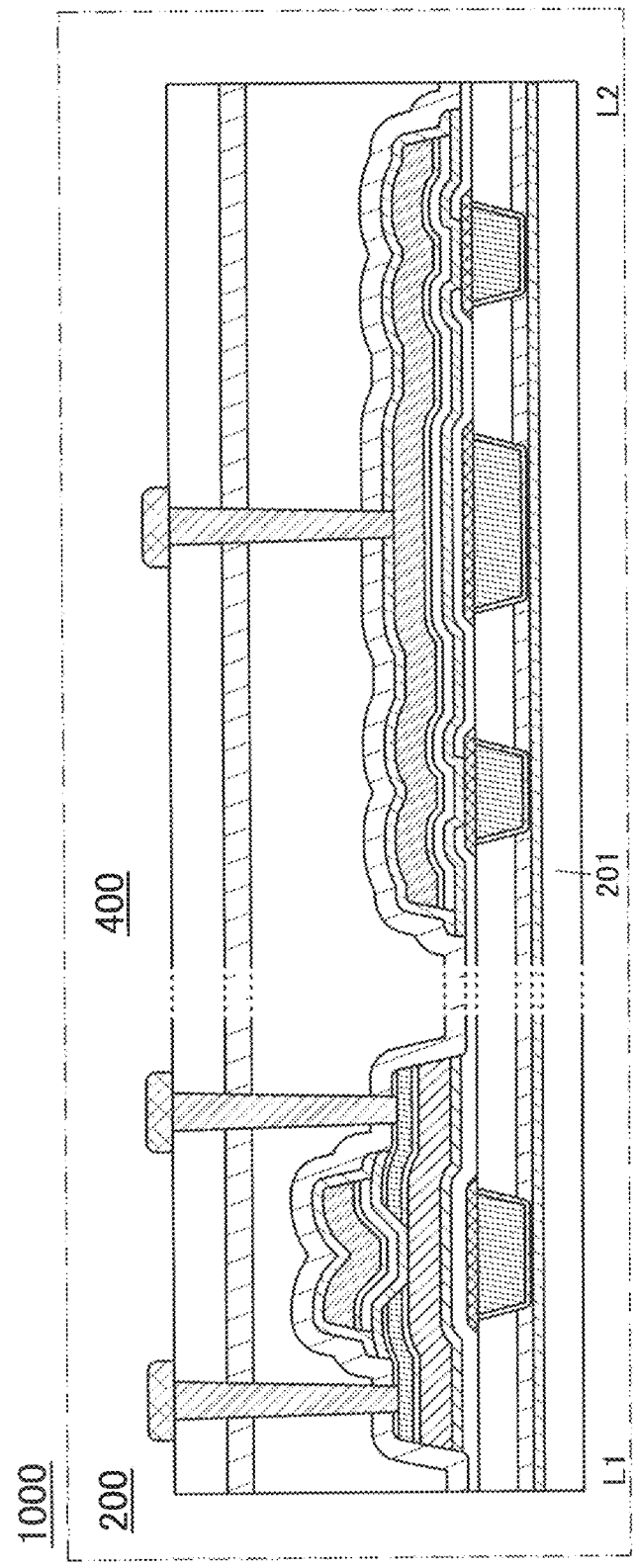
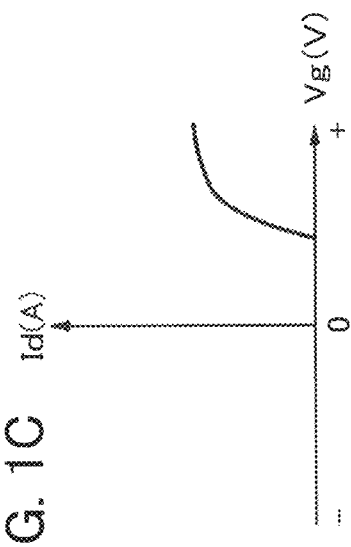
FIG. 1A
FIG. 1B
FIG. 1C

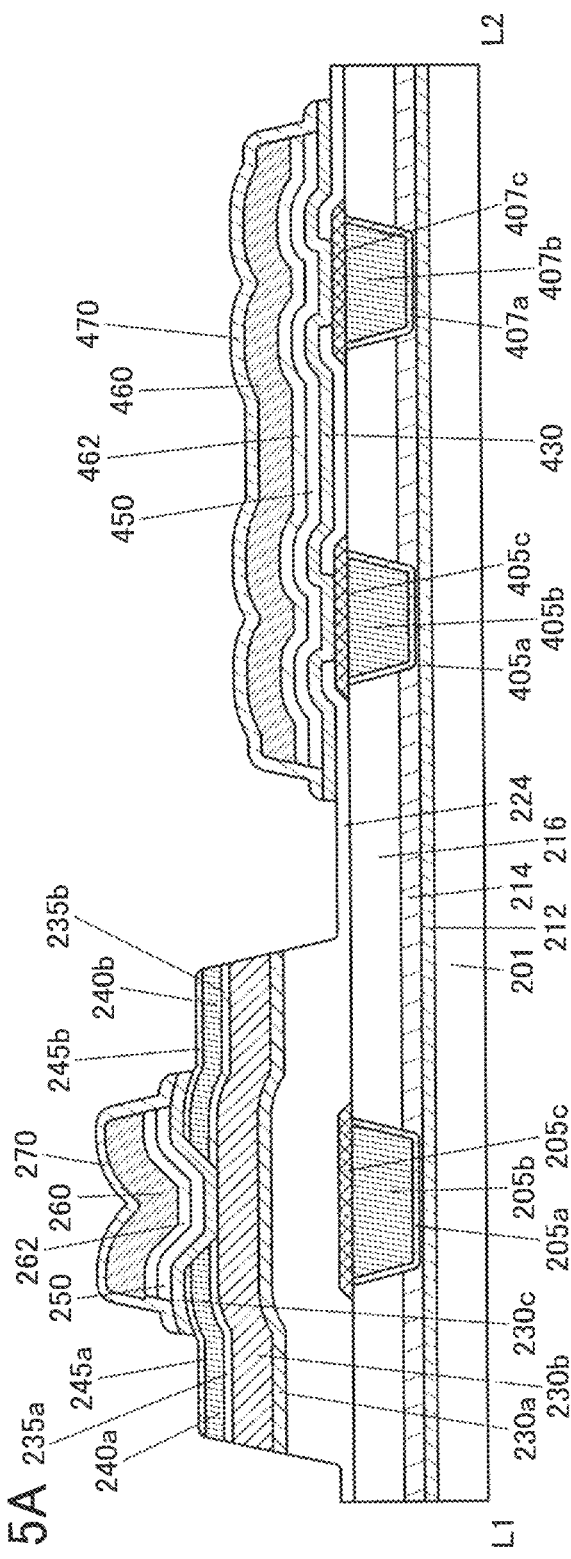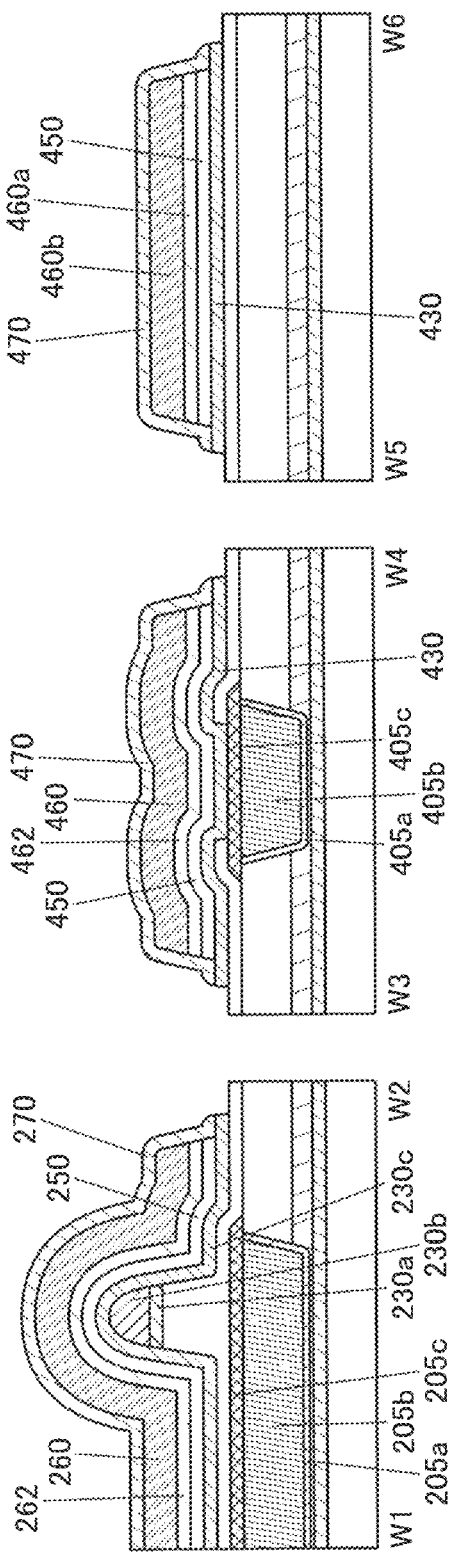

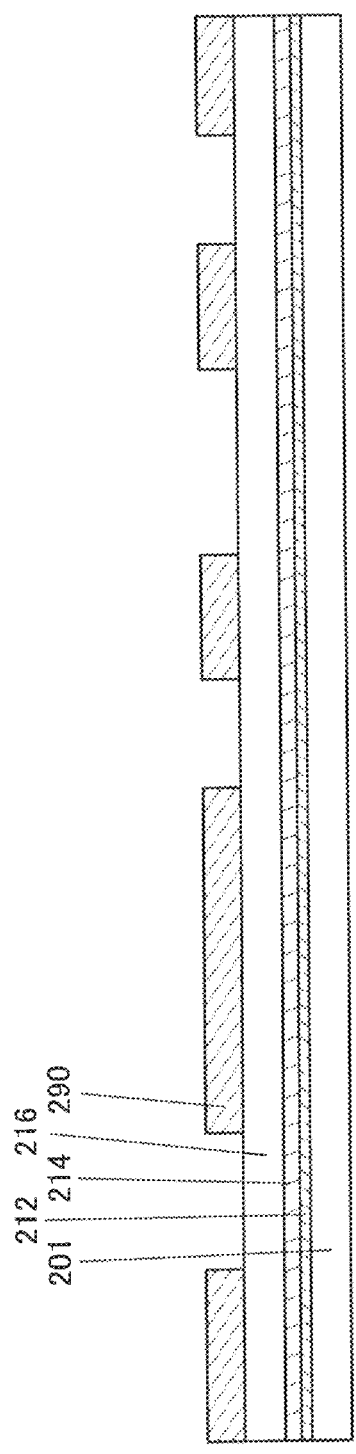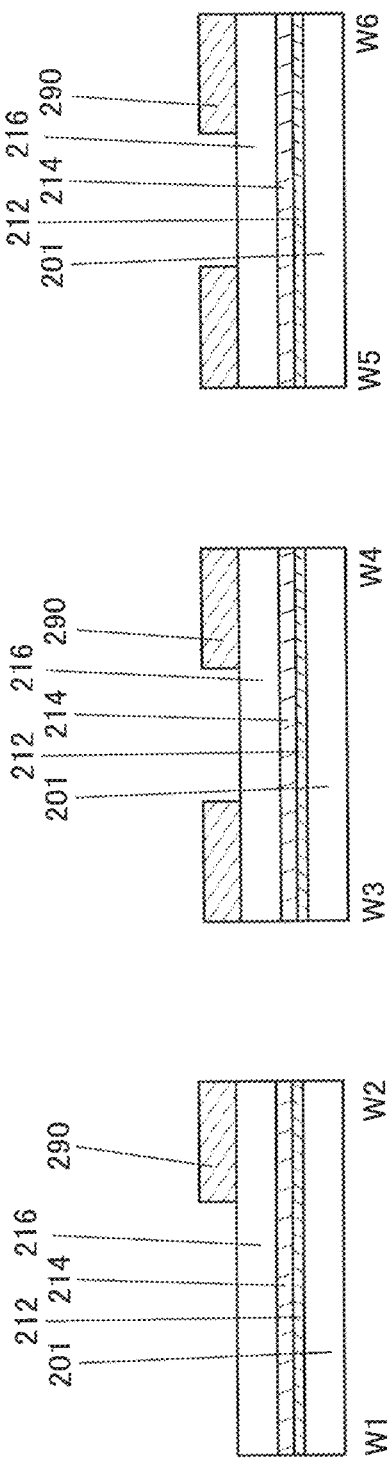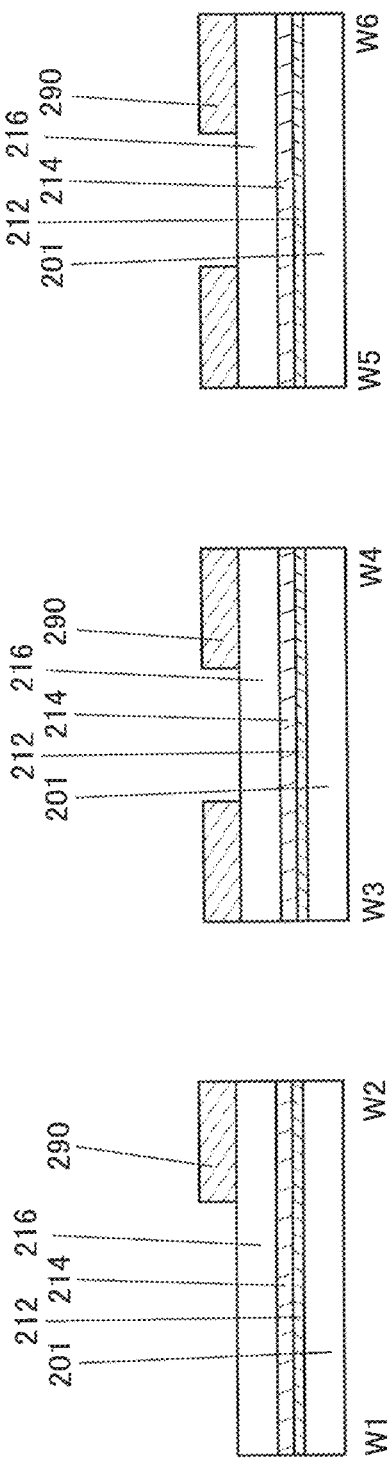

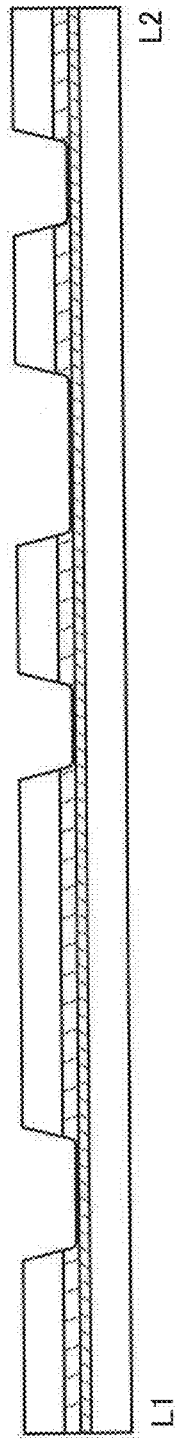
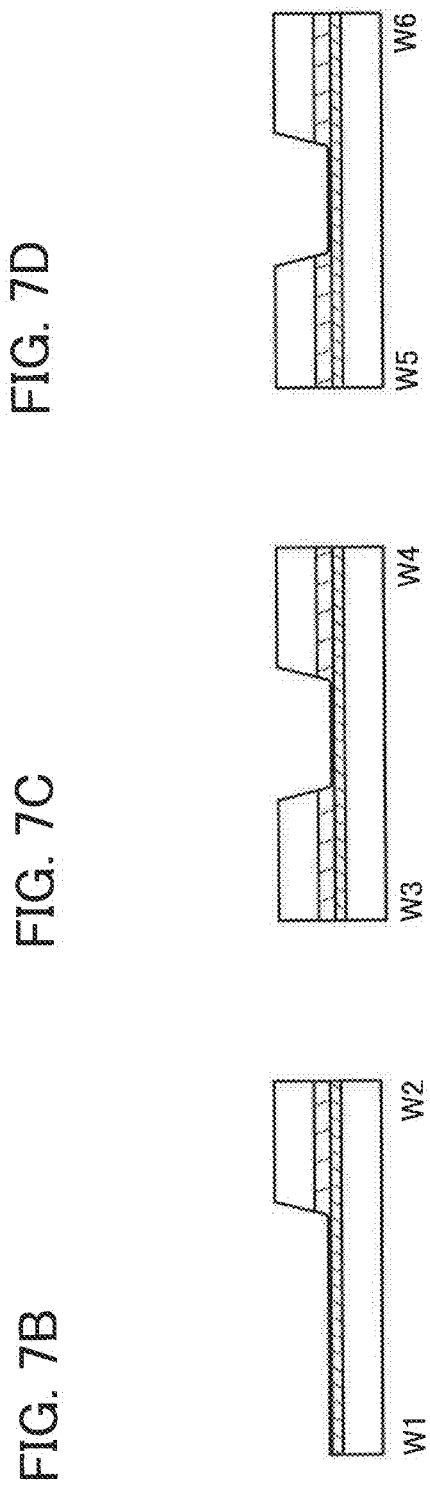
FIG. 7A
FIG. 7B
FIG. 7C
FIG. 7D

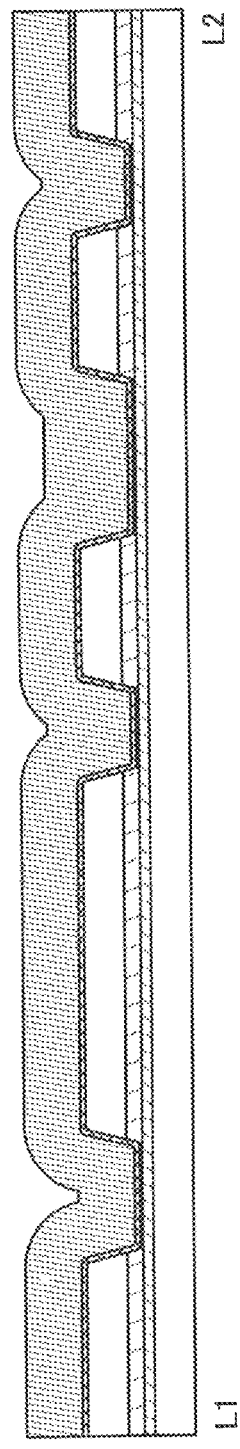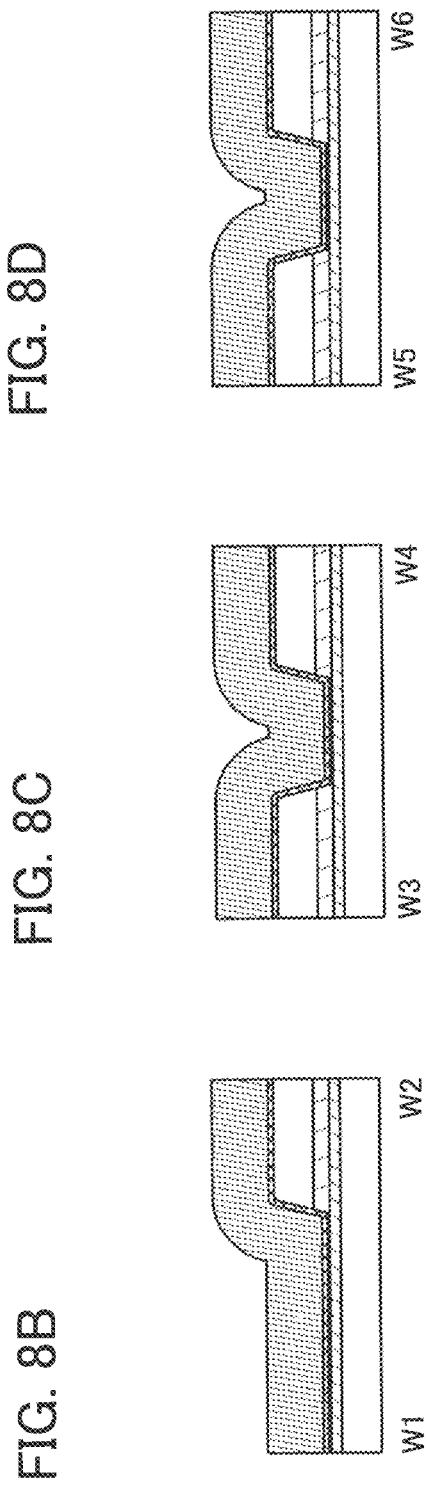

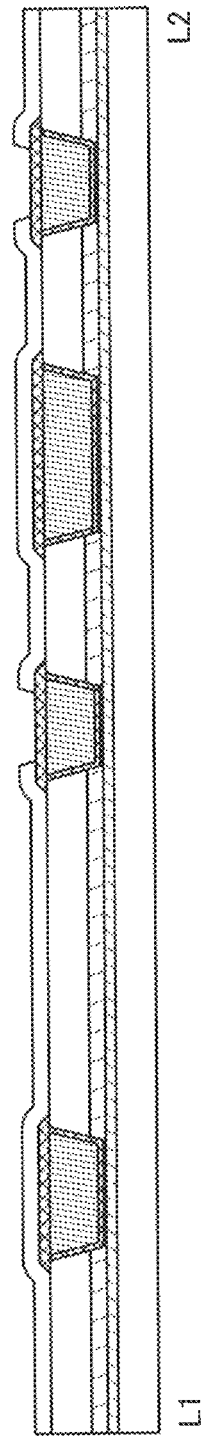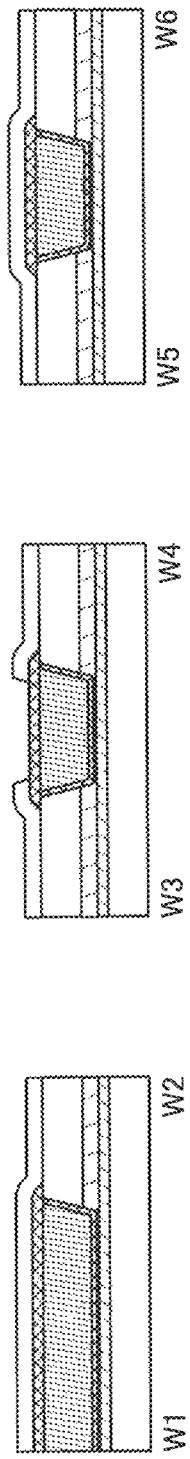
FIG. 13A
FIG. 13B
FIG. 13C
FIG. 13D

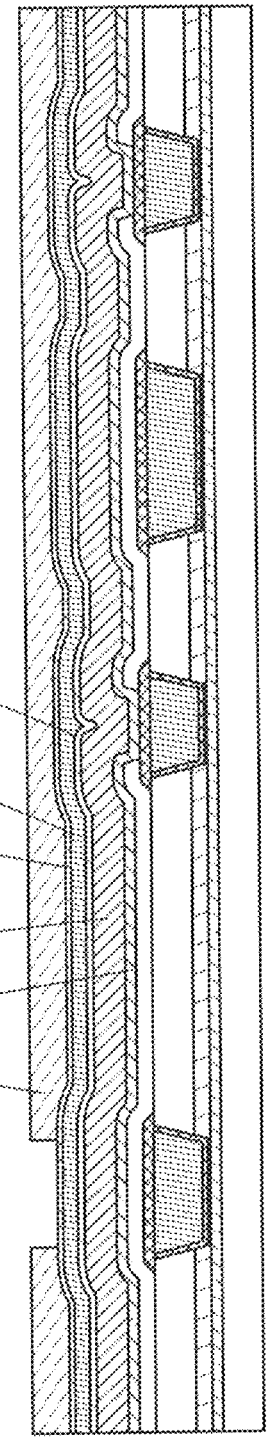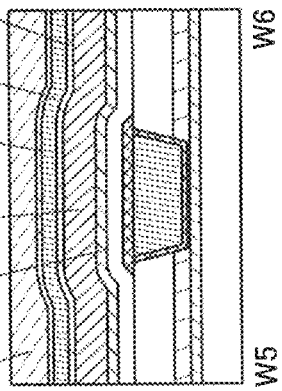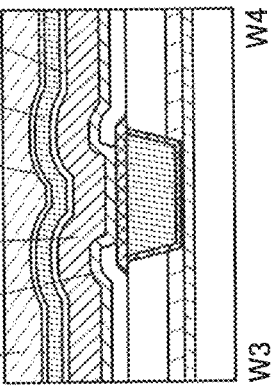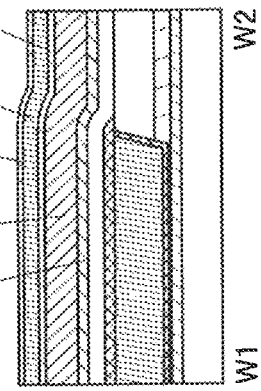

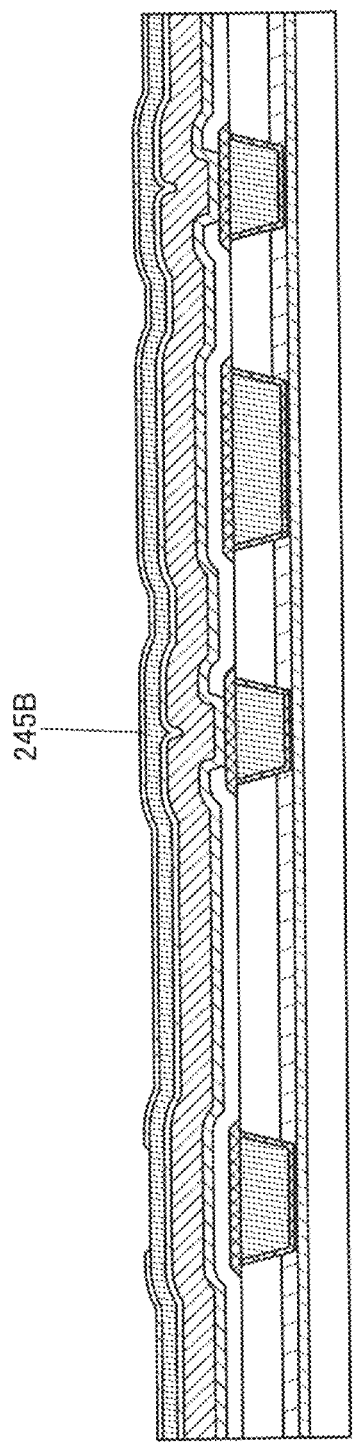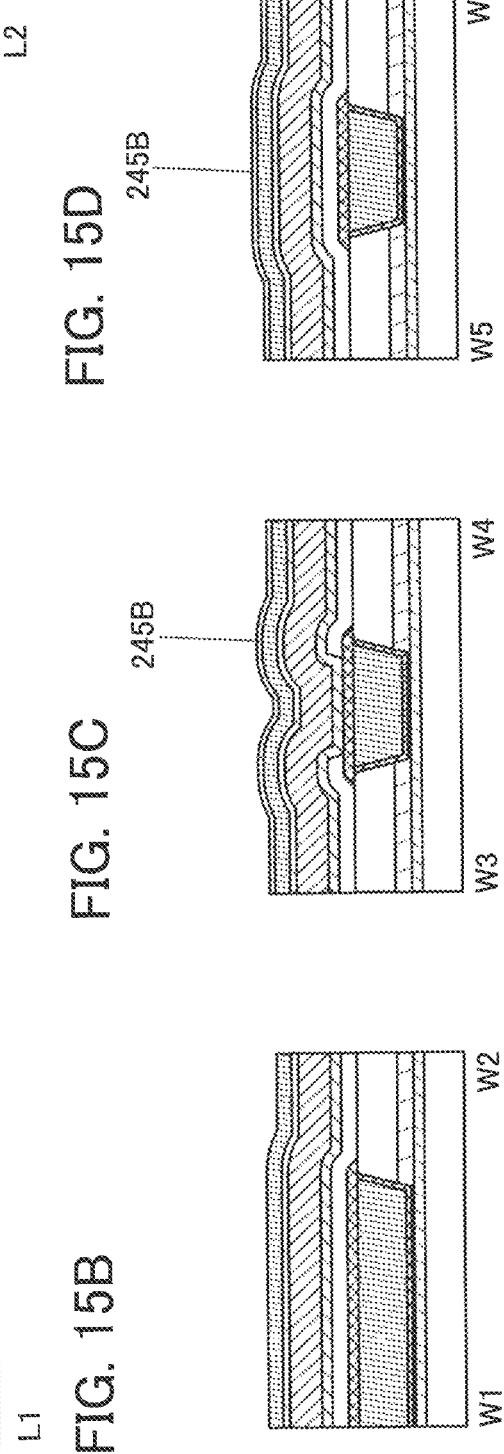

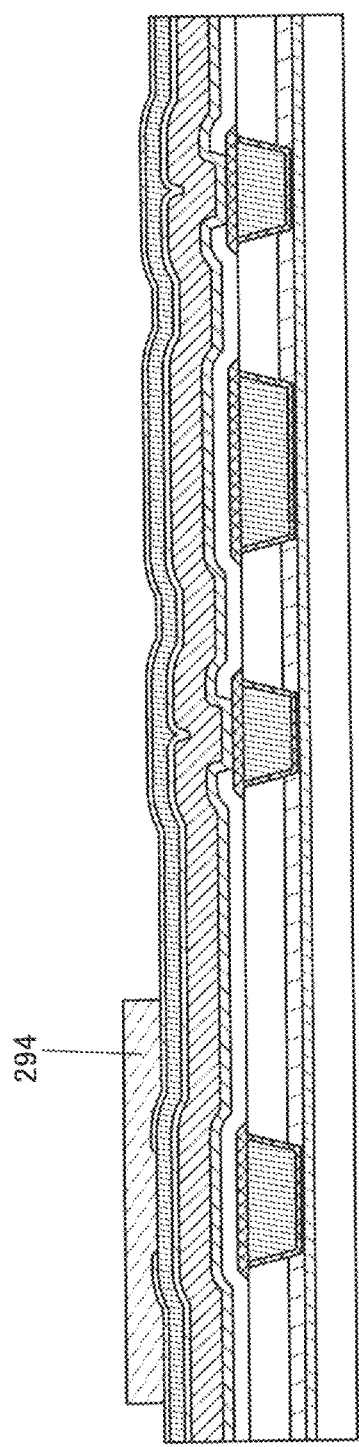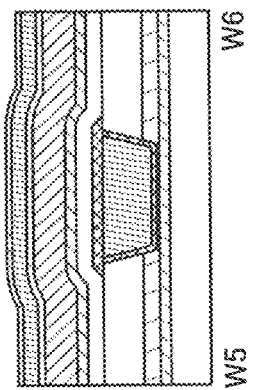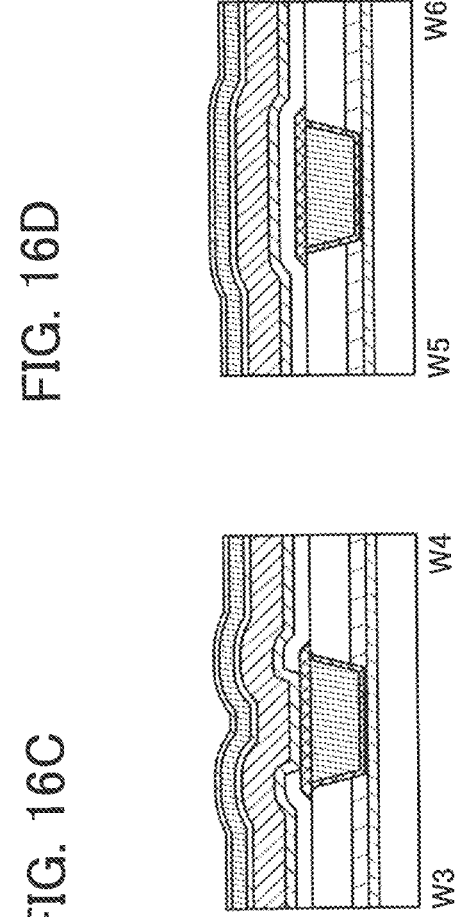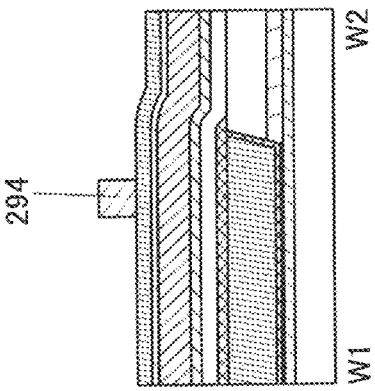

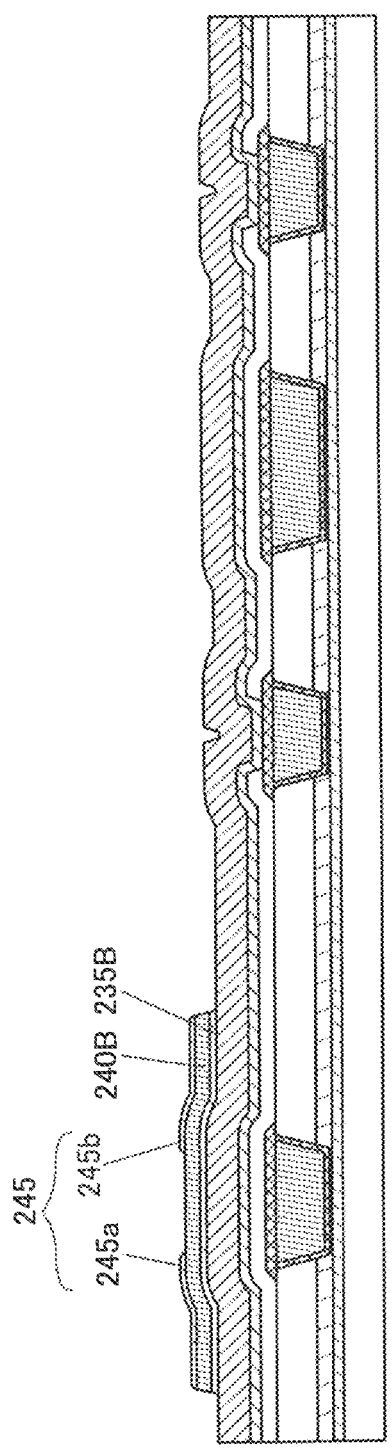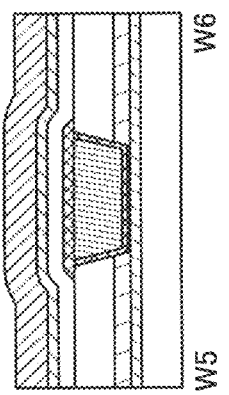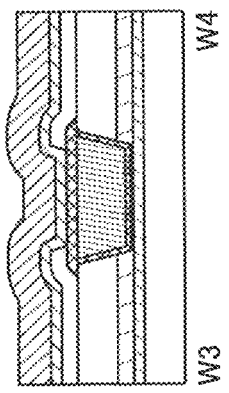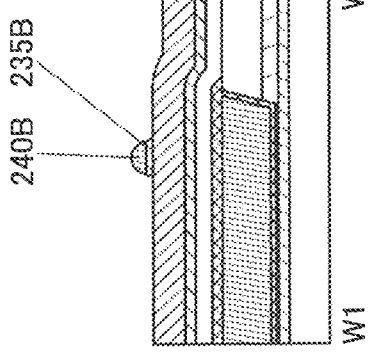

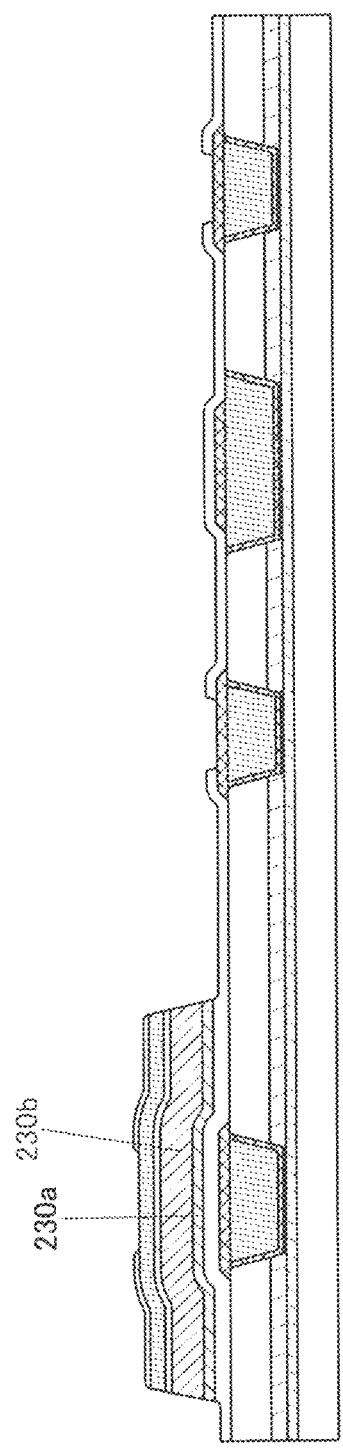
FIG. 18A
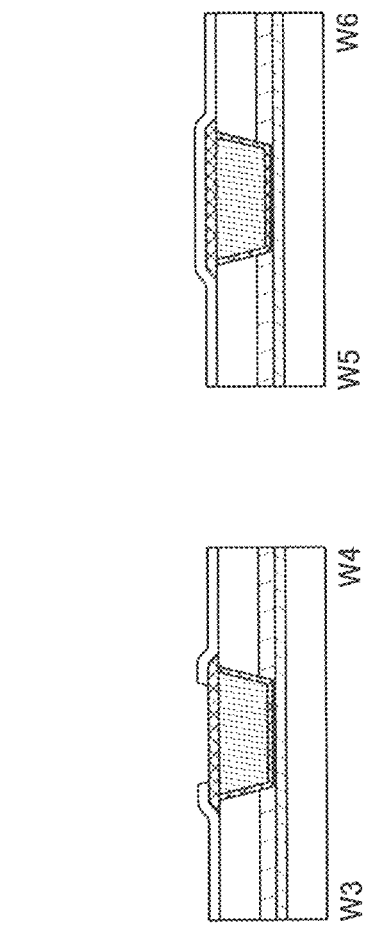
FIG. 18B
FIG. 18C
FIG. 18D
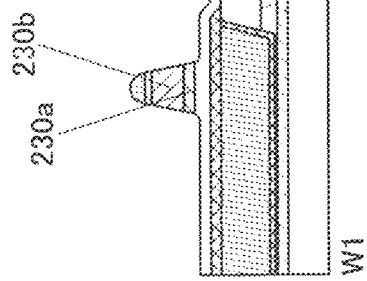

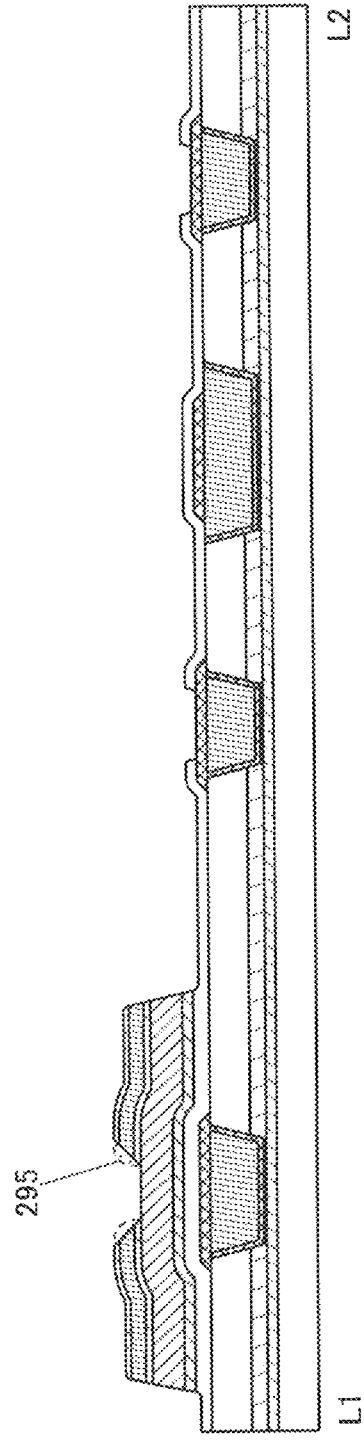
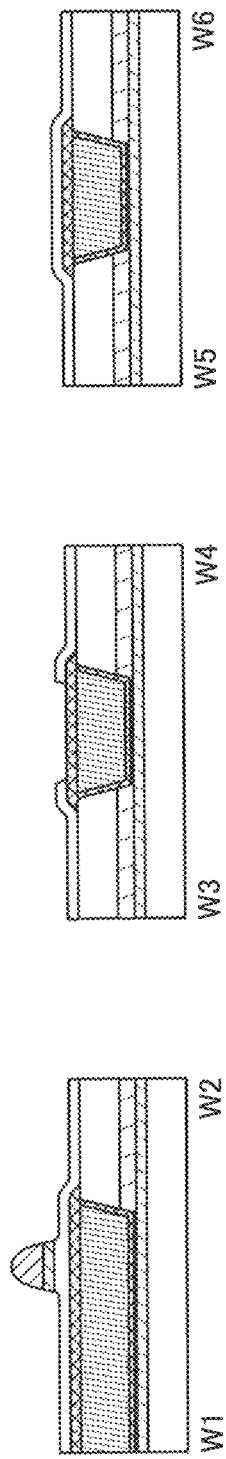

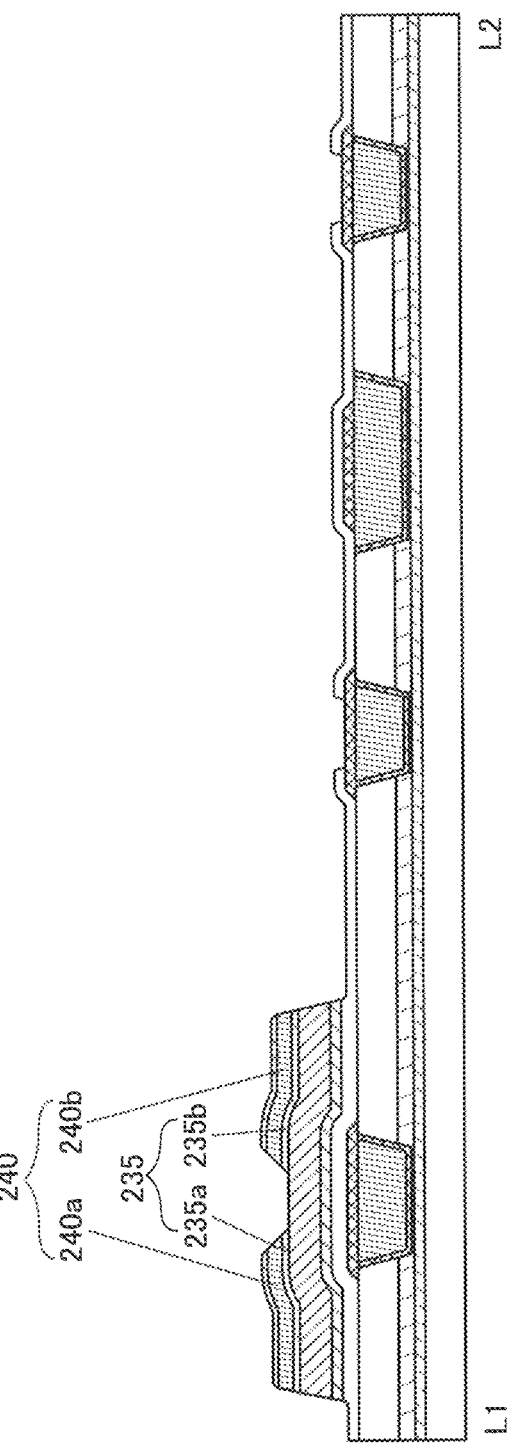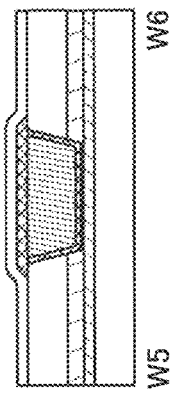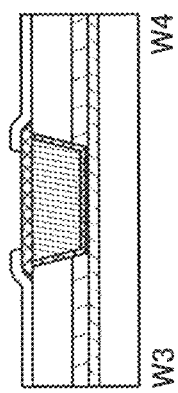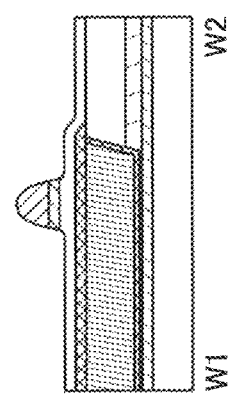

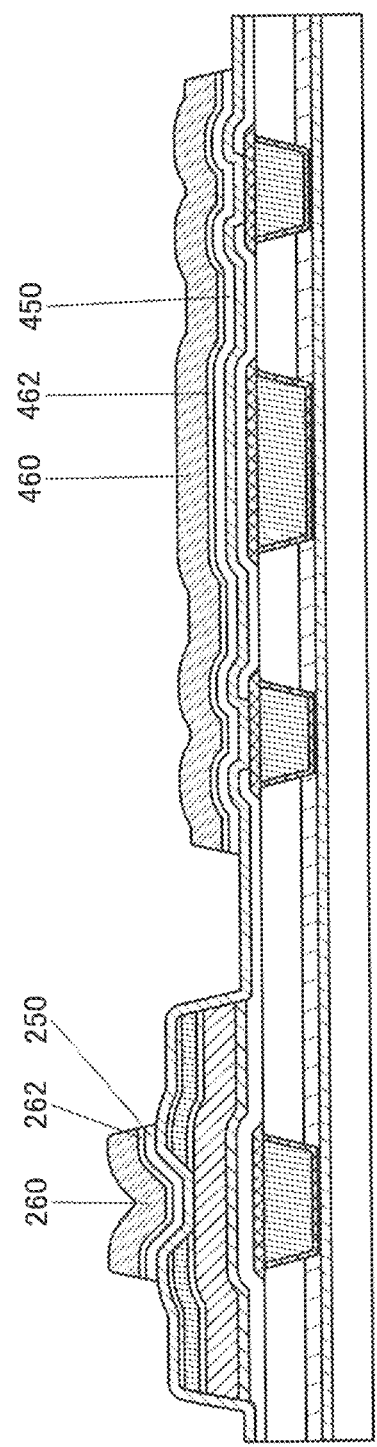
FIG. 22A
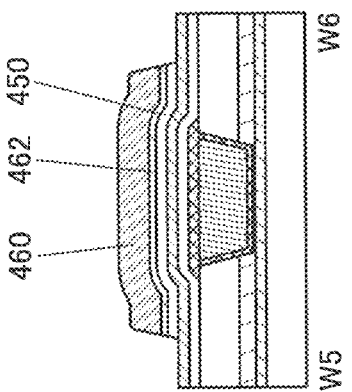
FIG. 22D
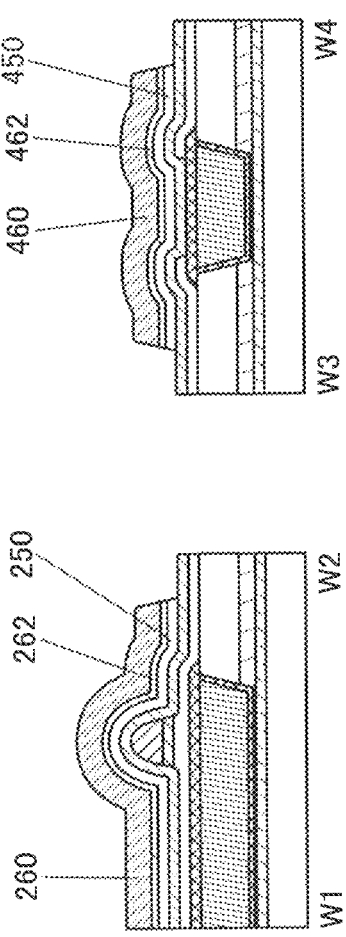
FIG. 22C
FIG. 22B

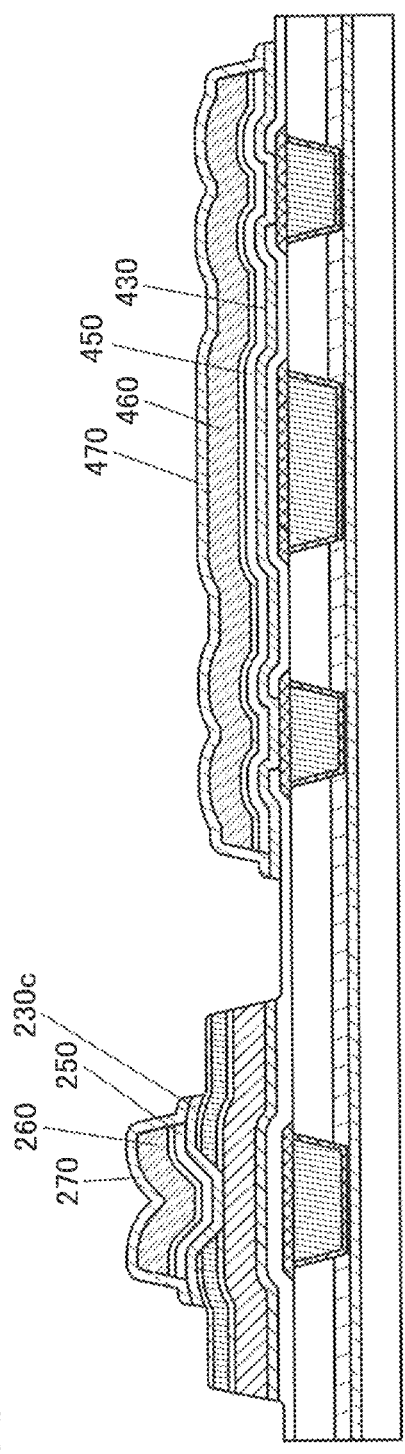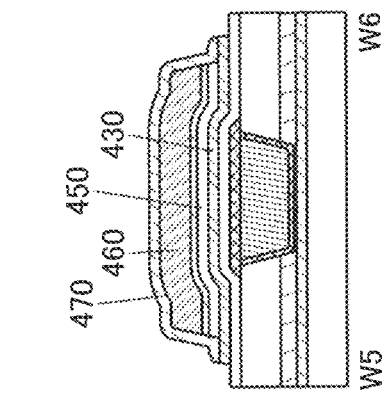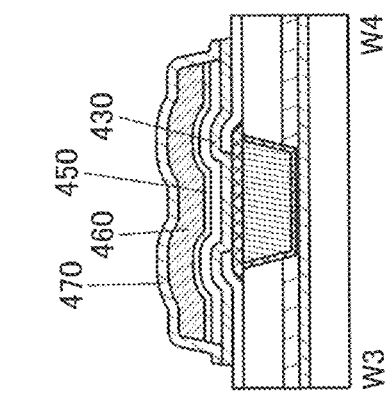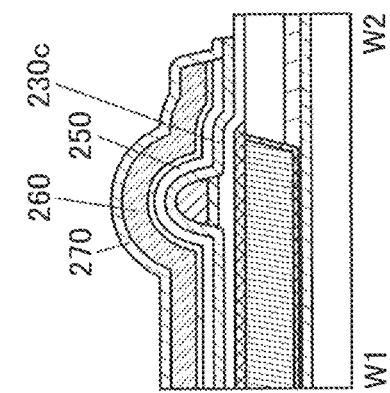

crystal structure of InMZnO$_4$

US 10,658,519 B2

SEMICONDUCTOR DEVICE, SEMICONDUCTOR WAFER, MODULE, ELECTRONIC DEVICE, AND MANUFACTURING METHOD THEREOF

CROSS-REFERENCE TO RELATED APPLICATIONS

This application is a divisional of U.S. application Ser. No. 15/455,637, filed Mar. 10, 2017, now allowed, which claims the benefit of a foreign priority application filed in Japan as Serial No. 2016-056297 on Mar. 18, 2016, both of which are incorporated by reference.

BACKGROUND OF THE INVENTION

1. Field of the Invention

One embodiment of the present invention relates to a semiconductor device and a driving method thereof. Another embodiment of the present invention relates to an electronic device.

Note that one embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device (e.g., a liquid crystal display device or a light-emitting display device), a projection device, a lighting device, an electro-optical device, a power storage device, a memory device, a semiconductor circuit, an imaging device, an electronic device, and the like may include a semiconductor device.

2. Description of the Related Art

A technique in which a transistor is formed using a semiconductor thin film has attracted attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, a technique in which a transistor is manufactured using a zinc oxide or an In—Ga—Zn-based oxide as an oxide semiconductor is disclosed (see Patent Documents 1 and 2).

In addition, a technique in which oxide semiconductors with different electron affinities (or conduction band minimum states) are stacked to increase the carrier mobility of a transistor is disclosed (see Patent Documents 3 and 4).

In recent years, demand for an integrated circuit in which transistors and the like are integrated with high density has risen with reductions in the size and weight of an electronic device. In addition, the productivity of a semiconductor device including an integrated circuit is required to be improved.

REFERENCE

Patent Document

[Patent Document 1] Japanese Published Patent Application No. 2007-123861

[Patent Document 2] Japanese Published Patent Application No. 2007-096055

[Patent Document 3] Japanese Published Patent Application No. 2011-124360

[Patent Document 4] Japanese Published Patent Application No. 2011-138934

SUMMARY OF THE INVENTION

An object of one embodiment of the present invention is to provide a semiconductor device having favorable electrical characteristics. Another object of one embodiment of the present invention is to provide a semiconductor device that can be miniaturized or highly integrated. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a low-power semiconductor device. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

A first transistor and a second transistor having different electrical characteristics from those of the first transistor are provided over the same layer. For example, a first transistor having a first threshold voltage and a second transistor having a second threshold voltage are provided over the same layer. A semiconductor where a channel of the first transistor is formed and a semiconductor where a channel of the second transistor is formed are formed using semiconductor materials having different electron affinities.

Providing transistors having different electrical characteristics in one semiconductor device can increase circuit design flexibility. On the other hand, the transistors need to be separately manufactured; thus, the number of manufacturing steps of the semiconductor device is drastically increased. The drastic increase in manufacturing steps easily leads a decrease in yield, and the productivity of the semiconductor device is significantly decreased in some cases. According to one embodiment of the present invention, transistors having different electrical characteristics can be provided in one semiconductor device, without drastic increase in the manufacturing steps.

(1) One embodiment of the present invention is a semiconductor device including a transistor. The transistor includes first to fourth conductors, first to sixth oxides, first and second layers, and first and second insulators. The first insulator includes a region overlapping with the first conductor. The first oxide is over the first insulator. The second oxide is over the first oxide. The second oxide includes first to third regions. The second region is between the first region and the third region. The third oxide is over the second oxide. The second conductor is over the third oxide. The first layer is over the second conductor. The third oxide, the second conductor, and the first layer each include a region overlapping with the first region. The fourth oxide is over the second oxide. The third conductor is over the fourth oxide. The second layer is over the third conductor. The fourth oxide, the third conductor, and the second layer each include a region overlapping with the third region. The fifth oxide includes a region overlapping with the first layer, a region overlapping with the second layer, and a region overlapping with the second region. The second insulator is over the fifth oxide. The sixth oxide is over the second insulator. The fourth conductor is over the sixth oxide. The second insulator, the sixth oxide, and the fourth conductor each include a region overlapping with the second region.

(2) One embodiment of the present invention is the semiconductor device described in (1), in which the third oxide, the fourth oxide, and the sixth oxide each include a metal oxide.

(3) One embodiment of the present invention is the semiconductor device described in (1) or (2), in which the first oxide, the second oxide, and the fifth oxide each include an oxide semiconductor.

(4) One embodiment of the present invention is the semiconductor device described in any one of (1) to (3), in which the first layer and the second layer each include a metal and oxygen.

(5) One embodiment of the present invention is a module including the semiconductor device described in any one of (1) to (4) and a printed circuit board.

(6) One embodiment of the present invention is an electronic device including the semiconductor device described in any one of (1) to (4), the module described in (5), and at least one of a speaker and an operation key.

(7) One embodiment of the present invention is a semiconductor wafer including a plurality of the semiconductor devices described in any one of (1) to (4) and a region for dicing.

(8) One embodiment of the present invention is a method for manufacturing a semiconductor device, including the steps of forming a second insulator over a first insulator; forming a first opening whose bottom portion reaches the first insulator in the second insulator; forming a first gate electrode in the first opening; forming a first gate insulator over the second insulator and the first gate electrode; forming a first oxide over the first gate insulator; forming a second oxide over the first oxide; forming a third oxide over the second oxide; forming a conductor over the third oxide; forming a first layer over the conductor; forming a second opening by processing the first layer by a lithography method so that the conductor is exposed in a bottom portion of the second opening; forming a second layer including the second opening, the third oxide, the conductor, and the first layer by processing the third oxide, the conductor, and the first layer by a lithography method; processing the second oxide and the first oxide with the use of the second layer as an etching mask; removing the third oxide and the conductor exposed in the bottom portion of the second opening to expose the second oxide in the bottom portion of the second opening, to divide the conductor into a source electrode and a drain electrode, the third oxide into a fourth oxide and a fifth oxide, and the first layer into a third layer and a fourth layer, and to form a fifth layer including the first oxide, the second oxide, the source electrode, the drain electrode, the fourth oxide, the fifth oxide, the third layer, and the fourth layer; performing plasma treatment using an oxidizing gas to release and reduce an impurity included in the first oxide and the second oxide; performing heat treatment in an atmosphere including a nitrogen gas and heat treatment in an atmosphere including an oxygen gas to release and reduce hydrogen and water included in the first oxide and the second oxide; forming a sixth oxide over the fifth layer; forming a second gate insulator over the sixth oxide; forming a seventh oxide over the second gate insulator; and forming a second gate electrode over the seventh oxide. Oxygen is added to the second gate insulator in the step of forming the seventh oxide.

(9) One embodiment of the present invention is the method for manufacturing a semiconductor device described in (8), in which the oxidizing gas includes dinitrogen monoxide.

(10) One embodiment of the present invention is the method for manufacturing a semiconductor device described in (8) or (9), in which the fourth oxide, the fifth oxide, and the seventh oxide each include a metal and oxygen.

(11) One embodiment of the present invention is a method for manufacturing a module including a semiconductor device manufactured by the method for manufacturing a semiconductor device described in any one of (8) to (10) and a printed circuit board.

(12) One embodiment of the present invention is a method for manufacturing an electronic device including a semiconductor device manufactured by the method for manufacturing a semiconductor device described in any one of (8) to (10), a module manufactured by the method for manufacturing a module described in (11), and at least one of a speaker and an operation key.

According to one embodiment of the present invention, a semiconductor device having favorable electrical characteristics can be provided. According to one embodiment of the present invention, a semiconductor device that can be miniaturized or highly integrated can be provided. According to one embodiment of the present invention, a semiconductor device that can be manufactured with high productivity can be provided.

According to one embodiment of the present invention, a semiconductor device capable of retaining data for a long time can be provided. According to one embodiment of the present invention, a semiconductor device capable of high-speed data writing can be provided. According to one embodiment of the present invention, a semiconductor device with high design flexibility can be provided. According to one embodiment of the present invention, a low-power semiconductor device can be provided. According to one embodiment of the present invention, a novel semiconductor device can be provided.

Note that the descriptions of these effects do not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

In the accompanying drawings:

FIG. 1A is a cross-sectional view of a semiconductor device of one embodiment of the present invention and FIGS. 1B and 1C show electrical characteristics of the semiconductor device;

FIGS. 5A to 5D illustrate cross sections of transistors of embodiments of the present invention;

FIGS. 6A to 6D illustrate a method for manufacturing transistors of embodiments of the present invention;

FIGS. 7A to 7D illustrate a method for manufacturing transistors of embodiments of the present invention;

FIGS. 8A to 8D illustrate a method for manufacturing transistors of embodiments of the present invention;

FIGS. 13A to 13D illustrate a method for manufacturing transistors of embodiments of the present invention;

FIGS. 14A to 14D illustrate a method for manufacturing transistors of embodiments of the present invention;

FIGS. 15A to 15D illustrate a method for manufacturing transistors of embodiments of the present invention;

FIGS. 16A to 16D illustrate a method for manufacturing transistors of embodiments of the present invention;

FIGS. 17A to 17D illustrate a method for manufacturing transistors of embodiments of the present invention;

FIGS. 18A to 18D illustrate a method for manufacturing transistors of embodiments of the present invention;

FIGS. 19A to 19D illustrate a method for manufacturing transistors of embodiments of the present invention;

FIGS. 20A to 20D illustrate a method for manufacturing transistors of embodiments of the present invention;

FIGS. 22A to 22D illustrate a method for manufacturing transistors of embodiments of the present invention;

FIGS. 24A to 24D illustrate a method for manufacturing transistors of embodiments of the present invention;

DETAILED DESCRIPTION OF THE INVENTION

Figure 2:
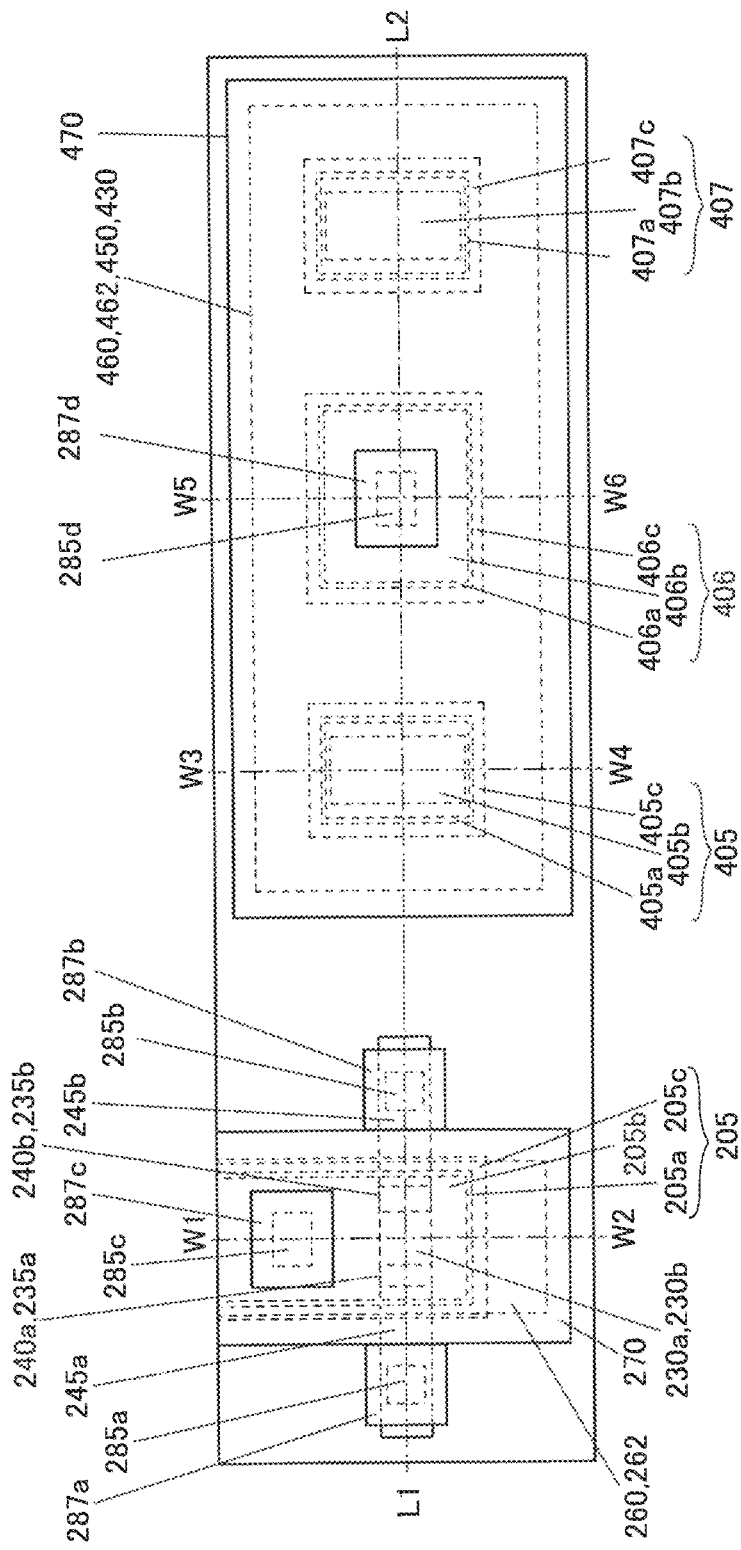
FIG. 2 is a top view illustrating transistors of embodiments of the present invention.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a layer, a resist mask, or the like might be unintentionally reduced in size by treatment such as etching, which is not illustrated in some cases for easy understanding.

Especially in a top view (also referred to as a "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. A term with an ordinal number in this specification and the like might not be provided with an ordinal number in a claim and the like.

In addition, in this specification and the like, a term such as an "electrode" or a "wiring" does not limit the function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having a different polarity is employed or the direction of current flow is changed in circuit operation. Therefore, it is difficult to define which is the source (or the drain). Thus, the terms "source" and "drain" can be used to denote the drain and the source, respectively, in this specification.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

In this specification and the like, the term "electrically connected" includes the case where components are connected through an "object having any electric function". There is no particular limitation on an "object having any electric function" as long as electric signals can be transmitted and received between components that are connected through the object. Thus, even when the expression "electrically connected" is used, there is a case in which no physical connection is made and a wiring is just extended in an actual circuit.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value, in a region where a channel is formed.

The channel width refers to, for example, the length of a channel region perpendicular to the channel length direction in a region where a semiconductor (or a portion where a current flows in a semiconductor when a transistor is on) and a gate electrode overlap with each other, or a region where a channel is formed in a top view of the transistor. In one transistor, channel widths in all regions are not necessarily the same. In other words, the channel width of one transistor is not limited to one value in some cases. Therefore, in this specification, the channel width is any one of values, the maximum value, the minimum value, or the average value, in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering side surfaces of a semiconductor, an effective channel width is greater than an apparent channel width, and its influence cannot be ignored in some cases. For example, in a miniaturized transistor having a gate electrode covering side surfaces of a semiconductor, the proportion of a channel formation region formed in the side surfaces of the semiconductor is increased in some cases. In that case, an effective channel width is greater than an apparent channel width.

In such a case, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, an apparent channel width is referred to as a "surrounded channel width (SCW)" in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Note that impurities in a semiconductor refer to, for example, elements other than the main components of the semiconductor. For example, an element with a concentration of lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. In the case of an oxide semiconductor, water also serves as an impurity in some cases. In the case of an oxide semiconductor, oxygen vacancies may be formed by entry of impurities. In the case where the semiconductor is silicon, examples of an impurity which changes characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" or "orthogonal" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

In the specification and the like, the terms "identical", "the same", "equal", "uniform", and the like (including synonyms thereof) used in describing calculation values and actual measurement values allow for a margin of error of ±20% unless otherwise specified.

In this specification and the like, in the case where an etching step (removal step) is performed after a resist mask is formed in a photolithography method, the resist mask is removed after the etching step, unless otherwise specified.

In this specification and the like, a high power supply potential $V_{DD}$ (also referred to as "$V_{DD}$" or "H potential") is a power supply potential higher than a low power supply potential $V_{SS}$. The low power supply potential $V_{SS}$ (also referred to as "$V_{SS}$" or "L potential") is a power supply potential lower than the high power supply potential $V_{DD}$. In addition, a ground potential (also referred to as "GND" or a "GND potential") can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Furthermore, unless otherwise specified, transistors described in this specification and the like are enhancement-type (normally-off-type) field effect transistors. Unless otherwise specified, a transistor described in this specification and the like refers to an n-channel transistor. Thus, unless otherwise specified, the threshold voltage (also referred to as "$V_{th}$") is higher than 0 V.

Embodiment 1

Providing transistors having different electrical characteristics over the same layer can increase the degree of freedom in design of a semiconductor device and the integration degree in the semiconductor device. In this embodiment, an example of an embodiment where transistors having different electrical characteristics are provided over the same layer while an increase in the number of manufacturing steps is suppressed will be described.

Structure Example of Semiconductor Device 1000

FIG. 1A is a cross-sectional view of a semiconductor device 1000. The semiconductor device 1000 includes a transistor 200 and a transistor 400. The transistors 200 and 400 have different structures. FIG. 1A illustrates cross sections of the transistors 200 and 400 over a substrate 201. FIG. 1A corresponds to a cross-sectional view taken along dashed-dotted line L1-L2 in FIG. 2.

Figure 3:
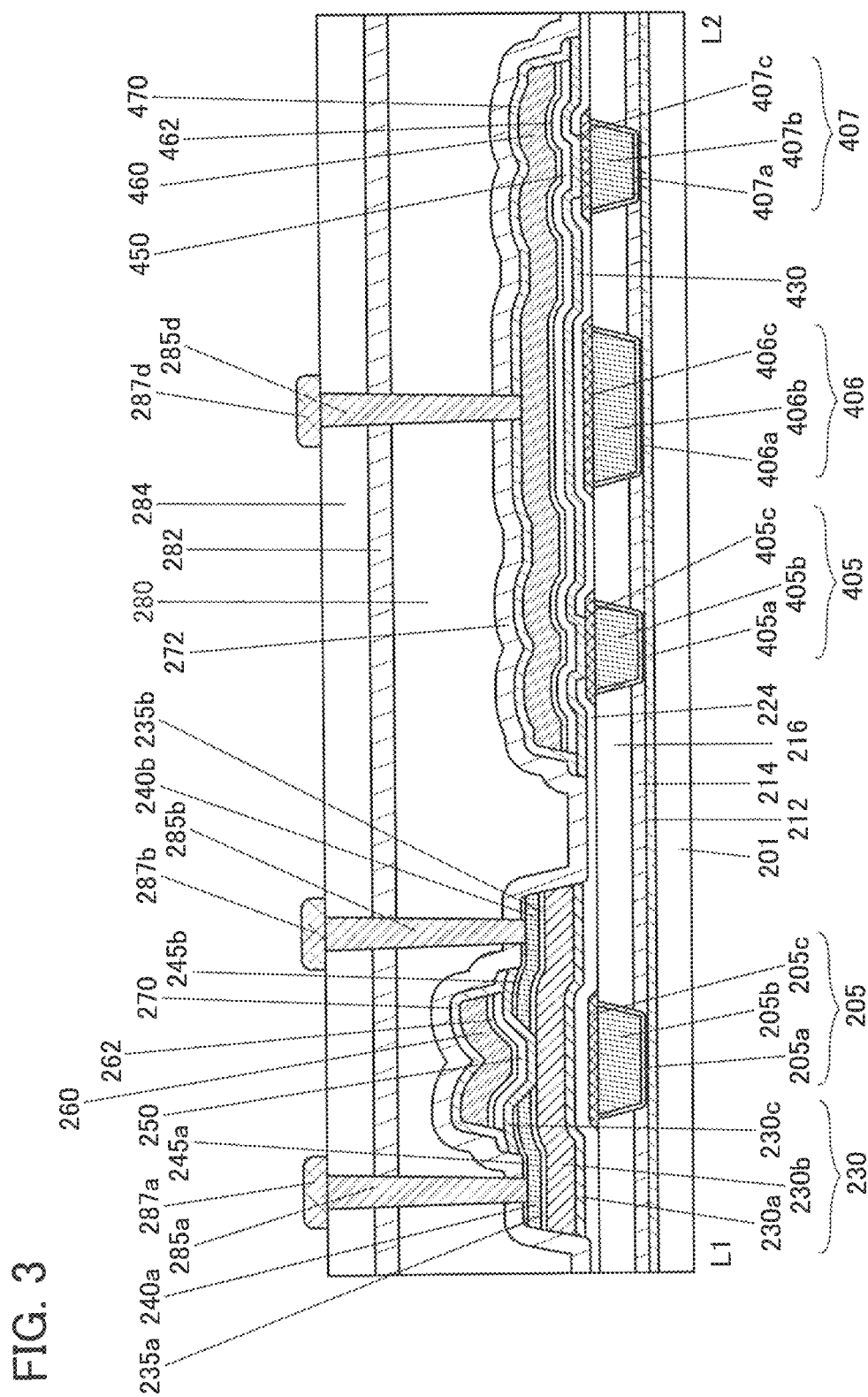
FIG. 3 illustrates a cross section of transistors of embodiments of the present invention.
Figure 4A:
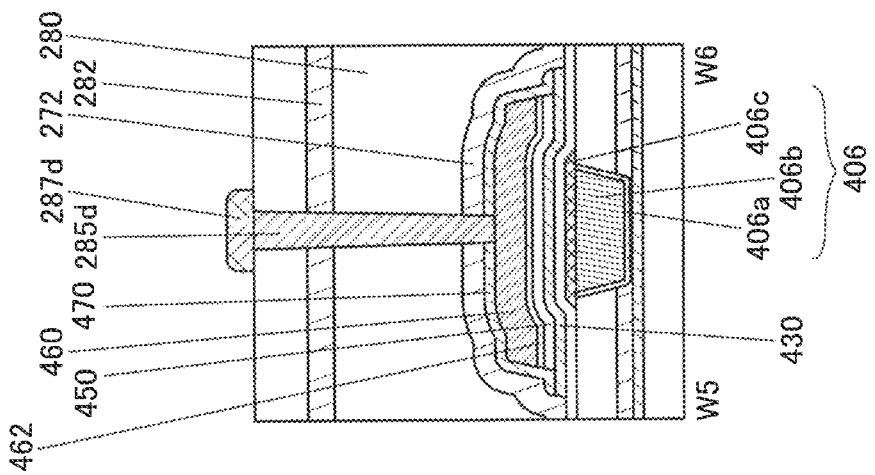
FIGS. 4A to 4C illustrate cross sections of transistors of embodiments of the present invention.
Figure 4B:
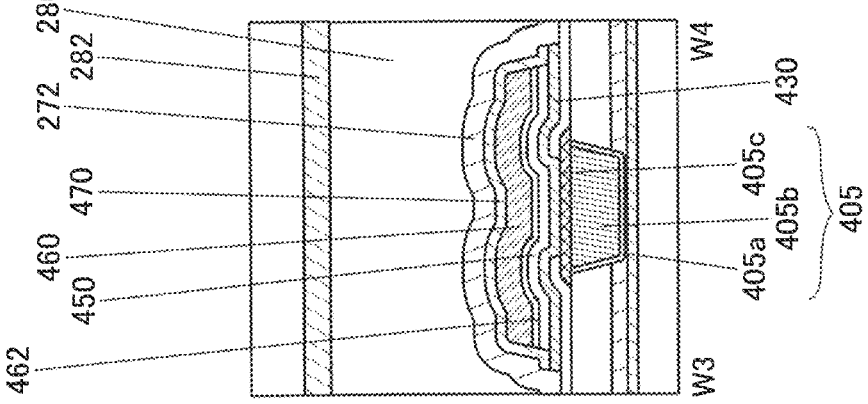
Figure 4C:
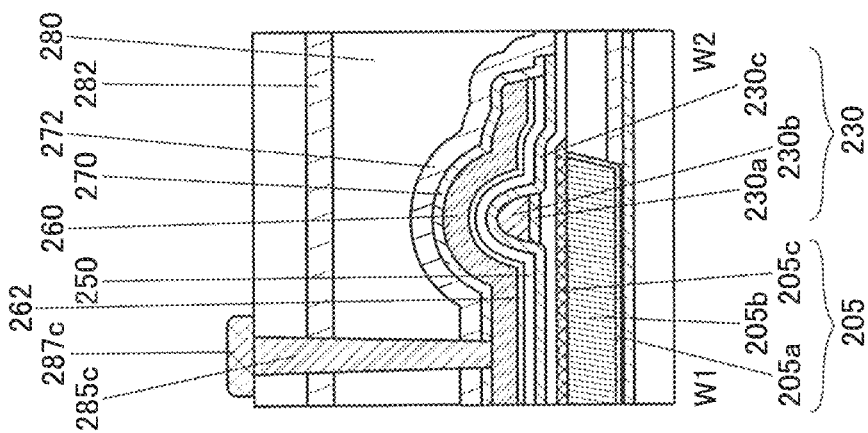
Figure 9A:
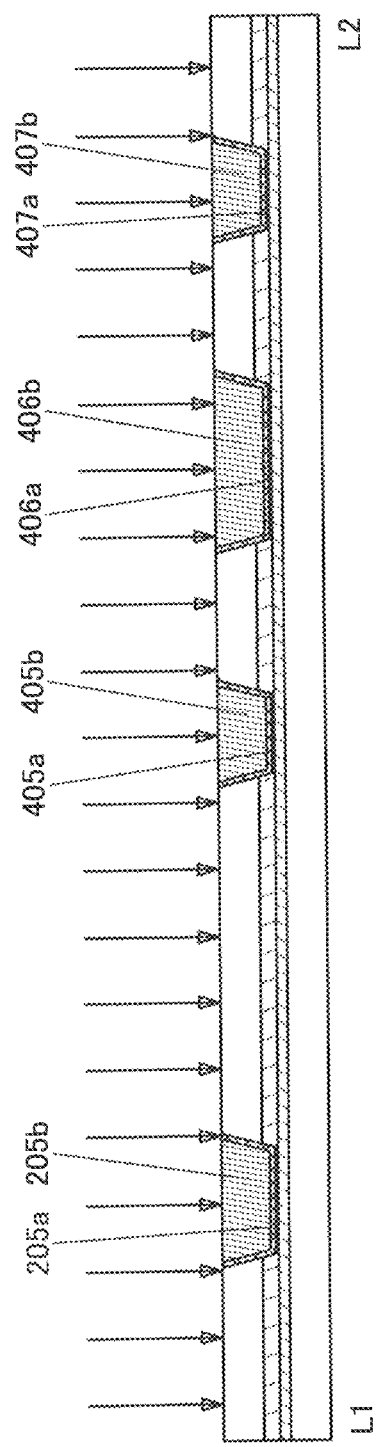
FIGS. 9A to 9D illustrate a method for manufacturing transistors of embodiments of the present invention.
Figure 9D:
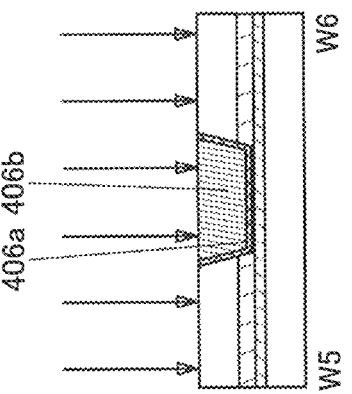
Figure 9C:
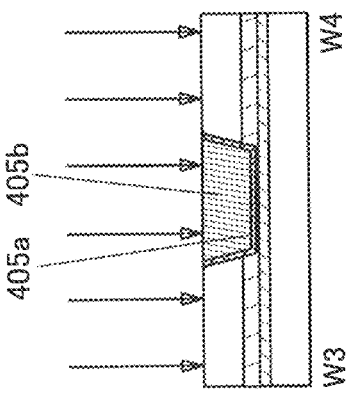
Figure 9B:
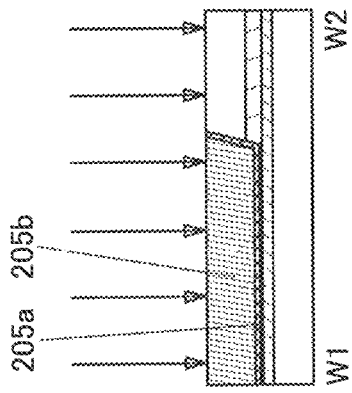
Figure 10A:
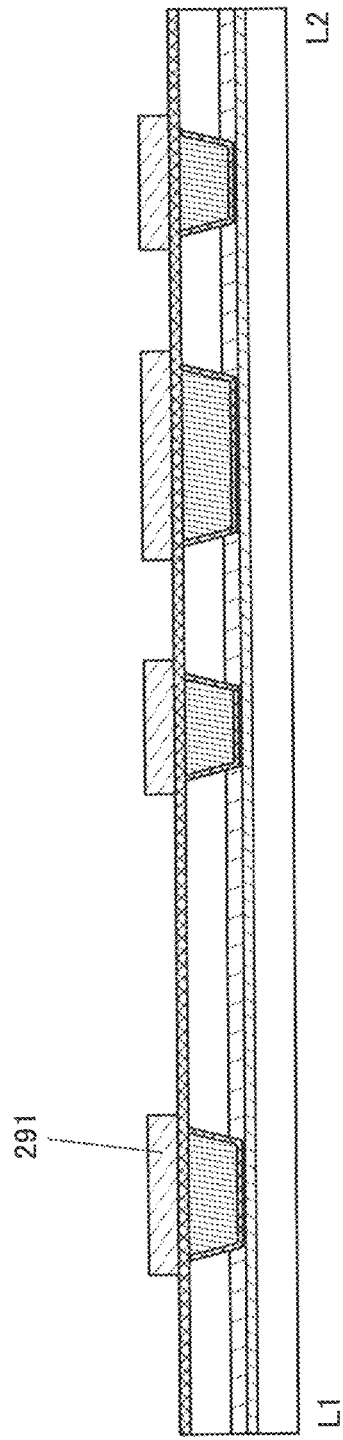
FIGS. 10A to 10D illustrate a method for manufacturing transistors of embodiments of the present invention.
Figure 10B:
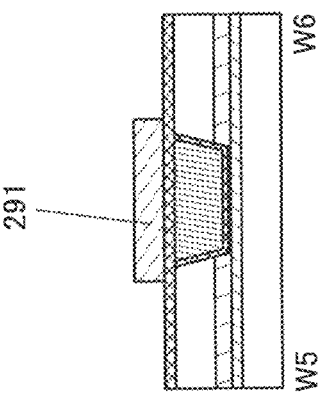
Figure 10C:
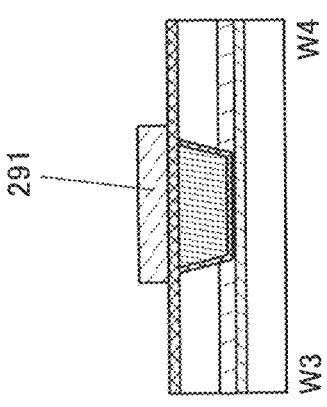
Figure 10D:
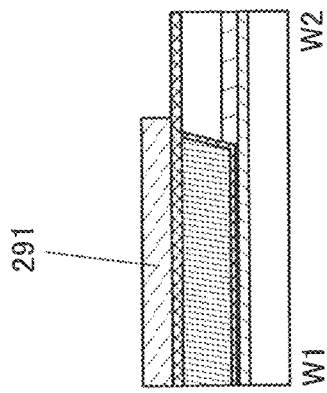
Figure 11A:
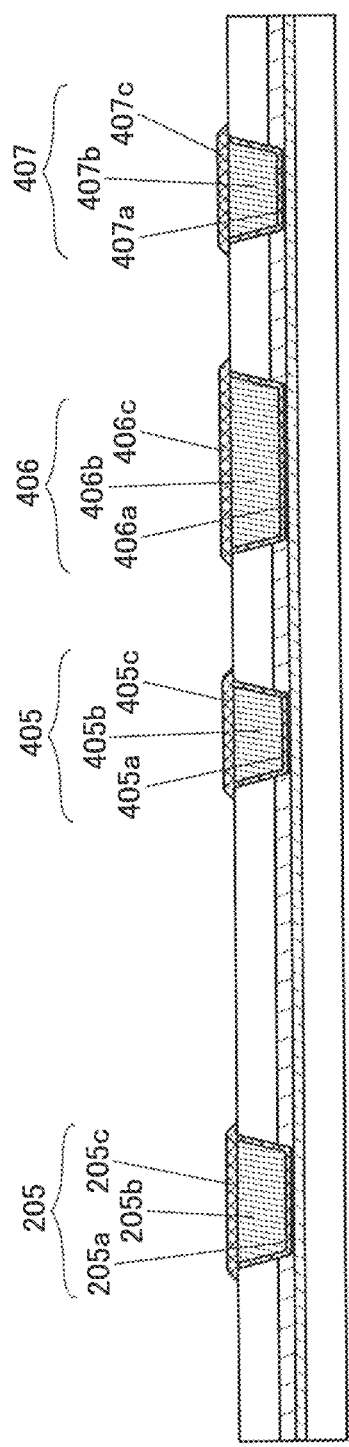
FIGS. 11A to 11D illustrate a method for manufacturing transistors of embodiments of the present invention.
Figure 11B:
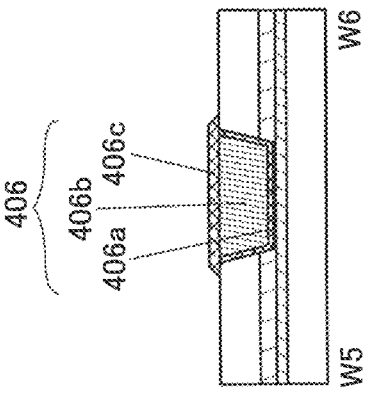
Figure 11C:
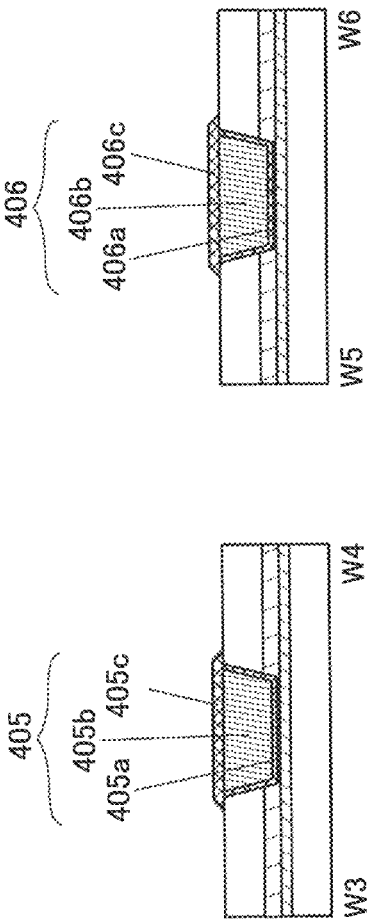
Figure 11D:
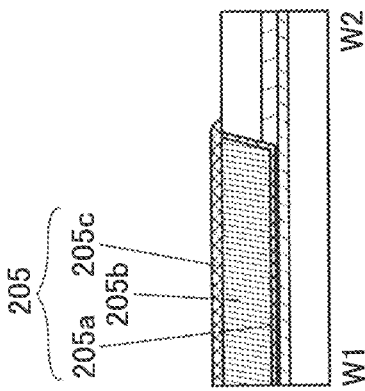
Figure 12A:
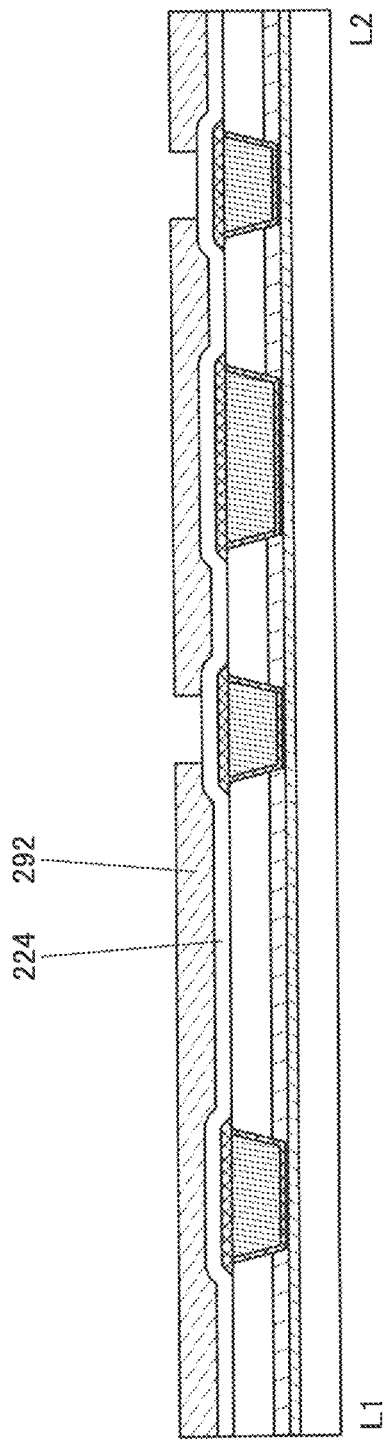
FIGS. 12A to 12D illustrate a method for manufacturing transistors of embodiments of the present invention.
Figure 12B:
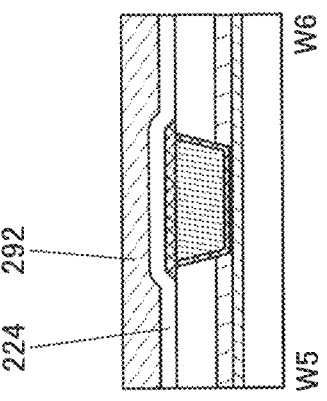
Figure 12C:
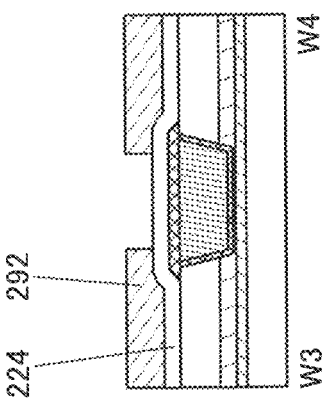
Figure 12D:
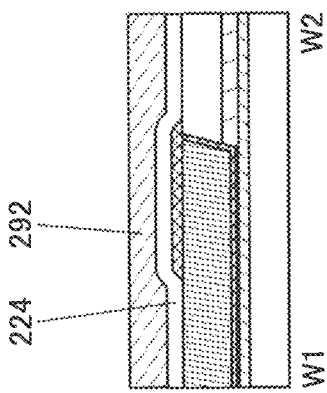
Figure 21A:
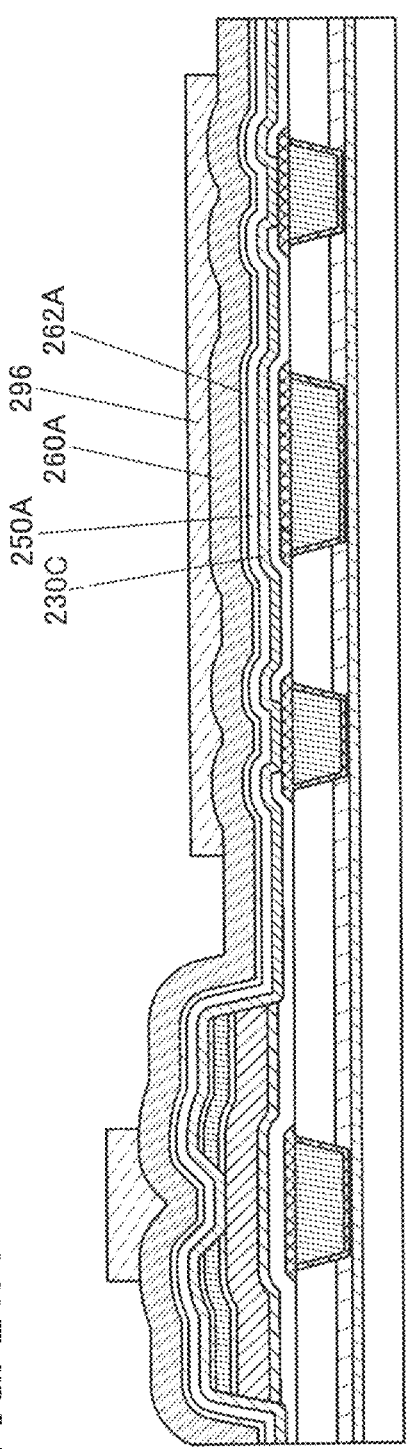
FIGS. 21A to 21D illustrate a method for manufacturing transistors of embodiments of the present invention.
Figure 21D:
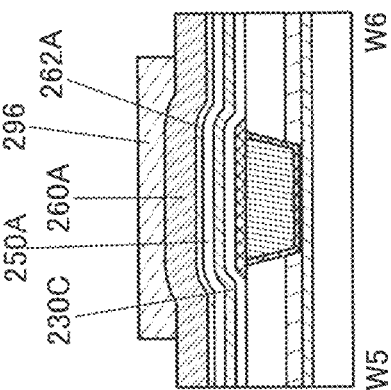
Figure 21C:
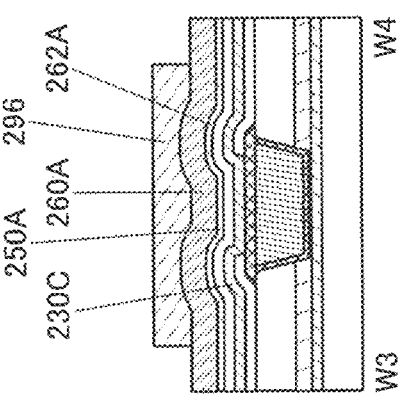
Figure 21B:
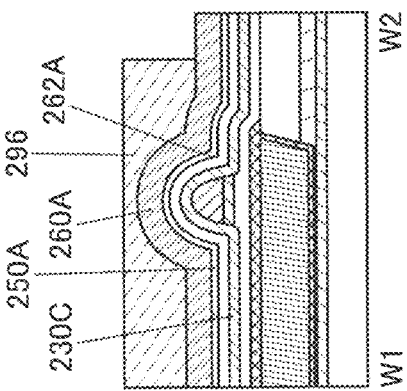
Figure 23A:
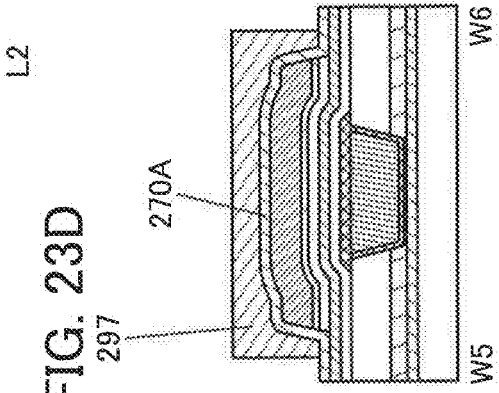
FIGS. 23A to 23D illustrate a method for manufacturing transistors of embodiments of the present invention.
Figure 23B:
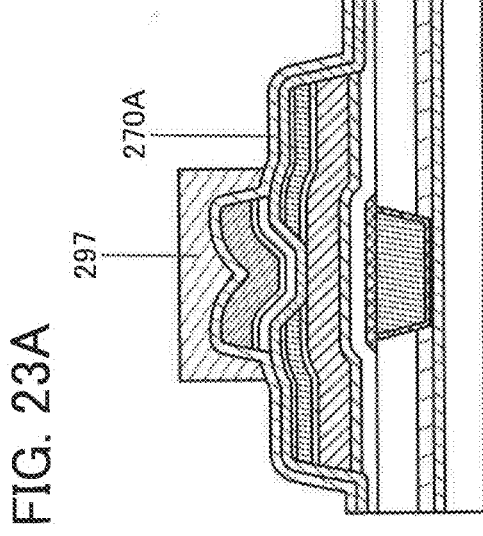
Figure 23C:
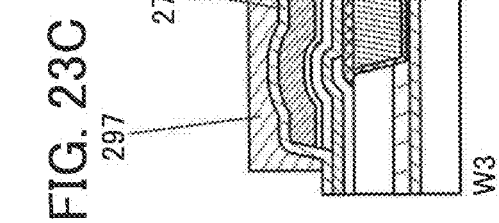
Figure 23D:
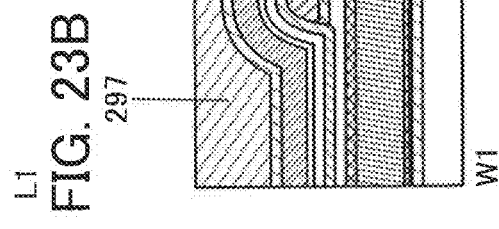
Figure 25A:
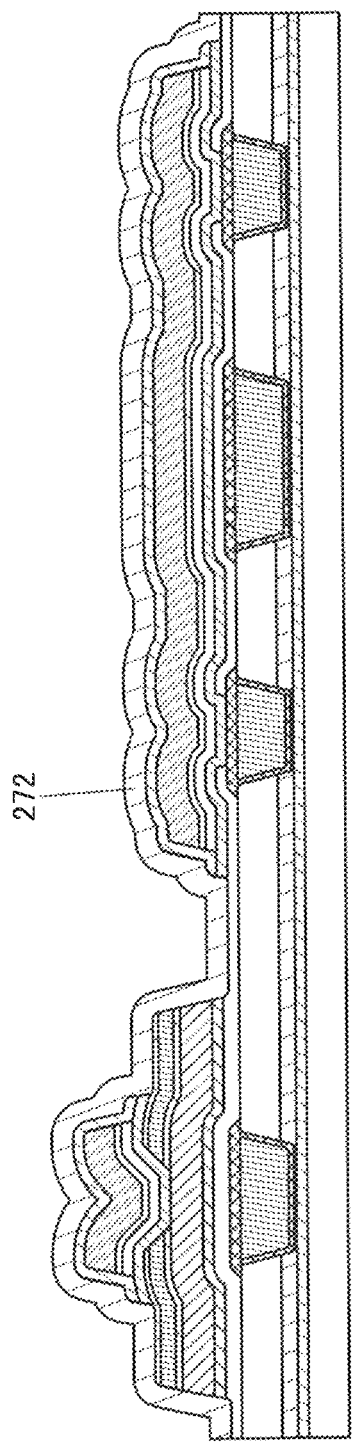
FIGS. 25A to 25D illustrate a method for manufacturing transistors of embodiments of the present invention.
Figure 25D:
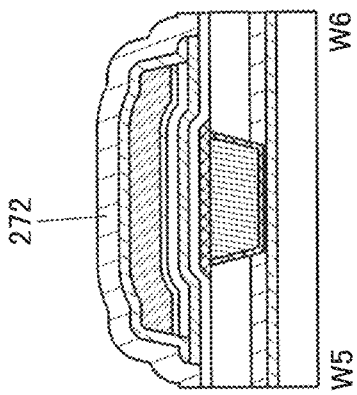
Figure 25C:
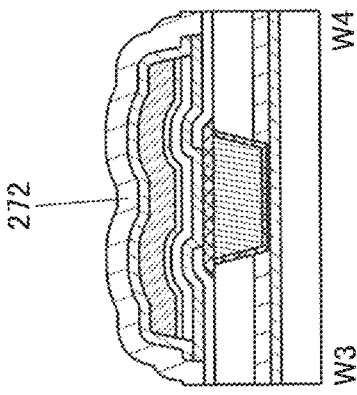
Figure 25B:
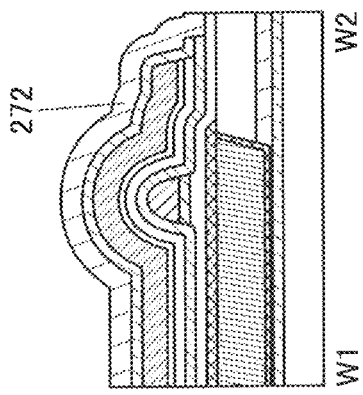

FIG. 2 is a plan view of the semiconductor device 1000. FIG. 3 is a cross-sectional view taken along dashed-dotted line L1-L2 in FIG. 2. FIGS. 4A to 4C are cross-sectional views taken along dashed-dotted lines W1-W2, W3-W4, and W5-W6 in FIG. 2. In FIG. 3, the cross-sectional view along L1-L2 is taken in the channel length direction of the transistors 200 and 400. In FIG. 4A, the cross-sectional view along W1-W2 is taken in the channel width direction of the transistor 200. In FIG. 4B, the cross-sectional view along W3-W4 illustrates one of a source region and a drain region of the transistor 400. In FIG. 4C, the cross-sectional view along W5-W6 is taken in the channel width direction of the transistor 400.

FIGS. 1B and 1C each show a $V_g$-$I_d$ curve, which is one of the electrical characteristics of a transistor. In the $V_g$-$I_d$ curves in FIGS. 1B and 1C, the horizontal axis and the vertical axis represent voltage between a gate and a source ($V_g$) of the transistor and current flowing to a drain ($I_d$) of the transistor on a logarithmic scale, respectively.

The transistors 200 and 400 each include a back gate. FIG. 1B shows the $V_g$-$I_d$ curve of the transistor 200 when the potential of the back gate is set to the same as that of the source or the gate. FIG. 1C shows the $V_g$-$I_d$ curve of the transistor 400 when the potential of the gate is set to the same as that of the source. As shown in FIGS. 1B and 1C, the transistors 200 and 400 have different electrical characteristics. In FIGS. 1B and 1C, the $V_g$ in the $V_g$-$I_d$ curve of the transistor 400 is shifted in the positive direction compared with that in the $V_g$-$I_d$ curve of the transistor 200. In other words, the transistor 400 has higher $V_{th}$ than the transistor 200.

Next, the transistors 200 and 400 are described with reference to drawings.

[Transistor 200]

The transistor 200 is a kind of top-gate transistor. The transistor 200 includes a conductor 205 (a conductor 205a, a conductor 205b, and a conductor 205c), an insulator 224, an oxide 230 (an oxide 230a, an oxide 230b, and an oxide 230c), an oxide 235 (an oxide 235a and an oxide 235b), an oxide 262, a conductor 240 (a conductor 240a and a conductor 240b), a layer 245 (a layer 245a and a layer 245b), an insulator 250, a conductor 260, a layer 270, and an insulator 272 (see FIG. 3 and FIG. 4A).

The transistor 200 illustrated in FIG. 3 and FIG. 4A is provided over the substrate 201 with an insulator 212 and an insulator 214 located therebetween. Specifically, the insulator 214 is provided over the insulator 212, and an insulator 216 is provided over the insulator 214. Parts of the insulators 214 and 216 are removed, and the conductor 205a and the conductor 205b are embedded. The conductor 205c is provided over the conductor 205a and the conductor 205b. The insulator 224 is provided over the conductor 205c and the insulator 216. The oxide 230a is provided over the insulator 224, and the oxide 230b is provided over the oxide 230a.

The oxide 230b includes a first region, a second region, and a third region. The third region is located between the first region and the second region.

The transistor 200 includes the oxide 235a over the first region of the oxide 230b, the conductor 240a over the oxide 235a, the oxide 235b over the second region of the oxide 230b, and the conductor 240b over the oxide 235b. The oxide 235a and the conductor 240a function as one of a source electrode and a drain electrode, and the oxide 235b and the conductor 240b functions as the other. Thus, one of the first region and the second region of the oxide 230b functions as a source region and the other functions as a drain region. The third region of the oxide 230b functions as a channel formation region.

The transistor 200 further includes the layer 245a over the conductor 240a and the layer 245b over the conductor 240b. The oxide 230c is provided over the layer 245a, the layer 245b, the conductor 240a, the conductor 240b, the oxide 235a, the oxide 235b, the oxide 230b, and the oxide 230a.

The insulator 250 is provided over the oxide 230c, the oxide 262 is provided over the insulator 250, and the conductor 260 is provided over the oxide 262. The insulator 250, the oxide 262, and the conductor 260 each include a region overlapping with the third region.

The transistor 200 further includes the layer 270 over the conductor 260. The layer 270 and the oxide 230c extend beyond end portions of the conductor 260 and the oxide 262 and have a region where the layer 270 and the oxide 230c overlap with each other in the extended portion.

In this embodiment, the insulator 272 is provided to cover the transistor 200. An insulator 280, an insulator 282, and an insulator 284 are provided over the insulator 272.

A conductor 285a is provided in an opening which overlaps with the conductor 240a and which is provided in the layer 245a, the insulator 272, the insulator 280, the insulator 282, and the insulator 284. A conductor 285b is provided in an opening which overlaps with the conductor 240b and which is provided in the layer 245b, the insulator 272, the insulator 280, the insulator 282, and the insulator 284. A conductor 285c is provided in an opening which overlaps with the conductor 260 and which is provided in the layer 270, the insulator 272, the insulator 280, the insulator 282, and the insulator 284.

In this embodiment, a conductor 287a, a conductor 287b, and a conductor 287c are provided over the insulator 284. The conductor 287a is electrically connected to the conductor 240a through the conductor 285a. The conductor 287b is electrically connected to the conductor 240b through the conductor 285b. The conductor 287c is electrically connected to the conductor 260 through the conductor 285c.

Although the oxide 230 of the transistor 200 has the above three-layer structure in this embodiment, one embodiment of the present invention is not limited thereto. For example, the oxide 230 may have a two-layer structure without one of the oxide 230a and the oxide 230c. Alternatively, a single layer structure using any one of the oxide 230a, the oxide 230b, and the oxide 230c may be employed. Alternatively, a four-layer structure in which any one of the above-described semiconductors is provided under or over the oxide 230a or under or over the oxide 230c may be employed. Further alternatively, it is possible to employ an n-layer structure (n is an integer of 5 or more) in which any one of the semiconductors described as examples of the oxide 230a, the oxide 230b, and the oxide 230c is provided at two or more of the following positions: over the oxide 230a; under the oxide 230a; over the oxide 230c; and under the oxide 230c.

[Gate Electrode and Back Gate Electrode]

One of the conductor 205 and a combination of the conductor 260 and the oxide 262 can function as a gate electrode and the other can function as a back gate electrode. In general, a gate electrode and a back gate electrode are formed using a conductive layer and positioned so that the channel formation region of the semiconductor is located between the gate electrode and the back gate electrode. Thus, the back gate electrode can function in a manner similar to that of the gate electrode. The potential of the back gate electrode may be the same as that of the gate electrode or may be a ground potential or a predetermined potential. By changing the potential of the back gate electrode independently of the potential of the gate electrode, the threshold voltage of the transistor can be changed.

Both the conductor 205 and the combination of the conductor 260 and the oxide 262 can function as gate electrodes. Thus, the insulator 224 and the insulator 250 can each function as a gate insulating layer.

In the case where one of the conductor 205 and the combination of the conductor 260 and the oxide 262 is referred to as a "gate electrode" or a "gate", the other can be referred to as a "back gate electrode" or a "back gate". For example, in the transistor 200, in the case where the conductor 205 is referred to as a "gate electrode", the combination of the conductor 260 and the oxide 262 is referred to as a "back gate electrode". In the case where the conductor 205 is used as a "gate electrode", the transistor 200 can be regarded as a kind of bottom-gate transistor. Alternatively, one of the conductor 205 and the combination of the conductor 260 and the oxide 262 may be referred to as a "first gate electrode" or a "first gate", and the other may be referred to as a "second gate electrode" or a "second gate".

By providing the conductor 205 and the combination of the conductor 260 and the oxide 262 with the oxide 230b provided therebetween and setting the potentials of the conductor 205 and the combination of the conductor 260 and the oxide 262 to be the same, a region of the oxide 230b through which carriers flow is enlarged in the film thickness direction; thus, the number of transferred carriers is increased. As a result, the on-state current and the field-effect mobility of the transistor 200 are increased.

Therefore, the transistor 200 has large on-state current for its area. That is, the area occupied by the transistor 200 can be small for required on-state current. Therefore, a semiconductor device having a high degree of integration can be provided.

Furthermore, the gate electrode and the back gate electrode are formed using conductive layers and thus each have a function of preventing an electric field generated outside the transistor from influencing the semiconductor in which the channel is formed (in particular, an electric field blocking function against static electricity and the like). When the back gate electrode is formed larger than the semiconductor to cover the semiconductor in the plan view, the electric field blocking function can be enhanced.

Since the conductor 205 and the combination of the conductor 260 and the oxide 262 each have a function of blocking an electric field from the outside, charges of charged particles and the like generated under the conductor 205 or over the conductor 260 and the oxide 262 do not influence the channel formation region in the oxide 230b. Thus, degradation by a stress test (e.g., a negative gate bias temperature (−GBT) stress test in which negative charges are applied to a gate) is suppressed. In addition, the conductor 205 and the conductor 260 can block an electric field generated from the drain electrode so as not to affect the semiconductor. Thus, changes in the rising voltage of on-state current due to changes in drain voltage can be suppressed. Note that this effect is significant when a potential is supplied to the conductor 205 and the combination of the conductor 260 and the oxide 262.

The GBT stress test is one kind of acceleration test and can evaluate, in a short time, a change by long-term use (i.e., a change over time) in characteristics of a transistor. In particular, the amount of change in threshold voltage of the transistor between before and after the GBT stress test is an important indicator when the reliability of the transistor is examined. If the amount of change in the threshold voltage between before and after the GBT stress test is small, the transistor has higher reliability.

By providing the conductor 205 and the combination of the conductor 260 and the oxide 262 and setting the potentials of the conductor 205 and the combination of the conductor 260 and the oxide 262 to be the same, the amount of change in threshold voltage is reduced. Accordingly, a variation in electrical characteristics among a plurality of transistors is also reduced.

The transistor including the back gate electrode has a smaller change in threshold voltage by a positive GBT stress test in which positive charges are applied to a gate than a transistor including no back gate electrode.

In the case where light is incident on the back gate electrode side, when the back gate electrode is formed using a light-blocking conductive film, light can be prevented from entering the semiconductor from the back gate electrode side. Therefore, photodegradation of the semiconductor can be prevented and deterioration in electrical characteristics of the transistor, such as a shift of the threshold voltage, can be prevented.

[Transistor 400]

The transistor 400 is a kind of top-gate transistor. The transistor 400 includes a conductor 405 (a conductor 405a, a conductor 405b, and a conductor 405c), a conductor 406 (a conductor 406a, a conductor 406b, and a conductor 406c), a conductor 407 (a conductor 407a, a conductor 407b, and a conductor 407c), an oxide 430, an insulator 450, an oxide 462, the conductor 460, and the layer 470 (see FIG. 3 and FIGS. 4B and 4C).

The transistor 400 illustrated in FIG. 3 and FIGS. 4B and 4C is provided over the substrate 201 with the insulator 212 and the insulator 214 located therebetween. Specifically, the insulator 216 is provided over the insulator 214, and parts of the insulators 214 and 216 are removed and the conductor 405a, the conductor 405b, the conductor 406a, the conductor 406b, the conductor 407a, and the conductor 407b are embedded. The conductor 405c is provided over the conductor 405a and the conductor 405b. The conductor 406c is provided over the conductor 406a and the conductor 406b. The conductor 407c is provided over the conductor 407a and the conductor 407b. The insulator 224 is provided over the conductor 405, the conductor 406, the conductor 407, and the insulator 216.

In the transistor 400, the oxide 430 is provided over the conductor 405, the conductor 406, the conductor 407, and the insulator 224. One of the conductor 405 and the conductor 407 can function as one of a source electrode and a drain electrode, and the other can function as the other of the source electrode and the drain electrode.

The oxide 430 includes a first region, a second region, and a third region. The third region is located between at least the first region and the second region.

The first region of the oxide 430 overlaps with the conductor 405. The second region of the oxide 430 overlaps with the conductor 407. Furthermore, the third region of the oxide 430 can function as a channel formation region.

The transistor 400 includes the insulator 450 over the oxide 430, the oxide 462 over the insulator 450, and the conductor 460 over the oxide 462. The insulator 450, the conductor 460, and the oxide 462 each include a region overlapping with the third region of the oxide 430.

The transistor 400 further includes the layer 470 over the conductor 460. The layer 470 and the oxide 430 extend beyond an end portion of the conductor 460 and have a region where the layer 470 and the oxide 430 overlap with each other in the extended portion.

In this embodiment, the insulator 272 is provided over the transistor 400. The insulator 280, the insulator 282, and the insulator 284 are provided over the insulator 272.

A conductor 285d is provided in an opening which overlaps with the conductor 460 and which is provided in the layer 470, the insulator 272, the insulator 280, the insulator 282, and the insulator 284. In this embodiment, a conductor 287d is provided over the insulator 284. The conductor 287d is electrically connected to the conductor 460 through the conductor 285d.

One of the conductor 406 and a combination of the conductor 460 and the oxide 462 can function as a gate electrode and the other can function as a back gate electrode. The description of the transistor 200 can be referred to for the other components of the transistor 400.

In the transistor 200, a channel is formed in the oxide 230b. In the transistor 400, a channel is formed in the oxide 430. The oxide 230b and the oxide 430 are preferably formed using semiconductor materials having different physical properties. When the oxide 230b and the oxide 430 are formed using semiconductor materials having different physical properties, the transistor 200 and the transistor 400 can have different electrical characteristics. When semiconductor materials having different energy bandgaps are used for the oxide 230b and the oxide 430, for example, the transistors 200 and 400 can have different field-effect mobilities.

When a semiconductor material having lower electron affinity than that of the oxide 230b is used for the oxide 430, for example, the transistor 400 can have higher $V_{th}$ than the transistor 200. Specifically, when the oxide 230b is an In-M-Zn oxide (an oxide containing In, an element M, and Zn) at an atomic ratio of $x_2:y_2:z_2$ and the oxide 430 is an In-M-Zn oxide at an atomic ratio of $x_1:y_1:z_1$, $y_1/x_1$ needs to be larger than $y_2/x_2$. With such In-M-Zn oxides, the transistor 400 can have higher $V_{th}$ than the transistor 200.

Since a region of the oxide 430 where a channel is formed is in direct contact with the insulator 224 and the insulator 450 in the transistor 400, the transistor 400 is likely to be affected by interface scattering and the trap states. Thus, the transistor 400 has smaller on-state current and lower field-effect mobility than the transistor 200. Furthermore, the transistor 400 has higher $V_{th}$ than the transistor 200.

<Materials>
[Substrate]

There is no particular limitation on a material used for the substrate 201 as long as the material has heat resistance high enough to withstand at least heat treatment performed later. For example, a single crystal semiconductor substrate or a polycrystalline semiconductor substrate made of silicon, silicon carbide, or the like or a compound semiconductor substrate made of silicon germanium or the like can be used as the substrate 201. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. The substrate 201 is not limited to a simple supporting substrate, and may be a substrate where a device such as a transistor is formed. In this case, at least one of the gate, the source, and the drain of the transistor 200 or the transistor 400 may be electrically connected to the device.

Further alternatively, as the substrate 201, a glass substrate of barium borosilicate glass, aluminoborosilicate glass, or the like, a ceramic substrate, a quartz substrate, or a sapphire substrate can be used. Note that a flexible substrate may be used as the substrate 201. In the case where a flexible substrate is used, the transistor, a capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

For the flexible substrate, for example, metal, an alloy, resin, glass, or fiber thereof can be used. The flexible substrate used as the substrate 201 preferably has a lower coefficient of linear expansion because deformation due to an environment is suppressed. The flexible substrate used as the substrate 201 is formed using, for example, a material whose coefficient of linear expansion is lower than or equal to $1 \times 10^{-3}/K$, lower than or equal to $5 \times 10^{-5}/K$, or lower than or equal to $1 \times 10^{-5}/K$. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

[Insulator]

The insulators 212, 214, 216, 224, 250, 450, 272, 280, 282, and 284 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulators 212, 214, 272, and 280 each be formed using an insulating material that is relatively impermeable to impurities and oxygen. The insulators 212, 214, 272, and 280 may each be formed to have, for example, a single-layer structure or a stacked-layer structure including an insulating material containing boron, carbon, nitrogen, oxygen, fluorine, magnesium, aluminum, silicon, phosphorus, argon, gallium, germanium, yttrium, zirconium, lanthanum, neodymium, hafnium, or tantalum. Examples of such an insulating material that is relatively impermeable to impurities and oxygen include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material that is relatively impermeable to impurities and oxygen is used for the insulators 212 and 214, impurity diffusion from the substrate 201 side to the transistors can be suppressed, and the reliability of the transistors can be improved. When the insulating material that is relatively impermeable to impurities and oxygen is used for the insulator 280, impurity diffusion from layers above the insulator 280 to the transistors can be suppressed, and the reliability of the transistors can be improved.

Note that a stack of a plurality of insulating layers formed with these materials may be used as the insulators 212, 214, 272, and 280. One of the insulators 212 and 214 may be omitted.

An impurity here is typified by hydrogen and water.

For example, the diffusion length of oxygen or hydrogen in aluminum oxide in an atmosphere at 350° C. or 400° C. per hour is extremely smaller than that in silicon oxide. Thus, aluminum oxide can be the material that is relatively impermeable to impurities and oxygen.

As an example of the insulating material that is relatively impermeable to impurities and oxygen, silicon nitride formed by a CVD method can be given. Diffusion of hydrogen into a semiconductor element including an oxide semiconductor, such as the transistor 200, degrades the characteristics of the semiconductor element in some cases. Thus, the transistor 200 is preferably sealed by a film that prevents hydrogen diffusion. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 212 that is converted into hydrogen atoms per unit area of the insulator 212 is less than or equal to $10 \times 10^{15}$ atoms/cm$^2$, preferably less than or equal to $5 \times 10^{15}$ atoms/cm$^2$ in TDS in the range of 50° C. to 500° C., for example.

Note that, in particular, the permittivities of the insulators 216, 224, 280, and 284 are preferably low. For example, the relative permittivities of the insulators 216, 224, 280, and 284 are preferably lower than 3, further preferably lower than 2.4, still further preferably lower than 1.8. In the case where a material with a low permittivity is used for an interlayer film, the parasitic capacitance between wirings can be reduced. Note that these insulators are preferably formed using the insulating material that is relatively impermeable to impurities and oxygen.

When an oxide semiconductor is used for the oxide 230, the hydrogen concentrations in the insulators are preferably lowered in order to prevent an increase in the hydrogen concentration in the oxide 230. Specifically, the hydrogen concentration in each of the insulators that is measured by secondary ion mass spectrometry (SIMS) is set lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is particularly preferable to lower the hydrogen concentrations of the insulators 216, 224, 250, 450, and 280. It is preferable to lower the hydrogen concentrations of at least the insulators 224, 250, and 450 in contact with the oxide 230 or the oxide 430.

Furthermore, the nitrogen concentrations in the insulators are preferably lowered in order to prevent an increase in the nitrogen concentration in the oxide 230. Specifically, the nitrogen concentration in each of the insulators, which is measured by SIMS, is set lower than or equal to $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

It is preferable that a region of the insulator 224 which is in contact with at least the oxide 230 and a region of the insulator 250 which is in contact with at least the oxide 230 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. In the case where a silicon oxide layer or a silicon oxynitride layer is used as the insulators 224 and 250, a silicon oxide layer or a silicon oxynitride layer whose spin density due to the E' center is lower than or equal to $3 \times 10^{17}$ spins/cm$^3$, preferably lower than or equal to $5 \times 10^{16}$ spins/cm$^3$ can be used.

In addition to the above-described signal, a signal due to nitrogen dioxide (NO$_2$) might be observed. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating layer whose spin density of a signal due to nitrogen dioxide (NO$_2$) is higher than or equal to $1 \times 10^{17}$ spins/cm$^3$ and lower than $1 \times 10^{18}$ spins/cm$^3$ as the insulators 224 and 250, for example.

Note that nitrogen oxide (NO$_x$) such as nitrogen dioxide (NO$_2$) forms a state in the insulating layer. The state is positioned in the energy gap of the oxide semiconductor. Thus, when nitrogen oxide (NO$_x$) is diffused to the interface between the insulating layer and the oxide semiconductor, an electron can potentially be trapped by the state on the insulating layer side. As a result, the trapped electrons remain in the vicinity of the interface between the insulating layer and the oxide semiconductor; thus, the threshold voltage of the transistor is shifted in the positive direction. Therefore, a shift in the threshold voltage of the transistor can be reduced when a film with a low nitrogen oxide content is used as the insulators 224 and 250.

As an insulating layer that releases little nitrogen oxide (NO$_x$), for example, a silicon oxynitride layer can be used. The silicon oxynitride layer is a film of which the amount of released ammonia is larger than the amount of released nitrogen oxide (NO$_x$) in TDS; the typical amount of released ammonia is greater than or equal to $1 \times 10^{18}$/cm$^3$ and less than or equal to $5 \times 10^{19}$/cm$^3$. Note that the amount of released ammonia is the total amount of ammonia released by heat treatment in a range from 50° C. to 650° C. or a range from 50° C. to 550° C. in TDS.

Since nitrogen oxide (NO$_x$) reacts with ammonia and oxygen in heat treatment, the use of an insulating layer that releases a large amount of ammonia reduces nitrogen oxide (NO$_x$).

At least one of the insulators 216, 224, 250, and 450 is preferably formed using an insulator from which oxygen is released by heating. Specifically, it is preferable to use an insulator of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS. Note that oxygen released by heating is also referred to as "excess oxygen".

The insulating layer containing excess oxygen can be formed by performing treatment for adding oxygen to an insulating layer. The treatment for adding oxygen can be performed by heat treatment under an oxygen atmosphere, an ion implantation method, an ion doping method, a plasma immersion ion implantation method, plasma treatment, or the like. The plasma treatment using oxygen is preferably performed using an apparatus including a power source for generating high-density plasma using microwaves, for example. Alternatively, a plasma power source for applying a radio frequency (RF) voltage to a substrate side may be provided. The use of high-density plasma enables high-density oxygen radicals to be produced, and application of the RF voltage to the substrate side allows oxygen radicals generated by the high-density plasma to be efficiently introduced into the target film. Alternatively, after plasma treatment using an inert gas with the apparatus, plasma treatment using oxygen in order to compensate released oxygen may be performed. As a gas for adding oxygen, an oxygen gas of $^{16}$O$_2$, $^{18}$O$_2$, or the like, a nitrous oxide gas, an ozone gas, or the like can be used. In this specification, the treatment for adding oxygen is also referred to as "oxygen doping treatment".

By the oxygen doping treatment, in some cases, the crystallinity of the semiconductor can be improved, and impurities such as hydrogen and water can be removed. That is, "oxygen doping treatment" can also be referred to as "impurity-removing treatment". In particular, as the oxygen doping treatment, plasma treatment using oxygen is performed under a reduced pressure, whereby bonds relating to hydrogen and water in the insulator or the oxide are broken, and hydrogen and water are easily released. Thus, it is preferable that plasma treatment be performed while heating is performed or heat treatment be performed after plasma treatment. When plasma treatment is performed after heat treatment and heat treatment is further performed, the impurity concentration in the target film can be lowered.

A heat-resistant organic material such as a polyimide, an acrylic-based resin, a benzocyclobutene-based resin, a polyamide, or an epoxy-based resin may be used to form the insulator 280. Other than the above organic materials, a low-dielectric constant material (low-k material), a siloxane-based resin, phosphosilicate glass (PSG), borophosphosilicate glass (BPSG), or the like can be used. Note that the insulator 280 may be formed by stacking a plurality of insulating layers formed using any of these materials.

Note that the siloxane-based resin corresponds to a resin including an Si—O—Si bond formed using a siloxane-based material as a starting material. The siloxane-based resin may contain, as a substituent, an organic group (e.g., an alkyl group or an aryl group) or a fluoro group. The organic group may contain a fluoro group.

There is no particular limitation on the method for forming the insulator, and any of the following methods which depend on a material thereof can be used: a sputtering method; an SOG method; spin coating; dipping; spray coating; a droplet discharging method (e.g., an ink jet method); a printing method (e.g., screen printing or offset printing); or the like.

Any of the above insulating layers may be used as the layers 245a, 245b, 270, and 470. In the case where the layers 245a, 245b, 270, and 470 are formed using an insulating layer, an insulating layer which is less likely to release oxygen and/or which is less likely to absorb oxygen is preferably used.

[Conductor]

As a conductive material for forming the conductors 205, 405, 406, 407, 240, 260, and 460, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. Alternatively, a semiconductor having a high electric conductivity typified by polycrystalline silicon including an impurity element such as phosphorus, or a silicide such as nickel silicide may be used.

A conductive material containing the above metal element and oxygen may be used. A conductive material containing the above metal element and nitrogen may be used. For example, a conductive material containing nitrogen such as titanium nitride or tantalum nitride may be used.

The conductors 205a, 205b, 405a, 405b, 406a, 406b, 407a, 407b, and 285 (285a, 285b, 285c, and 285d) may be formed using, for example, a conductive material with high embeddability, such as tungsten or polysilicon. A conductive material with high embeddability and a barrier layer (a diffusion prevention layer) such as a titanium layer, a titanium nitride layer, or a tantalum nitride layer may be used in combination. Note that the conductor 285 may be referred to as a contact plug.

In particular, the conductor 205a, the conductor 405a, the conductor 406a, and the conductor 407a that are in contact with the insulator 212 and the insulator 214 are preferably formed using a conductive material that is relatively impermeable to impurities and oxygen. The conductor 285 that is in contact with the insulator 272 and the insulator 282 is preferably formed using a conductive material that is relatively impermeable to impurities and oxygen. As an example of the conductive material that is relatively impermeable to impurities and oxygen, tantalum nitride can be given.

When the insulators 212 and 214 are formed using an insulating material that is relatively impermeable to impurities and oxygen and the conductors 205a, 405a, 406a, and 407a are formed using a conductive material that is relatively impermeable to impurities and oxygen, diffusion of impurities into the transistors 200 and 400 can be further suppressed. Thus, the reliability of the transistors 200 and 400 can be further increased.

Any of the above conductive materials may be used for the layers 245a and 245b. In the case where the layers 245a and 245b are formed using a conductive material, a conductive material which is less likely to release oxygen and/or which is less likely to absorb oxygen is preferably used.

[Oxide]

Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used for the oxide 235a, the oxide 235b, the oxide 262, and the oxide 462. Indium gallium zinc oxide containing nitrogen may alternatively be used. A stack of a plurality of oxides formed of the above materials may be used.

For example, when the oxide 235a and the oxide 235b are formed of any of the above materials using plasma containing oxygen, oxygen can be added to the oxide 230. Adding oxygen to the oxide 230 can repair defects in the oxide 230, which can result in an increase in crystallinity, removal of impurities such as hydrogen and water, or the like, in some cases.

Furthermore, the above materials have a function of capturing hydrogen in some cases. For example, the oxide 235a and the oxide 235b capture hydrogen diffused from an insulator such as the insulator 280, whereby hydrogen can be prevented from being diffused into the oxide 230 and an increase in the number of defects in the oxide 230 can be inhibited.

For another example, when the oxide 262 and the oxide 462 are formed of any of the above materials using plasma containing oxygen, oxygen can be added to the insulator 250 and the insulator 450. The oxygen added to the insulator 250 and the insulator 450 becomes excess oxygen therein, and the oxygen can be added to the oxide 230 by heat treatment or the like. The added oxygen can repair defects in the oxide 230, which can result in an increase in crystallinity, removal of impurities such as hydrogen and water, or the like, in some cases.

Furthermore, the above materials have a function of capturing hydrogen in some cases. For example, the oxide 262 and the oxide 462 capture hydrogen in the insulator 250 and the insulator 450, whereby the hydrogen concentrations in the insulator 250 and the insulator 450 can be reduced. In addition, hydrogen can be prevented from being diffused from the insulator 250 and the insulator 450 to the oxide 230 and the oxide 430, whereby an increase in the number of defects in the oxide 230 and the oxide 430 can be inhibited.

That is, the use of any of the above materials for the oxide 235a, the oxide 235b, the oxide 262, and the oxide 462 can increase reliability of the transistor 200 and the transistor 400.

For the oxide 230 and the oxide 430, a single crystal oxide semiconductor, a polycrystalline oxide semiconductor, a microcrystalline oxide semiconductor, an amorphous oxide semiconductor, and the like can be used alone or in combination. The oxides 230a, 230b, 230c, and 430 may be formed using oxide semiconductors having different crystal states or different semiconductor materials.

The band gap of an oxide semiconductor is greater than or equal to 2 eV; thus, when the oxide semiconductor is used for the oxides 230 and 430, transistors with an extremely small off-state current can be provided. Specifically, the off-state current per micrometer in channel width at room temperature (typically 25° C.) and at a source-drain voltage of 3.5 V can be smaller than $1\times10^{-20}$ A, smaller than $1\times10^{-22}$ A, or smaller than $1\times10^{-24}$ A. That is, the on/off ratio of the transistor can be greater than or equal to 20 digits and less than or equal to 150 digits. A transistor using an oxide semiconductor in the oxide 230 has high withstand voltage between its source and drain. Thus, a transistor with high reliability can be provided. Furthermore, a transistor with high output voltage and high withstand voltage can be provided. Furthermore, a semiconductor device or the like with high reliability can be provided. Furthermore, a semiconductor device with high output voltage and high withstand voltage can be provided.

An oxide semiconductor used for the oxide 230 and the oxide 430 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide contains indium, an element M, and zinc is considered. The element M is aluminum, gallium, yttrium, tin, or the like. Other elements that can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M.

First, preferred ranges of the atomic ratio of indium, the element M, and zinc contained in an oxide according to the present invention are described with reference to FIGS. 26A to 26C. Note that the proportion of oxygen atoms is not shown in FIGS. 26A to 26C. The terms of the atomic ratio of indium, the element M, and zinc contained in the oxide are denoted by [In], [M], and [Zn], respectively.

Figure 26A:
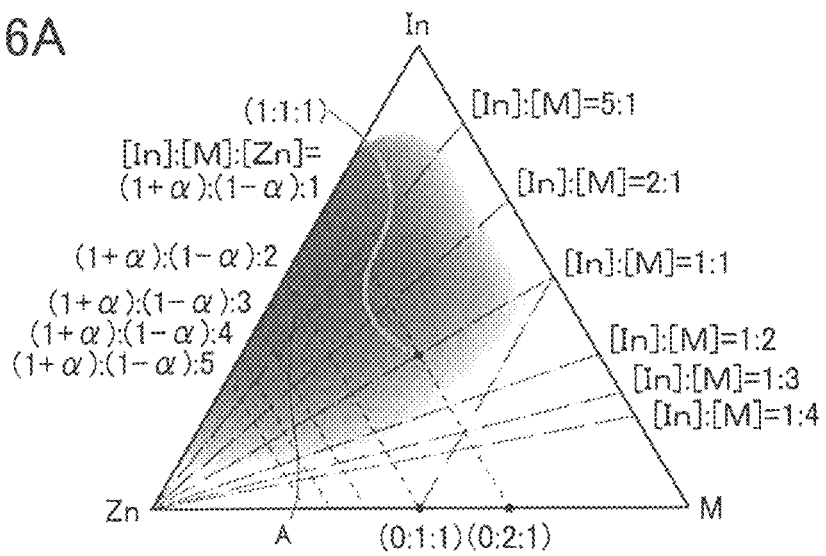
FIGS. 26A to 26C each illustrate an atomic ratio range of an oxide semiconductor of the present invention.
Figure 26B:
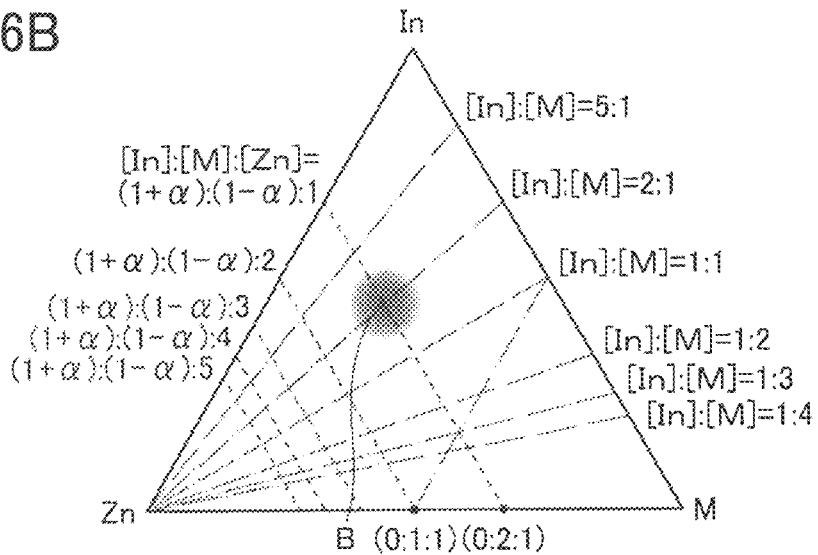
Figure 26C:
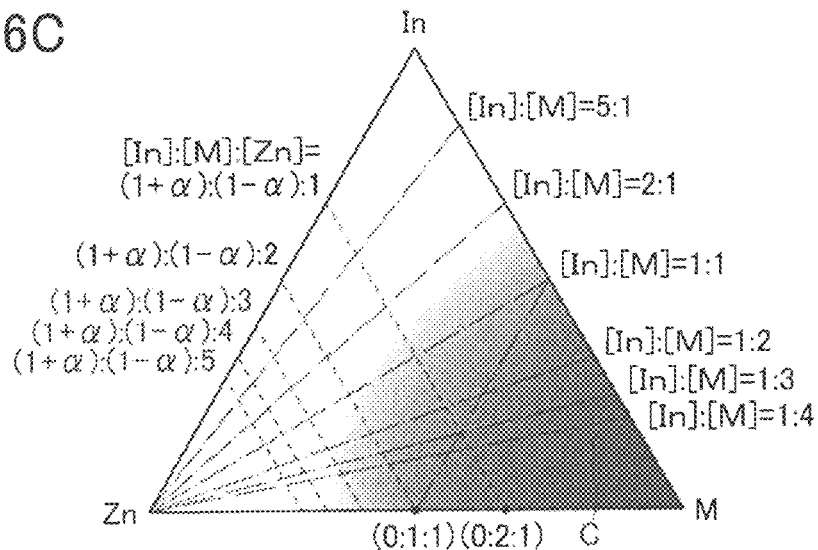

In FIGS. 26A to 26C, broken lines indicate a line where the atomic ratio [In]:[M]:[Zn] is $(1+\alpha):(1-\alpha):1$ (where $-1\leq\alpha\leq1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ (where $\beta\geq0$), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

A dashed double-dotted line indicates a line where the atomic ratio [In]:[M]:[Zn] is $(1+\gamma):2:(1-\gamma)$, where $-1\leq\gamma\leq1$. An oxide with the atomic ratio [In]:[M]:[Zn] of 0:2:1 or around 0:2:1 in FIGS. 26A to 26C tends to have a spinel crystal structure.

FIGS. 26A and 26B illustrate examples of the preferred ranges of the atomic ratio of indium, the element M, and zinc contained in an oxide of one embodiment of the present invention.

Figure 27:
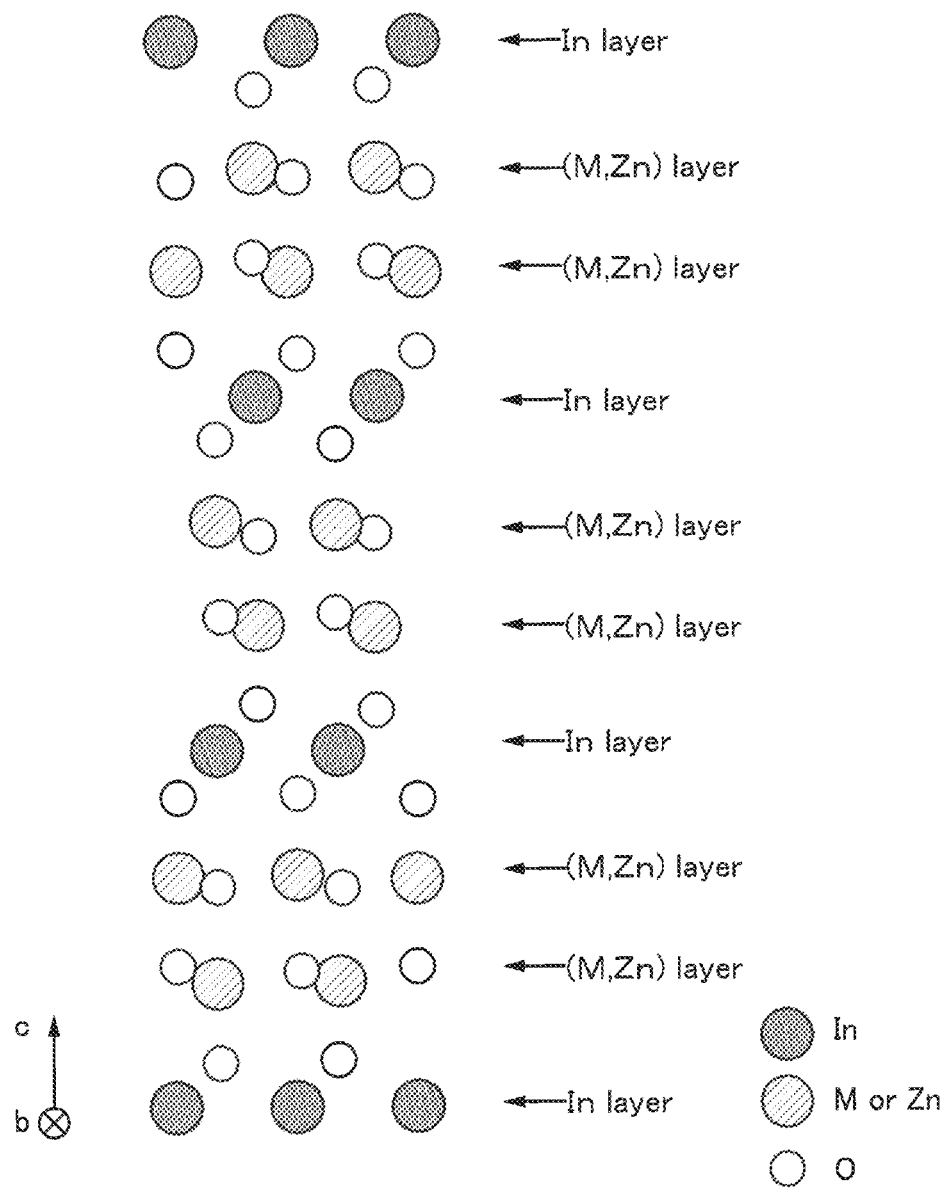
FIG. 27 illustrates an $InMZnO_4$ crystal.

FIG. 27 illustrates an example of the crystal structure of InMZnO$_4$ with an atomic ratio [In]:[M]:[Zn] of 1:1:1. The crystal structure illustrated in FIG. 27 is InMZnO$_4$ observed from a direction parallel to the b-axis. Note that a metal element in a layer that contains the element M, Zn, and oxygen (hereinafter this layer is referred to as an (M,Zn) layer) in FIG. 27 represents the element M or zinc. In that case, the proportion of the element M is the same as the proportion of zinc. The element M and zinc can be replaced with each other, and their arrangement is random.

Note that InMZnO$_4$ has a layered crystal structure (also referred to as layered structure) and includes two (M,Zn) layers that contain the element M, zinc, and oxygen with respect to one layer that contains indium and oxygen (hereinafter referred to as an In layer), as illustrated in FIG. 27.

Indium and the element M can be replaced with each other. Accordingly, when the element M in the (M,Zn) layer is replaced by indium, the layer can also be referred to as an (In,M,Zn) layer. In that case, a layered structure that includes two (In,M,Zn) layers with respect to one In layer is obtained.

An oxide with an atomic ratio [In]:[M]:[Zn] of 1:1:2 has a layered structure that includes three (M,Zn) layers with respect to one In layer. In other words, if [Zn] is larger than [In] and [M], the proportion of the (M,Zn) layer to the In layer becomes higher when the oxide is crystallized.

Note that in the case where the number of (M,Zn) layers with respect to one In layer is not an integer in the oxide, the oxide might have plural kinds of layered structures where the number of (M,Zn) layers with respect to one In layer is an integer. For example, in the case of [In]:[M]:[Zn]=1:1:1.5, the oxide may have a mix of a layered structure including one In layer for every two (M,Zn) layers and a layered structure including one In layer for every three (M,Zn) layers.

For example, when the oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:[M]:[Zn] around 0:2:1, two phases of a spinel crystal structure and a layered crystal structure are likely to exist. In addition, with an atomic ratio [In]:[M]:[Zn] around 1:0:0, two phases of a bixbyite crystal structure and a layered crystal structure are likely to exist. In the case where a plurality of phases exist in the oxide, a grain boundary might be formed between different crystal structures.

In addition, the oxide with a higher content of indium can have high carrier mobility (electron mobility). This is because in an oxide containing indium, the element M, and zinc, the s orbital of heavy metal mainly contributes to carrier transfer, and a higher indium content in the oxide enlarges a region where the s orbitals of indium atoms overlap; therefore, an oxide with a high indium content has higher carrier mobility than an oxide with a low indium content.

In contrast, when the indium content and the zinc content in an oxide become lower, the carrier mobility becomes lower. Thus, with an atomic ratio [In]:[M]:[Zn] of 0:1:0 or around 0:1:0 (e.g., a region C in FIG. 26C), insulation performance becomes better.

Accordingly, an oxide in one embodiment of the present invention preferably has an atomic ratio represented by a region A in FIG. 26A. With this atomic ratio, a layered structure with high carrier mobility and a few grain boundaries is easily obtained.

A region B in FIG. 26B represents an atomic ratio [In]:[M]:[Zn] of 4:2:3 to 4:2:4.1 and the vicinity thereof. The vicinity includes an atomic ratio [In]:[M]:[Zn] of 5:3:4, for example. An oxide with an atomic ratio represented by the region B is an excellent oxide that has particularly high crystallinity and high carrier mobility.

Note that a condition where an oxide has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor is described.

When the oxide is used for a transistor, carrier scattering or the like at a grain boundary can be reduced; thus, the transistor can have high field-effect mobility. Moreover, the transistor can have high reliability.

An oxide with a low carrier density is preferably used for a transistor. For example, an oxide whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide has few carrier generation sources and thus can have a low carrier density. A highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide with a high density of trap states has unstable electrical characteristics in some cases.

In view of the above, to obtain stable electrical characteristics of a transistor, it is effective to reduce the concentration of impurities in the oxide. To reduce the concentration of impurities in the oxide, the concentration of impurities in a film that is adjacent to the oxide is preferably reduced. Examples of impurities include hydrogen, nitrogen, alkali metal, alkaline earth metal, iron, nickel, and silicon.

Here, the influence of impurities in the oxide is described.

When silicon or carbon, which is a Group 14 element, is contained in the oxide, defect states are formed in the oxide. Thus, the concentration of silicon or carbon in the oxide and around an interface with the oxide (the concentration obtained by secondary ion mass spectrometry (SIMS)) is set lower than or equal to $2\times10^{18}$ atoms/cm$^3$, preferably lower than or equal to $2\times10^{17}$ atoms/cm$^3$.

When the oxide contains alkali metal or alkaline earth metal, defect states are formed and carriers are generated in some cases. Thus, a transistor using an oxide that contains alkali metal or alkaline earth metal is likely to have normally-on characteristics. Accordingly, it is preferable to reduce the concentration of alkali metal or alkaline earth metal in the oxide. Specifically, the concentration of alkali metal or alkaline earth metal in the oxide measured by SIMS is set lower than or equal to $1\times10^{18}$ atoms/cm$^3$, preferably lower than or equal to $2\times10^{16}$ atoms/cm$^3$.

When the oxide contains nitrogen, the oxide easily becomes n-type by generation of electrons serving as carriers and an increase of carrier density. Thus, a transistor in which an oxide containing nitrogen is used as a semiconductor is likely to have normally-on characteristics. For this reason, nitrogen in the oxide is preferably reduced as much as possible. For example, the nitrogen concentration in the oxide measured by SIMS is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide reacts with oxygen bonded to a metal atom to be water, and thus causes an oxygen vacancy in some cases. Due to entry of hydrogen into the oxygen vacancy, an electron serving as a carrier is sometimes generated. Furthermore, in some cases, bonding of part of hydrogen to oxygen bonded to a metal atom causes generation of an electron serving as a carrier. Thus, a transistor using an oxide that contains hydrogen is likely to have normally-on characteristics. Accordingly, it is preferred that hydrogen in the oxide be reduced as much as possible. Specifically, the hydrogen concentration in the oxide measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide with sufficiently reduced impurity concentration is used for a channel region in a transistor, the transistor can have stable electrical characteristics.

Figure 28A:
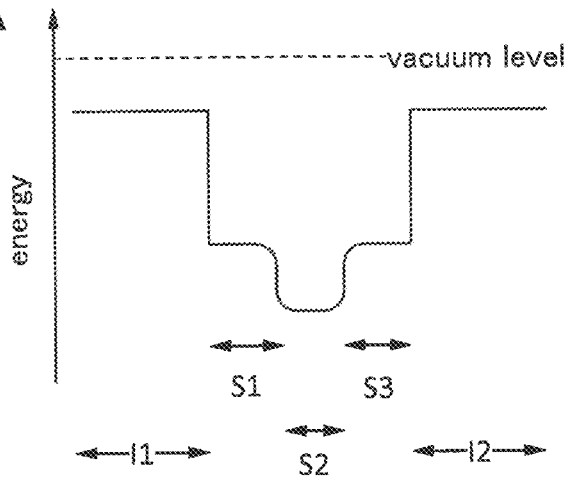
FIGS. 28A to 28C are each a band diagram of a layered structure including an oxide semiconductor.
Figure 28B:
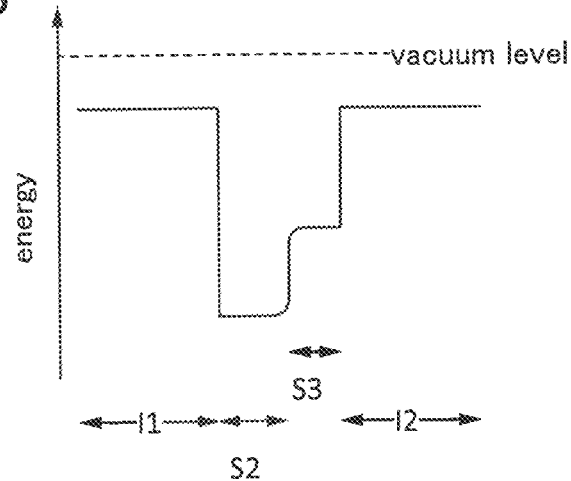
Figure 28C:
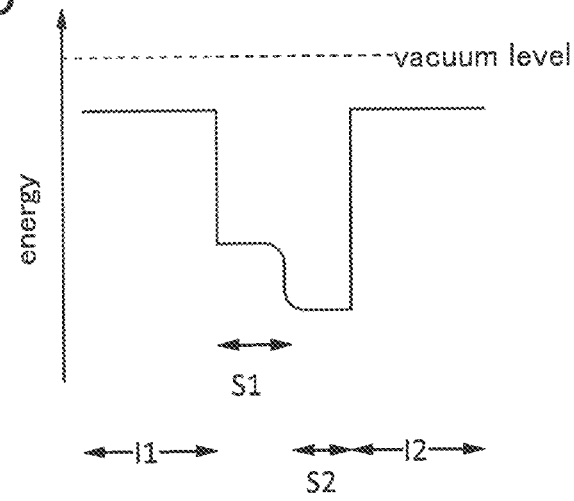

Next, the case where the oxide has a two-layer structure or a three-layer structure will be described. With reference to FIGS. 28A to 28C, the description is made on a band diagram of a layered structure of an oxide S1, an oxide S2, and an oxide S3 and insulators that are in contact with the layered structure of the oxide S1, the oxide S2, and the oxide S3; a band diagram of a layered structure of the oxide S1 and the oxide S2 and insulators that are in contact with the layered structure of the oxide S1 and the oxide S2; and a band diagram of a layered structure of the oxide S2 and the oxide S3 and insulators that are in contact with the layered structure of the oxide S2 and the oxide S3.

FIG. 28A is an example of a band diagram of a layered structure including an insulator I1, the oxide S1, the oxide S2, the oxide S3, and an insulator I2 in the thickness direction. FIG. 28B is an example of a band diagram of a layered structure including the insulator I1, the oxide S2, the oxide S3, and the insulator I2 in the thickness direction. FIG. 28C is an example of a band diagram of a layered structure including the insulator I1, the oxide S1, the oxide S2, and the insulator I2 in the thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2. Typically, a difference in the energy level of the conduction band minimum between the oxide S2 and each of the oxides S1 and S3 is preferably greater than or equal to 0.15 eV or greater than or equal to 0.5 eV, and less than or equal to 2 eV or less than or equal to 1 eV. That is, it is preferable that the electron affinity of the oxide S2 be higher than the electron affinity of each of the oxides S1 and S3, and the difference between the electron affinity of each of the oxides S1 and S3 and the electron affinity of the oxide S2 be greater than or equal to 0.15 eV or greater than or equal to 0.5 eV, and less than or equal to 2 eV or less than or equal to 1 eV.

As illustrated in FIGS. 28A to 28C, the energy level of the conduction band minimum of each of the oxides S1 to S3 is gradually varied. In other words, the energy level of the conduction band minimum is continuously varied or continuous junction is formed. To obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, when the oxide S2 is an In—Ga—Zn oxide, it is preferable to use an In—Ga—Zn oxide, a Ga—Zn oxide, gallium oxide, or the like as the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and a large on-state current can be obtained.

When an electron is trapped by a trap state, the trapped electron behaves like fixed charge; thus, the threshold voltage of a transistor is shifted in the positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. Accordingly, the oxide S2, the interface between the oxides S1 and S2, and the interface between the oxides S2 and S3 mainly function as a channel region. For example, an oxide with high insulation performance and the atomic ratio represented by the region C in FIG. 26C can be used as the oxides S1 and S3. Note that the region C in FIG. 26C represents the atomic ratio [In]:[M]:[Zn] of 0:1:0 or around 0:1:0.

In the case where an oxide with the atomic ratio represented by the region A is used as the oxide S2, it is particularly preferable to use an oxide with an atomic ratio where [M]/[In] is greater than or equal to 1, preferably greater than or equal to 2 as each of the oxides S1 and S3. In addition, it is suitable to use an oxide with sufficiently high insulation performance and an atomic ratio where [M]/([Zn]+[In]) is greater than or equal to 1 as the oxide S3.

In this specification and the like, a transistor in which an oxide semiconductor is used for a semiconductor where a channel is formed is also referred to as an "OS transistor". In this specification and the like, a transistor in which silicon having crystallinity is used for a semiconductor where a channel is formed is also referred to as a "crystalline Si transistor".

The crystalline Si transistor tends to obtain relatively high mobility as compared to the OS transistor. On the other hand, the crystalline Si transistor has difficulty in obtaining extremely small off-state current unlike the OS transistor. Thus, it is important that the semiconductor material used for the semiconductor be selected depending on the purpose and the usage. For example, depending on the purpose and the usage, the OS transistor and the crystalline Si transistor may be used in combination.

In the case where the oxides 230 and 430 are formed using an oxide semiconductor, the oxide semiconductor is preferably formed by a sputtering method. The oxide semiconductor is preferably formed by a sputtering method, in which case the oxide semiconductor can have high density. In the case where the oxide semiconductor is formed by a sputtering method, a rare gas (typically argon), oxygen, or a mixed gas of a rare gas and oxygen is used as a sputtering gas. In addition, increasing the purity of the sputtering gas is necessary. For example, an oxygen gas or a rare gas used as a sputtering gas is a gas that is highly purified to have a dew point of −60° C. or lower, preferably −100° C. or lower. By using the sputtering gas that is highly purified, entry of moisture or the like into the oxide semiconductor can be prevented as much as possible.

In the case where an oxide semiconductor is formed by a sputtering method, it is preferable that moisture in a deposition chamber in a sputtering apparatus be removed as much as possible. For example, with an adsorption vacuum evacuation pump such as cryopump, the deposition chamber is preferably evacuated to be a high vacuum state (to a degree of about $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

For the oxide 230b, an oxide having an electron affinity higher than that of each of the oxides 230a and 230c is used. For example, for the oxide 230b, an oxide having an electron affinity higher than that of each of the oxides 230a and 230c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

An indium gallium oxide has a low electron affinity and a high oxygen-blocking property. Therefore, the oxide 230c preferably includes an indium gallium oxide. The gallium atomic ratio [Ga/(In+Ga)] is, for example, higher than or equal to 70%, preferably higher than or equal to 80%, more preferably higher than or equal to 90%.

Note that the oxides 230a and 230c may be gallium oxide. For example, when gallium oxide is used for the oxide 230c, a leakage current generated between the conductor 205 and the oxide 230 can be reduced. In other words, the off-state current of the transistor 200 can be reduced.

At this time, when a gate voltage is applied, a channel is formed in the oxide 230b having the highest electron affinity among the oxides 230a to 230c.

In order to give stable electrical characteristics to the OS transistor, it is preferable that impurities and oxygen vacancies in the oxide semiconductor be reduced to highly purify the oxide semiconductor so that at least the oxide 230b can be regarded as an intrinsic or substantially intrinsic oxide semiconductor. Furthermore, it is preferable that at least the channel formation region of the oxide 230b be regarded as an intrinsic or substantially intrinsic semiconductor.

The layers 245a and 245b may be formed using a material and a method which are similar to those of the oxide 230 or the oxide 430. In the case where the layers 245a and 245b are formed using an oxide semiconductor, an oxide semiconductor which is less likely to release oxygen or which is less likely to absorb oxygen is preferably used.

Modification Example

In a modification example of this embodiment, the insulator 224 may have a projection as illustrated in FIGS. 5A to 5D.

[S-Channel Structure]

As illustrated in FIG. 5B, in the transistor 200, the oxide 230b is surrounded by the conductor 205, the conductor 260, and the oxide 262 in the channel width direction. As described above, the insulator 224 has the projection. The oxide 230a and the oxide 230b are provided over the projection. By providing the projection, a bottom surface of the oxide 262 in a region not overlapping with the projection (a region not overlapping with the oxide 230b) can be closer to the substrate than a bottom surface of the oxide 230b is. The height of the projection is preferably greater than or equal to the thickness of the insulator 250. Alternatively, the height of the projection is preferably greater than or equal to the sum of the thickness of the insulator 250 and the thickness of the oxide 230c. Thus, the side surface of the oxide 230b can be covered with the conductor 260 and the oxide 262.

In other words, the transistor 200 can have a structure in which the oxide 230b can be electrically surrounded by an electric field between the conductor 205, and the conductor 260 and the oxide 262. Such a structure of a transistor in which a semiconductor where a channel is formed is electrically surrounded by an electric field between conductors is called a surrounded channel (s-channel) structure. In the transistor 200 having an s-channel structure, a channel can be formed in the whole of the oxide 230b (bulk). In the s-channel structure, the drain current of the transistor can be increased, so that a larger amount of on-state current (current which flows between the source and the drain when the transistor is on) can be obtained. Furthermore, the entire channel formation region of the oxide 230b can be depleted by the electric field between the conductor 205, and the conductor 260 and the oxide 262. Accordingly, the off-state current of the s-channel transistor can be further reduced. When the channel width is shortened, the effects of the s-channel structure, such as an increase in on-state current and a reduction in off-state current, can be enhanced.

As illustrated in FIGS. 5A to 5D, the conductor 260 and the oxide 262 may be stacked as a gate electrode. In this case, a conductive material containing oxygen is preferably used for the oxide 262. The conductive material containing oxygen is provided on the oxide semiconductor side, whereby oxygen can be supplied to the oxide semiconductor when the conductive material is formed. In addition, oxygen released from the conductive material can be supplied to the oxide semiconductor.

As illustrated in FIGS. 5A to 5D, the insulator 250 and the insulator 450 may be covered with the layer 270 and the layer 470, respectively. In this case, after the structure is formed, heat treatment is preferably performed before the insulator 272 or the insulator 280 is formed. By the heat treatment, excess oxygen from the oxide 262 or the oxide 462 can pass through the side surface of the insulator 250 or the insulator 450 and efficiently supplied to the oxide 230 or the oxide 430 without being diffused to the outside of the transistor region. Moreover, by the heat treatment, impurities such as hydrogen and water are diffused to the outside of the transistor region through the side surface of the oxide 230 or the oxide 430, whereby a concentration of impurities in the oxide 230 or the oxide 430 can be lowered.

<Deposition Method>

An insulating material for forming the insulators, a conductive material for forming the conductors, or a semiconductor material for forming the semiconductors can be formed by a sputtering method, a spin coating method, a chemical vapor deposition (CVD) method (including a thermal CVD method, a metal organic chemical vapor deposition (MOCVD) method, a plasma enhanced CVD (PECVD) method, a high density plasma CVD method, a low pressure CVD (LPCVD) method, an atmospheric pressure CVD (APCVD) method, and the like), an atomic layer deposition (ALD) method, a molecular beam epitaxy (MBE) method, or a pulsed laser deposition (PLD) method.

By using a PECVD method, a high-quality film can be formed at a relatively low temperature. By using a deposition method that does not use plasma for deposition, such as an MOCVD method, an ALD method, or a thermal CVD method, a film can be formed with few defects because damage is not easily caused on a surface on which the film is deposited.

In the case where a film is formed by an ALD method, a gas that does not contain chlorine is preferably used as a material gas.

Example of Method for Manufacturing Semiconductor Device 1000

An example of a method for manufacturing the semiconductor device 1000 will be described with reference to FIGS. 6A to 6D, FIGS. 7A to 7D, FIGS. 8A to 8D, FIGS. 9A to 9D, FIGS. 10A to 10D, FIGS. 11A to 11D, FIGS. 12A to 12D, FIGS. 13A to 13D, FIGS. 14A to 14D, FIGS. 15A to 15D, FIGS. 16A to 16D, FIGS. 17A to 17D, FIGS. 18A to 18D, FIGS. 19A to 19D, FIGS. 20A to 20D, FIGS. 21A to 21D, FIGS. 22A to 22D, FIGS. 23A to 23D, FIGS. 24A to 24D, and FIGS. 25A to 25D. An L1-L2 cross section in the figures corresponds to the cross section taken along dashed-dotted line L1-L2 in FIG. 2. A W1-W2 cross section, a W3-W4 cross section, and a W5-W6 cross section in the figures correspond to the cross sections taken along dashed-dotted lines W1-W2, W3-W4, and W5-W6 in FIG. 2.

First, the insulator 212, the insulator 214, and the insulator 216 are sequentially formed over the substrate 201. In this embodiment, a single crystal silicon substrate (a p-type semiconductor substrate or an n-type semiconductor substrate) is used as the substrate 201.

In this embodiment, aluminum oxide formed by an ALD method is used for the insulator 212. A dense insulating layer including reduced defects such as cracks and pinholes or having a uniform thickness can be formed by an ALD method.

In this embodiment, aluminum oxide formed by a sputtering method is used for the insulator 214. In addition, silicon oxynitride formed by a CVD method is used for the insulator 216. As described above, the insulator 216 is preferably an insulating layer containing excess oxygen. After the formation of the insulator 216, oxygen doping treatment may be performed.

Next, a resist mask 290 is formed over the sample surface (see FIGS. 6A to 6D). The resist mask 290 can be formed by a photolithography method, a printing method, an inkjet method, or the like as appropriate. Formation of the resist mask 290 by a printing method, an inkjet method, or the like needs no photomask; thus, manufacturing cost can be reduced.

The formation of the resist mask by a photolithography method can be performed in such a manner that a photosensitive resist is irradiated with light through a photomask and a portion of the resist which has been exposed to light (or has not been exposed to light) is removed using a developing solution. Examples of light with which the photosensitive resist is irradiated include KrF excimer laser light, ArF excimer laser light, extreme ultraviolet (EUV) light, and the like. Alternatively, a liquid immersion technique may be employed in which light exposure is performed with a portion between a substrate and a projection lens filled with liquid (e.g., water). An electron beam or an ion beam may be used instead of the above-mentioned light. Note that a photomask is not necessary in the case of using an electron beam or an ion beam. Note that a dry etching method such as ashing or a wet etching method using a dedicated stripper or the like can be used for removal of the resist mask. Both the dry etching method and the wet etching method may be used.

With the use of the resist mask 290 as a mask, part of at least the insulator 216 is selectively removed to form openings (see FIGS. 7A to 7D). After that, the resist mask is removed. When the openings are formed, part of the insulator 214 is also removed in some cases. The insulator 216 can be removed by a dry etching method, a wet etching method, or the like. Both the dry etching method and the wet etching method may be used.

Next, a conductive film to be the conductor 205a, the conductor 405a, the conductor 406a, and the conductor 407a and a conductive film to be the conductor 205b, the conductor 405b, the conductor 406b, and the conductor 407b are formed over the insulator 212 and the insulator 216 (see FIGS. 8A to 8D). In this embodiment, tantalum oxide formed by a sputtering method is used for the conductive film to be the conductor 205a, the conductor 405a, the conductor 406a, and the conductor 407a. In addition, tungsten formed by, for example, an MCVD method is used for the conductive film to be the conductor 205b, the conductor 405b, the conductor 406b, and the conductor 407b.

Next, chemical mechanical polishing (CMP) treatment is performed (see FIGS. 9A to 9D, and arrows in FIGS. 9A to 9D denote the CMP treatment). By the CMP treatment, parts of the conductive films are removed. At this time, part of a surface of the insulator 216 is also removed in some cases. By the CMP treatment, unevenness of the sample surface can be reduced, and coverage with an insulating layer or a conductive layer to be formed later can be increased.

Then, a conductive film to be the conductor 205c, the conductor 405c, the conductor 406c, and the conductor 407c is formed over the insulator 216, the conductor 205a, the conductor 405a, the conductor 406a, the conductor 407a, the conductor 205b, the conductor 405b, the conductor 406b, and the conductor 407b. In this embodiment, tantalum nitride formed by a sputtering method is used for the conductive film to be the conductor 205c, the conductor 405c, the conductor 406c, and the conductor 407c.

Next, a resist mask 291 is formed over the sample surface (see FIGS. 10A to 10D). With the use of the resist mask 291 as a mask, the conductor 205c, the conductor 405c, the conductor 406c, and the conductor 407c are formed; as a result, the conductor 205, the conductor 405, the conductor 406, and the conductor 407 are formed (see FIGS. 11A to 11D).

The insulator 224 is formed over the insulator 216, the conductor 205, the conductor 405, the conductor 406, and the conductor 407. In this embodiment, silicon oxynitride formed by a CVD method is used for the insulator 224. As described above, the insulator 224 is preferably an insulating layer containing excess oxygen. After the formation of the insulator 224, oxygen doping treatment may be performed.

Then, a resist mask 292 is formed over the insulator 224 (see FIGS. 12A to 12D). With the use of the resist mask 292 as a mask, openings are formed in the insulator 224. Note that the openings are provided over the conductor 405c and the conductor 407c (see FIGS. 13A to 13D).

Next, an oxide film 230A, an oxide film 230B, an oxide film 235A, a conductive film 240A, and a film 245A are sequentially formed. In this embodiment, the oxide film 230A is formed by a sputtering method. Oxygen or a mixed gas of oxygen and a rare gas is used as a sputtering gas. By increasing the proportion of oxygen in the sputtering gas, the amount of excess oxygen in the oxide film to be deposited can be increased.

At the formation of the oxide film 230A, part of oxygen contained in the sputtering gas is supplied to the insulators 224 and 216 in some cases. As the amount of oxygen contained in the sputtering gas increases, the amount of oxygen supplied to the insulators 224 and 216 increases. Thus, a region containing excess oxygen can be formed in each of the insulators 224 and 216. Part of oxygen supplied to the insulators 224 and 216 reacts with hydrogen left in the insulators 224 and 216 to produce water, and is released from the insulators 224 and 216 by later heat treatment. In this manner, the hydrogen concentrations in the insulators 224 and 216 can be reduced.

Thus, the proportion of oxygen in the sputtering gas is preferably 70% or more, further preferably 80% or more, still further preferably 100%. When an oxide containing excess oxygen is used for the oxide film 230A, oxygen can be supplied to the oxide 230b by later heat treatment.

The oxide film 230B is formed by a sputtering method. At this time, when the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor can have relatively high field-effect mobility.

In the case where an oxygen-deficient oxide semiconductor is used for the oxide film 230B, an oxide film containing excess oxygen is preferably used as the oxide film 230A. Oxygen doping treatment may be performed after the formation of the oxide film 230B.

Next, the oxide film 235A is formed by a sputtering method. The oxide film 235A can be formed of a material similar to the materials of the oxide 235a and the oxide 235b, in which case oxygen can be added to the oxide film 230B.

Next, in this embodiment, tantalum nitride formed by a sputtering method is used for the conductive film 240A. Tantalum nitride has high oxidation resistance and thus is preferably used in the case where heat treatment is performed in a later step.

Next, the film 245A is formed. In this embodiment, aluminum oxide formed by an ALD method is used for the film 245A. A dense film including reduced defects such as cracks and pinholes or having a uniform thickness can be formed by an ALD method.

Then, a resist mask 293 is formed over the film 245A by a photolithography method (see FIGS. 14A to 14D). With the use of the resist mask 293 as a mask, part of the film 245A is selectively removed to form a film 245B having an opening (see FIGS. 15A to 15D).

Note that when the opening is formed, the side surface on the opening side of the film 245B is preferably tapered to the top surface of the conductive film 240A. Note that the taper angle is 30° or more and 90° or less, preferably 45° or more and 80° or less. The formation of the opening with the resist mask is preferably performed using the minimum feature size. In other words, the film 245B has the opening whose width is the minimum feature size.

Then, a resist mask 294 is formed over the film 245B by a photolithography method (see FIGS. 16A to 16D). With the use of the resist mask 294 as a mask, parts of the film 245B, the oxide film 235A, and the conductive film 240A are selectively removed to form an island-shaped oxide film 235B and an island-shaped conductive film 240B (see FIGS. 17A to 17D, and the resist mask is not illustrated). At this time, from the film 245B, the layer 245a and the layer 245b are formed. Note that when the width of the opening of the film 245B is the minimum feature size, the distance between the layers 245a and 245b is the minimum feature size.

Subsequently, parts of the oxide films 230A and 230B are selectively removed using the conductive film 240B as a mask (see FIGS. 18A to 18D). At this time, part of the insulator 224 might also be removed. After that, the resist mask is removed; accordingly, a layered structure of the island-shaped oxide 230a, the island-shaped oxide 230b, the island-shaped oxide film 235B, the island-shaped conductive film 240B, and the layers 245a and 245b can be formed.

Note that the removal of the portions of the oxide film 230A, the oxide film 230B, the oxide film 235B, the conductive film 240A, and the film 245A can be performed by a dry etching method, a wet etching method, or the like. Both the dry etching method and the wet etching method may be used.

Next, heat treatment is preferably performed to reduce impurities such as moisture and hydrogen contained in the oxide 230a and the oxide 230b to highly purify the oxide 230a and the oxide 230b.

Plasma treatment using an oxidizing gas may be performed before the heat treatment. For example, plasma treatment using a nitrous oxide gas is performed. By the plasma treatment, the fluorine concentration in the exposed insulating layer can be lowered. Moreover, the plasma treatment is effective in removing an organic substance on the sample surface.

For example, the heat treatment is performed in an inert gas atmosphere containing nitrogen, a rare gas, or the like, an oxidizing gas atmosphere, or an ultra-dry air atmosphere (the moisture amount is 20 ppm (−55° C. by conversion into a dew point) or less, preferably 1 ppm or less, more preferably 10 ppb or less, in the case where the measurement is performed by a dew point meter in a cavity ring down laser spectroscopy (CRDS) system). Note that the oxidizing gas atmosphere refers to an atmosphere containing an oxidizing gas such as oxygen, ozone, or nitrogen oxide at 10 ppm or higher. The inert gas atmosphere refers to an atmosphere which contains the oxidizing gas at lower than 10 ppm and is filled with nitrogen or a rare gas. Although there is not particular limitation on the pressure during the heat treatment, the heat treatment is preferably performed under a reduced pressure.

By the heat treatment, at the same time that the impurities are released, oxygen contained in the insulator 224 is diffused into the oxide 230a and the oxide 230b and oxygen vacancies in the oxides can be reduced. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for desorbed oxygen. The heat treatment may be performed at any time after the oxides 230a and 230b are formed.

The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

In this embodiment, after heat treatment is performed at 400° C. in a nitrogen gas atmosphere for 1 hour, another heat treatment is performed at 400° C. in an oxygen gas atmosphere for 1 hour. By performing the heat treatment in a nitrogen gas atmosphere first, impurities such as moisture or hydrogen contained in the oxide 230a and the oxide 230b are released, so that the impurity concentrations in the oxides 230a and 230b are reduced. By performing the heat treatment in an oxygen gas atmosphere next, oxygen is introduced into the oxides 230a and 230b.

Since an upper surface of the conductive film 240B is partly covered with the layers 245a and 245b at the heat treatment, oxidation caused from the upper surface can be prevented.

Then, part of the conductive film 240B and part of the oxide film 235B are selectively removed by a dry etching method using the layers 245a and 245b as masks. By the etching step, the conductive film 240B is divided into the conductors 240a and 240b and the oxide film 235B is divided into the oxides 235a and 235b.

As a gas for the dry etching, for example, any of a $C_4F_6$ gas, a $C_2F_6$ gas, a $C_4F_8$ gas, a $CF_4$ gas, a $SF_6$ gas, a $CHF_3$ gas, and the like can be used alone or in combination. Alternatively, an oxygen gas, a helium gas, an argon gas, a hydrogen gas, or the like can be added to any of the above gases as appropriate. In particular, a gas with which an organic substance can be generated by plasma is preferably used. For example, it is preferable to use a $C_4F_6$ gas, a $C_4F_8$ gas, or a $CHF_3$ gas to which a helium gas, an argon gas, a hydrogen gas, or the like is added as appropriate.

Using a gas with which an organic substance can be generated, the conductive film 240B is etched while an organic substance 295 is attached to the side surfaces of the layers 245a and 245b, whereby the conductors 240a and 240b each of which has a taper angle can be formed (see FIGS. 19A to 19D).

The conductors 240a and 240b function as a source electrode and a drain electrode of the transistor; thus, a distance between the conductors 240a and 240b facing each other can be referred to as a channel length of the transistor. That is, when the width of the opening of the film 245B is the minimum feature size, the distance between the layers 245a and 245b is the minimum feature size; thus, the gate line width and the channel length can be smaller than the minimum feature size (see FIGS. 20A to 20D).

The angles of the side surfaces of the opening in the film 245B can be controlled in accordance with the ratio of the etching rate of the conductive film 240B to the deposition rate of the organic substance 295 attached to the side surfaces of the layers 245a and 245b. For example, if the ratio of the etching rate to the deposition rate of the organic substance 295 is 1:1, each of the angles is 45°.

The ratio of the etching rate to the deposition rate of the organic substance 295 is determined by setting etching conditions as appropriate depending on the gas to be used in the etching. For example, the ratio of the etching rate to the deposition rate of the organic substance 295 can be controlled by using a mixed gas of a $C_4F_8$ gas and an argon gas and controlling the high-frequency power and the etching pressure of the etching apparatus.

When the conductors 240a and 240b are formed by a dry etching method, an impurity element such as remaining components of an etching gas might be attached to the exposed oxide 230b. For example, when a chlorine-based gas is used as an etching gas, chlorine and the like are attached in some cases. Furthermore, when a hydrocarbon-based gas is used as an etching gas, carbon, hydrogen, and the like are attached in some cases. The impurity elements attached to the exposed surface of the oxide 230b are preferably reduced. The impurity elements can be reduced by cleaning treatment using diluted hydrofluoric acid, cleaning treatment using ozone, cleaning treatment using ultra violet rays, or the like. Note that different types of cleaning treatment may be combined.

Plasma treatment using an oxidizing gas may be performed. For example, plasma treatment using a nitrous oxide gas is performed. By the plasma treatment, the concentration of fluorine in the oxide 230b can be lowered. Moreover, the plasma treatment is effective in removing an organic substance on the sample surface.

Oxygen doping treatment may be performed on the exposed oxide 230b. Furthermore, the above-described heat treatment may be performed.

For example, when the layers 245a and 245b are used as masks, an etching gas with relatively high selectivity ratio of the conductive film 240B to the insulator 224 can be used. Accordingly, even when the thickness of the insulator 224 is small, the wiring layer positioned below the insulator can be prevented from being over-etched. In addition, when the thickness of the insulator 224 is small, a voltage is efficiently applied from the conductor 205; therefore, the transistor with low power consumption can be obtained.

Next, an oxide film 230C to be the oxide 230c and the oxide 430 is formed (see FIGS. 21A to 21D). In this embodiment, an oxide containing excess oxygen which is formed under the same conditions as those of the oxide film 230A is used for the oxide film 230C. When an oxide containing excess oxygen is used for the oxide film 230C, oxygen can be supplied to the oxide 230b by later heat treatment.

At the formation of the oxide film 230C to be the oxide 230c and the oxide 430, part of oxygen contained in the sputtering gas is supplied to the insulators 216 and 224, and an excess oxygen region is formed in some cases, as in the case of the oxide 230a. Part of oxygen supplied to the insulators 216 and 224 reacts with hydrogen left in the insulators 216 and 224 to produce water and is released from the insulators 216 and 224 by later heat treatment. Thus, the hydrogen concentrations in the insulators 216 and 224 can be reduced.

Oxygen doping treatment and/or heat treatment may be performed after the formation of the oxide film 230C. By the heat treatment, oxygen contained in the oxide 230a and the oxide film 230C can be supplied to the oxide 230b. By supplying oxygen to the oxide 230b, oxygen vacancies in the oxide 230b can be reduced. Thus, in the case where an oxygen-deficient oxide semiconductor is used for the oxide 230b, a semiconductor containing excess oxygen is preferably used for the oxide film 230C.

Part of the oxide film 230C is in contact with the channel formation region of the oxide 230b. Top and side surfaces of the channel formation region of the oxide 230b are covered with the oxide film 230C. In such a manner, the oxide 230b can be surrounded by the oxide 230a and the oxide film 230C. By surrounding the oxide 230b by the oxide 230a and the oxide film 230C, diffusion of impurities into the oxide 230b which is to be caused in a later step can be suppressed.

Next, an insulating film 250A is formed over the oxide film 230C. In this embodiment, silicon oxynitride formed by a CVD method is used for the insulating film 250A. The insulating film 250A is preferably an insulating layer containing excess oxygen. The insulating film 250A may be subjected to oxygen doping treatment. Heat treatment may be performed after the formation of the insulating film 250A.

Next, an oxide film 262A is formed. The oxide film 262A can be formed of a material similar to that of the oxide film 235A, in which case oxygen can be added to the insulating film 250A. In this embodiment, a metal oxide film is used as the oxide film 262A.

Next, a conductive film 260A is formed. In this embodiment, tantalum nitride is used for the conductive film 260A.

Next, a resist mask 296 is formed over the sample surface by a photolithography method (see FIGS. 21A to 21D). With the use of the resist mask 296 as a mask, part of the conductive film 260A, part of the oxide film 262A, and part of the insulating film 250A are selectively removed, whereby the conductor 260, the oxide 262, the conductor 460, the oxide 462, the insulator 250, and the insulator 450 are formed (see FIGS. 22A to 22D).

Next, a film 270A is formed. In this embodiment, aluminum oxide formed by an ALD method is used for the film 270A.

Depending on the material used for the conductors 260 and 460, in a step to be performed later, such as heat treatment, the resistances of the conductors 260 and 460 might be increased by oxidation of the conductors 260 and 460. In the case where excess oxygen is supplied to the oxide 230b, the shortage of oxygen supplied to the oxide 230 due to absorption in the conductors 260 and 460 can be suppressed.

Next, a resist mask 297 is formed over the film 270A by a photolithography method (see FIGS. 23A to 23D). With the use of the resist mask 297 as a mask, part of each of the film 270A and the oxide film 230C is selectively removed to form the layer 270, the oxide 230c, the layer 470, and the oxide 430 (see FIGS. 24A to 24D).

It is preferable that heat treatment be performed after the formation of the layer 270, the insulator 250, the oxide 230c, the layer 470, the insulator 450, and the oxide 430.

The heat treatment is preferably performed in a vacuum just before formation of the insulator 272. In this embodiment, aluminum oxide formed by a sputtering method is used for the insulator 272. The heat treatment is preferably performed in a sputtering apparatus before the formation. Alternatively, plasma treatment using oxygen may be performed. Further alternatively, reverse sputtering treatment may be performed. Still further alternatively, heat treatment, plasma treatment using oxygen, and reverse sputtering treatment may be combined as appropriate. The sample surface is not exposed to the air from the heat treatment to the formation of aluminum oxide as described above, whereby an atmospheric component, mainly moisture, can be prevented from being adsorbed on the sample surface. Through such treatment, impurities in the oxide 230 can be reduced. In addition, part of the oxygen used as the sputtering gas is introduced to the insulator 216 and the insulator 224, and a region including excess oxygen is formed. Moreover, the transistor 200 and the transistor 400 can be covered with the insulator 272 (see FIGS. 25A to 25D).

In such a manner, the transistors 200 and 400 having different structures can be provided over the same substrate through substantially the same process. By the above-described manufacturing method, the transistor 400 is not necessarily manufactured after the transistor 200 is manufactured, for example; thus, the productivity of the semiconductor device can be increased.

In the transistor 200, a channel is formed in the oxide 230b in contact with the oxide 230a and the oxide 230c. In the transistor 400, a channel is formed in the oxide 430 in contact with the insulator 224 and the insulator 450. Thus, the transistor 400 is likely to be affected by interface scattering compared with the transistor 200. In this embodiment, the electron affinity of the oxide 430 is lower than that of the oxide 230b. Thus, the transistor 400 has higher $V_{th}$ than the transistor 200.

According to one embodiment of the present invention, transistors having different structures can be manufactured through substantially the same process. According to one embodiment of the present invention, a semiconductor device including transistors having different structures can be manufactured with high productivity. According to one embodiment of the present invention, a semiconductor device including transistors having different electrical characteristics can be manufactured with high productivity.

This embodiment can be implemented in an appropriate combination with any of the structures described in the other embodiments and the like.

Embodiment 2

In this embodiment, an oxide semiconductor included in the transistor described in the above embodiment will be described below with reference to FIGS. 29A to 29E, FIGS. 30A to 30E, FIGS. 31A to 31D, FIGS. 32A and 32B, FIG. 33, and FIG. 34.

<Structure of Oxide Semiconductor>

The structure of an oxide semiconductor will be described below.

Oxide semiconductors are classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is an oxide semiconductor having a plurality of c-axis aligned crystal parts (also referred to as pellets).

Figure 29A:
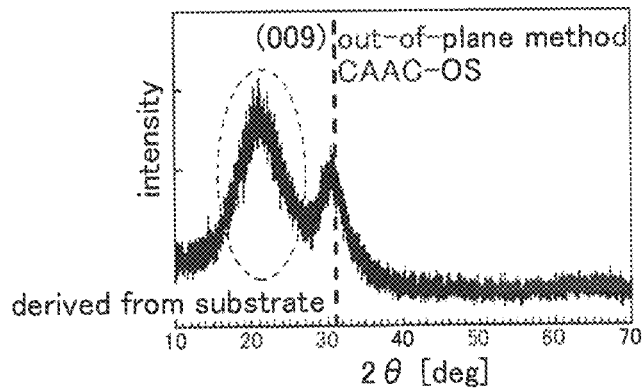
FIGS. 29A to 29E show structural analysis of a CAAC-OS and a single crystal oxide semiconductor by XRD and selected-area electron diffraction patterns of a CAAC-OS.

Analysis of a CAAC-OS by X-ray diffraction (XRD) will be described. For example, when the structure of a CAAC-OS including an $InGaZnO_4$ crystal that is classified as the space group R-3m is analyzed by an out-of-plane method, a peak appears at a diffraction angle (2θ) of around 31° as shown in FIG. 29A. This peak is derived from the (009) plane of the $InGaZnO_4$ crystal, which indicates that crystals in the CAAC-OS have c-axis alignment, and that the c-axes are aligned in the direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 29B:
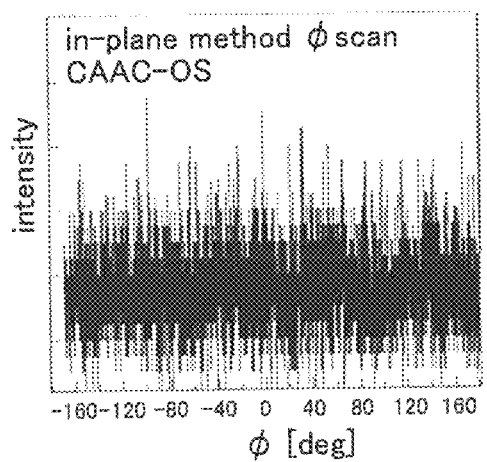
Figure 29C:
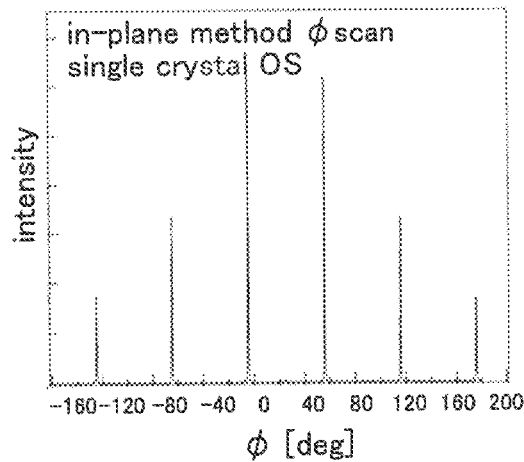

On the other hand, in structural analysis of the CAAC-OS by an in-plane method in which an X-ray is incident on the CAAC-OS in the direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), a peak is not clearly observed as shown in FIG. 29B. In contrast, in the case where single crystal $InGaZnO_4$ is subjected to φ scan with 2θ fixed at around 56°, six peaks which are derived from crystal planes equivalent to the (110) plane are observed as shown in FIG. 29C. Accordingly, the structural analysis using XRD shows that the directions of a-axes and b-axes are irregularly oriented in the CAAC-OS.

Figure 29D:
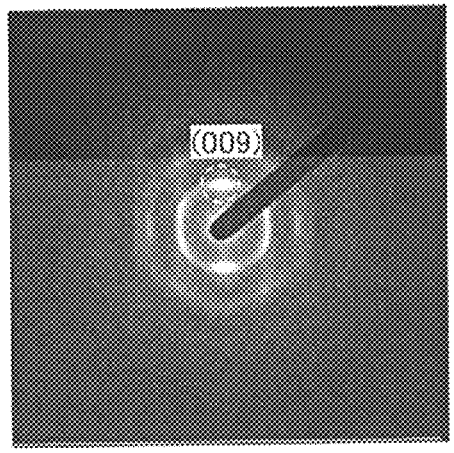
Figure 29E:
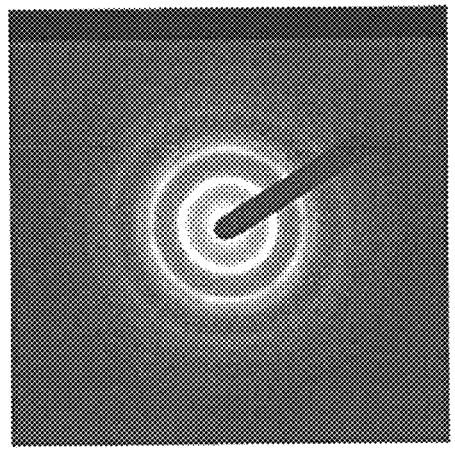

Next, a CAAC-OS analyzed by electron diffraction will be described. For example, when an electron beam with a probe diameter of 300 nm is incident on a CAAC-OS including an $InGaZnO_4$ crystal in the direction parallel to the formation surface of the CAAC-OS, such a diffraction pattern (also referred to as a selected-area transmission electron diffraction pattern) as is shown in FIG. 29D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 29E shows a diffraction pattern obtained in such a manner that an electron beam with a probe diameter of 300 nm is incident on the same sample in the direction perpendicular to the sample surface. As shown in FIG. 29E, a ring-like diffraction pattern is observed. Thus, the electron diffraction using an electron beam with a probe diameter of 300 nm also indicates that the a-axes and b-axes of the pellets included in the CAAC-OS do not have regular alignment. The first ring in FIG. 29E is considered to be derived from the (010) plane, the (100) plane, and the like of the $InGaZnO_4$ crystal. The second ring in FIG. 29E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 30A:
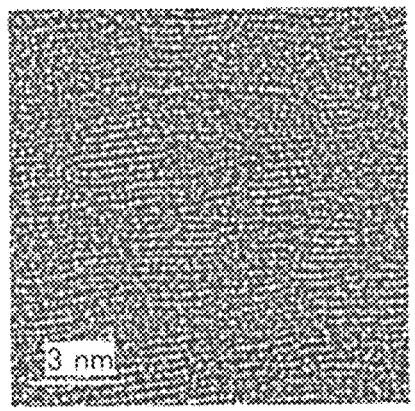
FIGS. 30A to 30E show a cross-sectional TEM image and plan-view TEM images of a CAAC-OS and images obtained through analysis thereof.

FIG. 30A shows a high-resolution TEM image of a cross section of the CAAC-OS observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 30A shows pellets in which metal atoms are arranged in a layered manner. FIG. 30A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 30B:
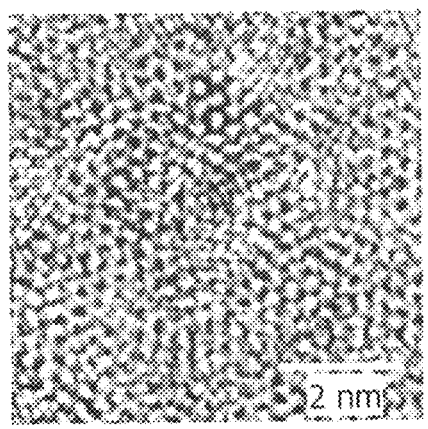
Figure 30C:
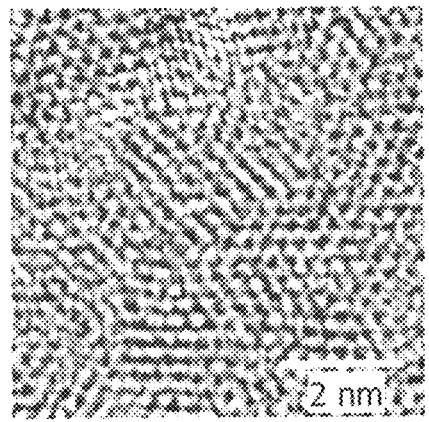
Figure 30D:
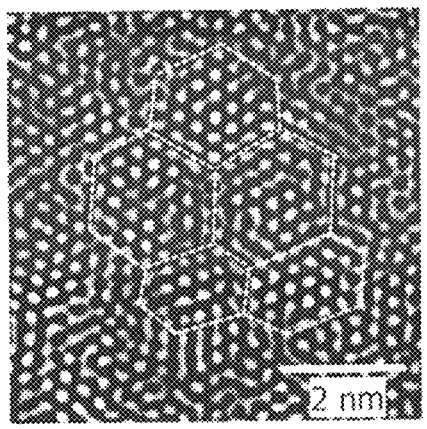
Figure 30E:
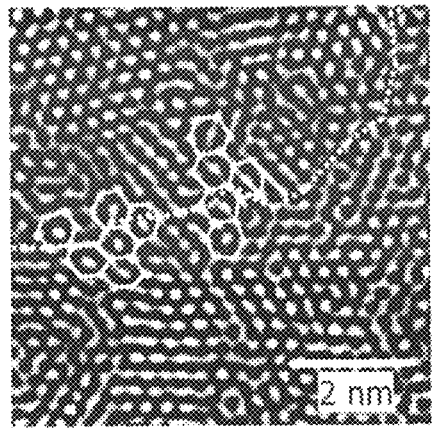

FIGS. 30B and 30C show Cs-corrected high-resolution TEM images of a plane of the CAAC-OS observed from the direction substantially perpendicular to the sample surface. FIGS. 30D and 30E are images obtained through image processing of FIGS. 30B and 30C. The method of image processing is as follows. The image in FIG. 30B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 30D, a portion where a lattice arrangement is broken is shown by dashed lines. A region surrounded by dashed lines is one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 30E, a dotted line denotes a portion where the direction of a lattice arrangement changes between a region with a regular lattice arrangement and another region with a regular lattice arrangement, and a dashed line denotes the change in the direction of the lattice arrangement. A clear grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a grain boundary is inhibited. This is probably because the CAAC-OS can tolerate distortion owing to a low density of arrangement of oxygen atoms in the a-b plane direction, an interatomic bond distance changed by substitution of a metal element, and the like.

As described above, the CAAC-OS has c-axis alignment, its pellets (nanocrystals) are connected in the a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS will be described.

Analysis of an nc-OS by XRD will be described. When the structure of an nc-OS is analyzed by an out-of-plane method, a peak indicating orientation does not appear. That is, a crystal of an nc-OS does not have orientation.

Figure 31A:
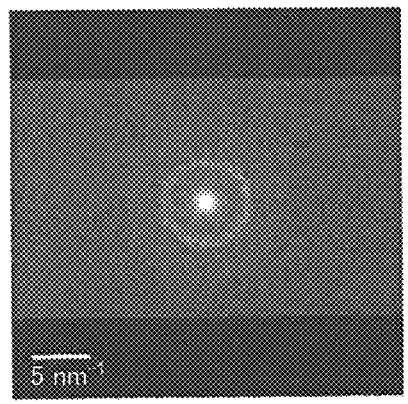
FIGS. 31A to 31D show electron diffraction patterns and a cross-sectional TEM image of an nc-OS.
Figure 31B:
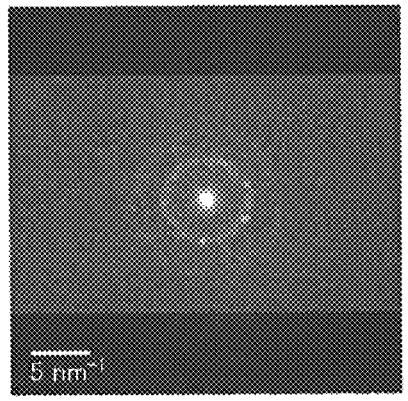

For example, when an electron beam with a probe diameter of 50 nm is incident on a 34-nm-thick region of thinned nc-OS including an InGaZnO$_4$ crystal in the direction parallel to the formation surface, a ring-shaped diffraction pattern (a nanobeam electron diffraction pattern) shown in FIG. 31A is observed. FIG. 31B shows a diffraction pattern (a nanobeam electron diffraction pattern) obtained when an electron beam with a probe diameter of 1 nm is incident on the same sample. As shown in FIG. 31B, a plurality of spots are observed in a ring-like region. In other words, ordering in an nc-OS is not observed with an electron beam with a probe diameter of 50 nm but is observed with an electron beam with a probe diameter of 1 nm.

Figure 31C:
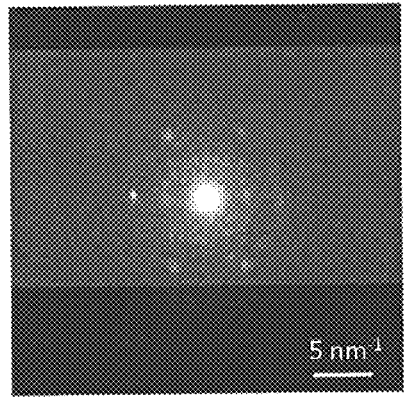

Furthermore, an electron diffraction pattern in which spots are arranged in an approximately regular hexagonal shape is observed in some cases as shown in FIG. 31C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 31D:
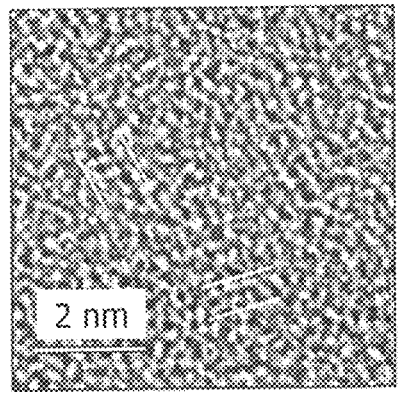

FIG. 31D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 31D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

Figure 32A:
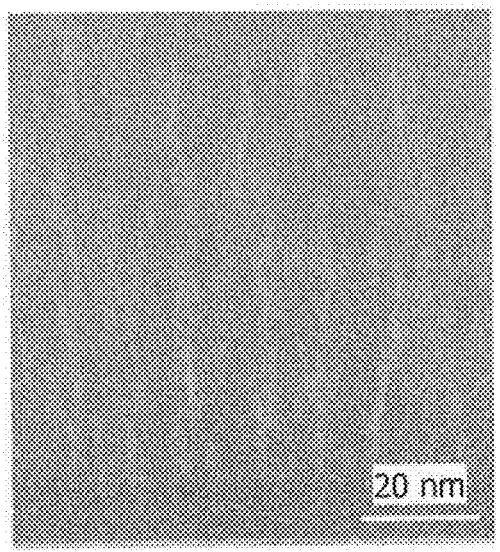
FIGS. 32A and 32B show cross-sectional TEM images of an a-like OS.
Figure 32B:
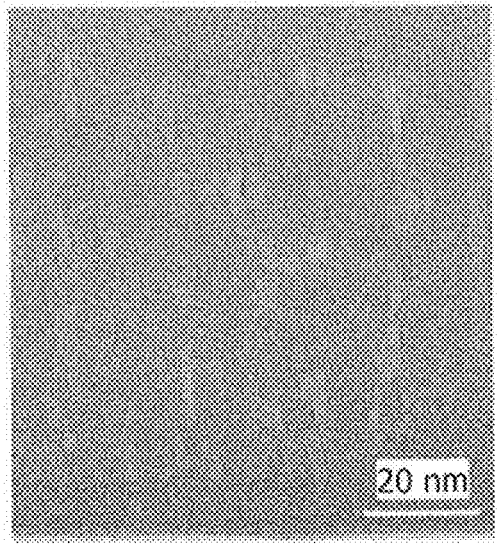

FIGS. 32A and 32B are high-resolution cross-sectional TEM images of an a-like OS. FIG. 32A is the high-resolution cross-sectional TEM image of the a-like OS at the start of the electron irradiation. FIG. 32B is the high-resolution cross-sectional TEM image of the a-like OS after the electron ($e^-$) irradiation at $4.3 \times 10^8$ $e^-/nm^2$. FIGS. 32A and 32B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 33:
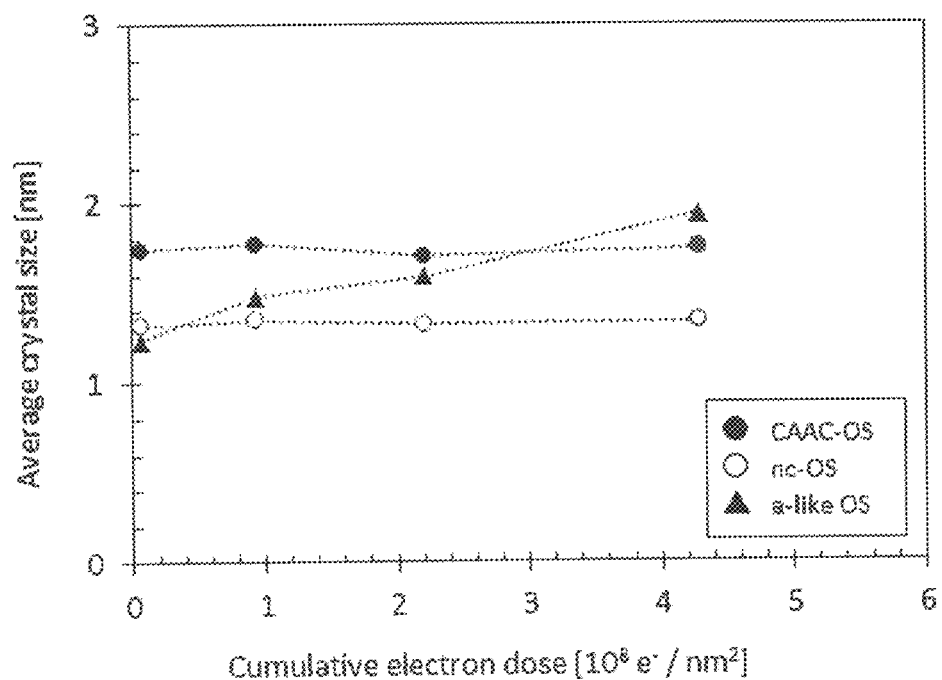
FIG. 33 shows a change of crystal parts of an In—Ga—Zn oxide owing to electron irradiation.

FIG. 33 shows change in the average size of crystal parts (at 22 points to 30 points) in each sample. Note that the crystal part size corresponds to the length of a lattice fringe. FIG. 33 indicates that the crystal part size in the a-like OS increases with an increase in the cumulative electron dose in obtaining TEM images, for example. As shown in FIG. 33, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part sizes in the nc-OS and the CAAC-OS show little change from the start of electron irradiation to a cumulative electron dose of $4.2 \times 10^8$ $e^-/nm^2$. As shown in FIG. 33, the crystal part sizes in an nc-OS and a CAAC-OS are approximately 1.3 nm and approximately 1.8 nm, respectively, regardless of the cumulative electron dose. For observation of electron beam irradiation and TEM, a Hitachi H-9000NAR transmission electron microscope was used. The conditions of electron beam irradiations are as follows: the accelerating voltage is 300 kV; the current density is $6.7 \times 10^5$ $e^-/(nm^2 \cdot s)$; and the diameter of an irradiation region is 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stack including two or more of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ $cm^{-3}$, preferably lower than $1 \times 10^{11}$ $cm^{-3}$, and further preferably lower than $1 \times 10^{10}$ $cm^{-3}$ and is higher than or equal to $1 \times 10^{-9}$ $cm^3$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

Figure 34:
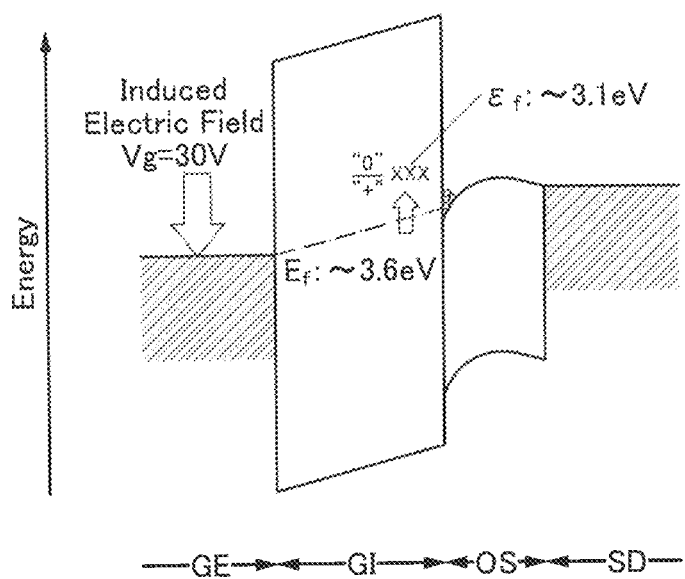
FIG. 34 shows an energy band of a transistor in which an oxide semiconductor film is used as a channel region.

The use of the substantially intrinsic oxide semiconductor film may improve the reliability of a transistor. Here, the reason for the improvement in the reliability of a transistor including the oxide semiconductor film in its channel region is described with reference to FIG. 34. FIG. 34 is an energy band diagram of the transistor including the oxide semiconductor film in its channel region.

In FIG. 34, GE, GI, OS, and SD refer to a gate electrode, a gate insulating film, an oxide semiconductor film, and a source/drain electrode, respectively. In other words, FIG. 34 shows an example of energy bands of the gate electrode, the gate insulating film, the oxide semiconductor film, and the source/drain electrode in contact with the oxide semiconductor film.

In FIG. 34, a silicon oxide film and an In—Ga—Zn oxide are used as the gate insulating film and the oxide semiconductor film, respectively. The transition level ($\varepsilon_f$) of a defect that might be formed in the silicon oxide film is assumed to be formed at a position approximately 3.1 eV away from the conduction band minimum of the gate insulating film. Furthermore, the Fermi level ($E_f$) of the silicon oxide film at the interface between the oxide semiconductor film and the silicon oxide film when the gate voltage ($V_g$) is 30 V is assumed to be formed at a position approximately 3.6 eV away from the conduction band minimum of the gate insulating film. Note that the Fermi level ($E_f$) of the silicon oxide film changes depending on the gate voltage. For example, the Fermi level ($E_f$) of the silicon oxide film at the interface between the oxide semiconductor film and the silicon oxide film is lowered as the gate voltage is increased. A white circle and x in FIG. 34 represent an electron (carrier) and a defect state in the silicon oxide film, respectively.

As shown in FIG. 34, when thermal excitation of carriers occurs during the application of a gate voltage, the carriers are trapped by the defect states (x in the diagram) and the charge state of the defect states is changed from positive ("+") to neutral ("0"). In other words, when the value obtained by adding the thermal excitation energy to the Fermi level ($E_f$) of the silicon oxide film becomes greater than the transition level ($\varepsilon_f$) of the defect, the charge state of the defect states in the silicon oxide film is changed from positive to neutral, so that the threshold voltage of the transistor shifts in the positive direction.

When an oxide semiconductor film with a different electron affinity is used, the Fermi level of the interface between the gate insulating film and the oxide semiconductor film might be changed. When an oxide semiconductor film with a higher electron affinity is used, the conduction band minimum of the gate insulating film becomes relatively high at the interface between the gate insulating film and the oxide semiconductor film or in the vicinity of the interface. In that case, the defect states (x in FIG. 34) which might be formed in the gate insulating film also becomes relatively high, so that the energy difference between the Fermi level of the gate insulating film and the Fermi level of the oxide semiconductor film is increased. This results in less charge trapped in the gate insulating film. For example, a change in the charge states of the defect states that can be formed in the silicon oxide film is smaller; thus, a change in the threshold voltage of the transistor due to gate bias temperature (GBT) stress can be smaller.

The structure described in this embodiment can be used in appropriate combination with the structure described in any of the other embodiments.

Embodiment 3

In this embodiment, one mode of a semiconductor device is described with reference to FIGS. 35A and 35B, FIG. 36, and FIG. 37.

Structure Examples

Figure 35A:
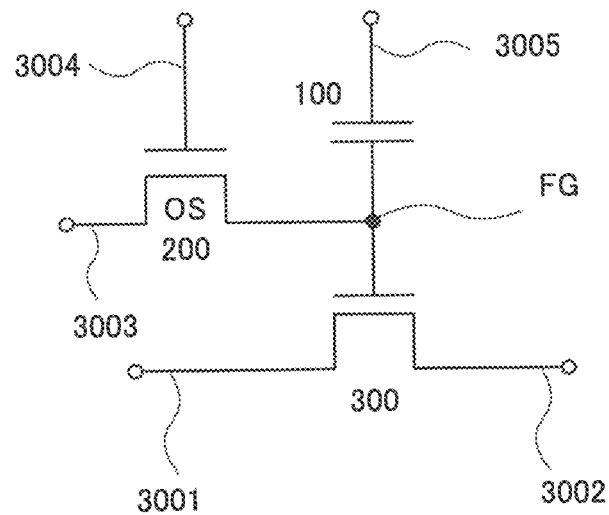
FIGS. 35A and 35B are each a circuit diagram of a semiconductor device of one embodiment.

Examples of a semiconductor device (memory device) including a capacitor of one embodiment of the present invention are illustrated in FIGS. 35A and 35B, FIG. 36, and FIG. 37. Note that FIG. 35A is a circuit diagram corresponding to each of FIG. 36 and FIG. 37.

<Circuit Configuration 1 of Semiconductor Device>

Figure 36:
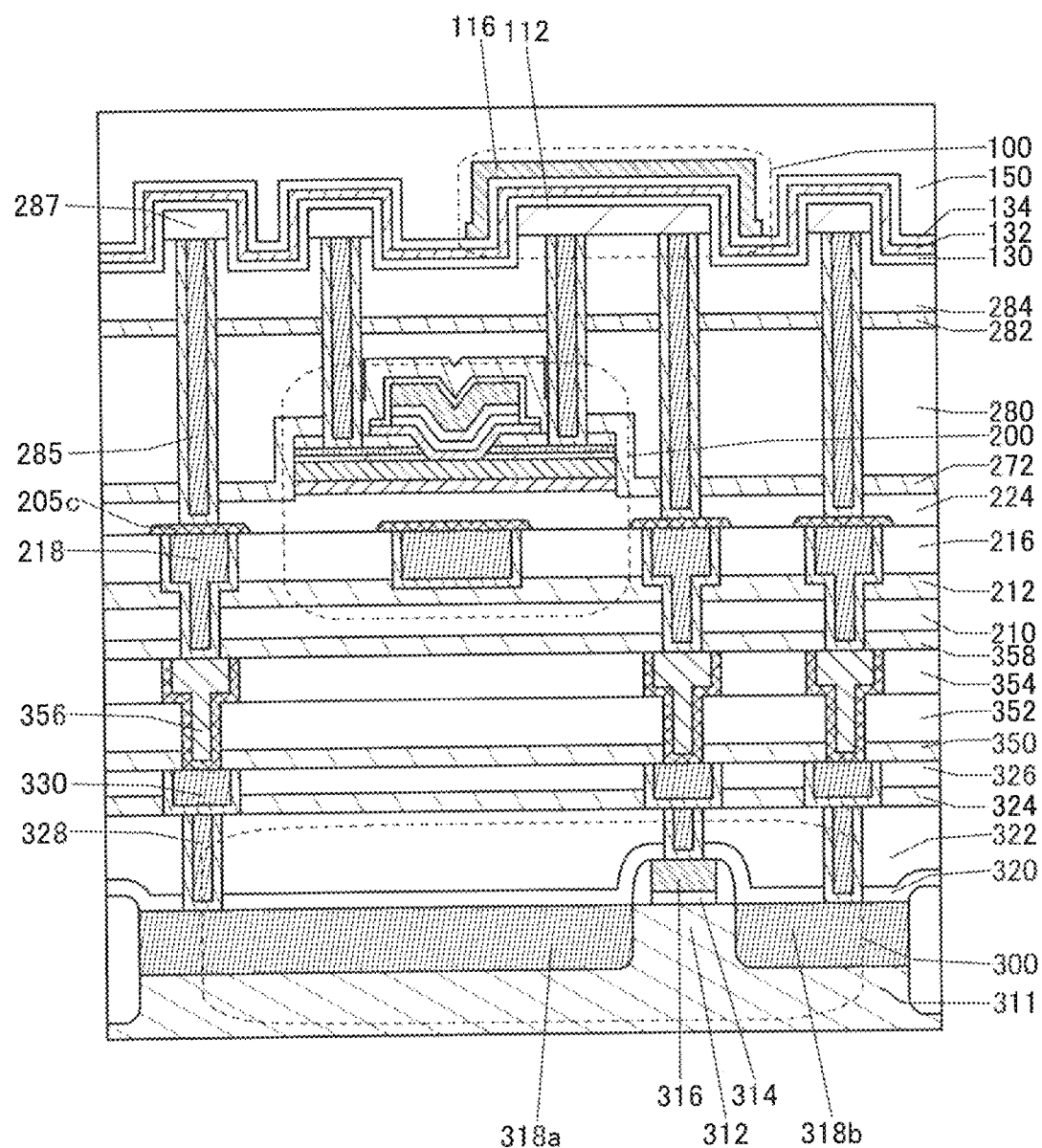
FIG. 36 illustrates a cross-sectional structure of a semiconductor device of one embodiment.
Figure 37:
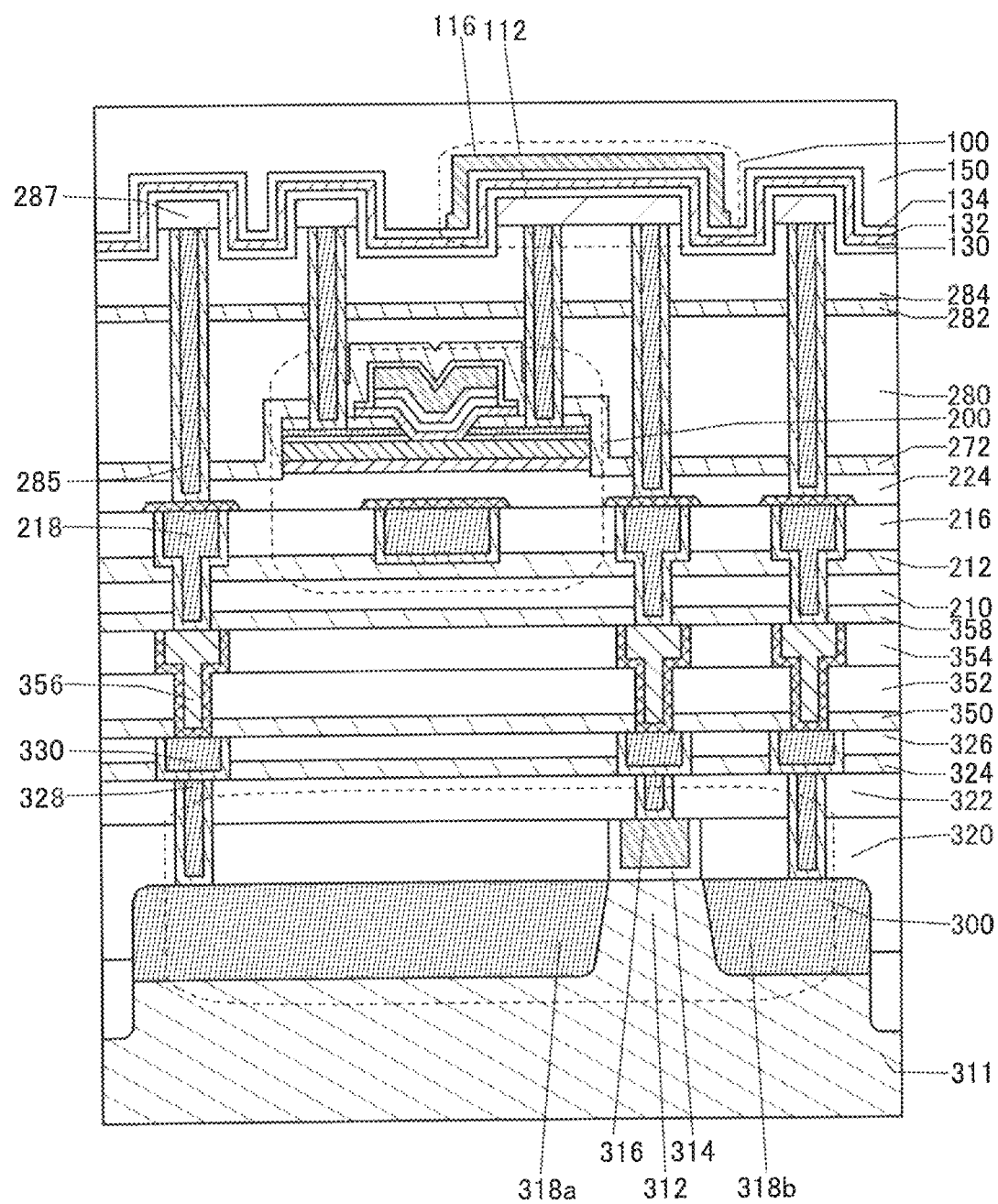
FIG. 37 illustrates a cross-sectional structure of a semiconductor device of one embodiment.

Semiconductor devices illustrated in FIG. 35A, FIG. 36, and FIG. 37 each include a transistor 300, the transistor 200, and a capacitor 100.

The transistor 200 is a transistor in which a channel is formed in a semiconductor layer including an oxide semiconductor. Since the off-state current of the transistor 200 is small, by using the transistor 200 in a semiconductor device (memory device), stored data can be retained for a long time. In other words, it is possible to obtain a semiconductor device (memory device) which does not require refresh operation or has an extremely low frequency of the refresh operation, which leads to a sufficient reduction in power consumption.

In FIG. 35A, a first wiring 3001 is electrically connected to a source of the transistor 300. A second wiring 3002 is electrically connected to a drain of the transistor 300. A third wiring 3003 is electrically connected to one of a source and a drain of the transistor 200. A fourth wiring 3004 is electrically connected to a gate of the transistor 200. A gate of the transistor 300 and the other of the source and the drain of the transistor 200 are electrically connected to one electrode of the capacitor 100. A fifth wiring 3005 is electrically connected to the other electrode of the capacitor 100.

The semiconductor device in FIG. 35A has a feature that the potential of the gate of the transistor 300 can be retained, and thus enables writing, retaining, and reading of data as follows.

Writing and retaining of data will be described. First, the potential of the fourth wiring 3004 is set to a potential at which the transistor 200 is turned on, so that the transistor 200 is turned on. Accordingly, the potential of the third wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the fourth wiring 3004 is set to a potential at which the transistor 200 is turned off, so that the transistor 200 is turned off. Thus, the charge is retained at the node FG (retaining).

In the case where the off-state current of the transistor 200 is small, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 300, an apparent threshold voltage $V_{th\_H}$ at the time when the high-level charge is given to the gate of the transistor 300 is lower than an apparent threshold voltage $V_{th\_L}$ at the time when the low-level charge is given to the gate of the transistor 300. Here, an apparent threshold voltage refers to the potential of the fifth wiring 3005 which is needed to make the transistor 300 be in an on state. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 300 is brought into an on state. On the other hand, in the case where the low-level charge is supplied to the node FG in writing, even when the potential of the fifth wiring 3005 is $V_0$ ($<V_{th\_L}$), the transistor 300 remains in the off state. Thus, the data retained in the node FG can be read by determining the potential of the second wiring 3002.

By arranging semiconductor devices each having the structure illustrated in FIG. 35A in a matrix, a memory device (memory cell array) can be formed.

Note that in the case where memory cells are arrayed, it is necessary that data of a desired memory cell is read in read operation. A configuration in which only data of a desired memory cell can be read by supplying a potential at which the transistor 300 is turned off regardless of the charge supplied to the node FG, that is, a potential lower than $V_{th\_H}$ is supplied to the fifth wiring 3005 of memory cells from which data is not read may be employed. Alternatively, a configuration in which only data of a desired memory cell can be read by supplying a potential at which the transistor 300 is turned on regardless of the charge supplied to the node FG, that is, a potential higher than $V_{th\_L}$ is supplied to the fifth wiring 3005 of memory cells from which data is not read may be employed.

<Circuit Configuration 2 of Semiconductor Device>

Figure 35B:
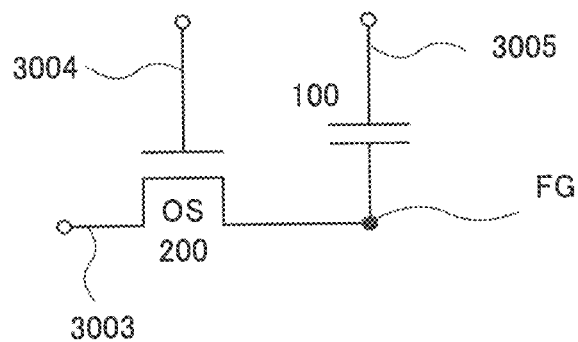

A semiconductor device in FIG. 35B is different from the semiconductor device in FIG. 35A in that the transistor 300 is not provided. Also in this case, data can be written and retained in a manner similar to that of the semiconductor device in FIG. 35A.

Reading of data in the semiconductor device in FIG. 35B is described. When the transistor 200 is brought into an on state, the third wiring 3003 which is in a floating state and the capacitor 100 are brought into conduction, and the charge is redistributed between the third wiring 3003 and the capacitor 100. As a result, the potential of the third wiring 3003 changes. The amount of change in the potential of the third wiring 3003 varies depending on the potential of the one electrode of the capacitor 100 (or the charge accumulated in the capacitor 100).

For example, the potential of the third wiring 3003 after the charge redistribution is $(C_B \times V_{B0} + C \times V)/(C_B + C)$, where V is the potential of the one electrode of the capacitor 100, C is the capacitance of the capacitor 100, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 100 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

When including a transistor using an oxide semiconductor and having a small off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the semiconductor device of one embodiment of the present invention does not have a limit on the number of times data can be rewritten, and the reliability thereof is drastically improved. Furthermore, data is written depending on the state of the transistor (on or off), whereby high-speed operation can be easily achieved.

<Structure 1 of Semiconductor Device>

The semiconductor device of one embodiment of the present invention includes the transistor 300, the transistor 200, and the capacitor 100 as shown in FIG. 36. The transistor 200 is provided over the transistor 300, and the capacitor 100 is provided over the transistor 300 and the transistor 200.

The transistor 300 is provided on a substrate 311 and includes a conductor 316, an insulator 314, a semiconductor region 312 that is part of the substrate 311, and low-resistance regions 318a and 318b functioning as a source region and a drain region.

The transistor 300 may be a p-channel transistor or an n-channel transistor.

It is preferable that a region of the semiconductor region 312 where a channel is formed, a region in the vicinity thereof, the low-resistance regions 318a and 318b functioning as a source region and a drain region, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs or the like.

The low-resistance regions 318a and 318b contain an element which imparts n-type conductivity, such as arsenic or phosphorus, or an element which imparts p-type conductivity, such as boron, in addition to a semiconductor material used for the semiconductor region 312.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

An insulator 320, an insulator 322, an insulator 324, and an insulator 326 are stacked sequentially and cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 functions as a planarization film for eliminating a level difference caused by the transistor 300 or the like underlying the insulator 322. A top surface of the insulator 322 may be planarized by planarization treatment using a CMP method or the like to increase the level of planarity.

The insulator 324 is preferably formed using, for example, a film having a barrier property that prevents hydrogen or impurities from diffusing from the substrate 311, the transistor 300, or the like into a region where the transistor 200 is formed.

As an example of the film having a barrier property against hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by TDS, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$ in TDS in the range of 50° C. to 500° C., for example.

Note that the permittivity of the insulator 326 is preferably lower than that of the insulator 324. For example, the relative permittivity of the insulator 326 is preferably lower than 4, more preferably lower than 3. For example, the relative permittivity of the insulator 326 is preferably 0.7 times or less that of the insulator 324, further preferably 0.6 times or less that of the insulator 324. In the case where a material with a low permittivity is used as an interlayer film, the parasitic capacitance between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where part of a conductor functions as a wiring and part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 36, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to those used for forming the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. In such a structure, the transistor 300 and the transistor 200 can be separated by a barrier layer, so that diffusion of hydrogen from the transistor 300 to the transistor 200 can be prevented.

Note that as the conductor having a barrier property against hydrogen, tantalum nitride may be used, for example. By stacking tantalum nitride and tungsten, which has high conductivity, diffusion of hydrogen from the transistor 300 can be prevented while the conductivity of a wiring is ensured. In this case, a tantalum nitride layer having a barrier property against hydrogen is preferably in contact with the insulator 350 having a barrier property against hydrogen.

An insulator 358, an insulator 210, the insulator 212, and the insulator 216 are stacked sequentially over the insulator 354. A material having a barrier property against oxygen and hydrogen is preferably used for one or all of the insulator 358, the insulator 210, the insulator 212, and the insulator 216.

The insulator 358 and the insulator 212 are preferably formed using, for example, a film having a barrier property that prevents hydrogen and impurities from diffusing from the substrate 311, a region where the transistor 300 is formed, or the like into a region where the transistor 200 is formed. Therefore, the insulators 358 and 212 can be formed using a material similar to that used for forming the insulator 324.

As an example of the film having a barrier property against hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

For example, the insulators 210 and 216 can be formed using a material similar to that used for forming the insulator 320. For example, a silicon oxide film, a silicon oxynitride film, or the like can be used as the insulator 216.

A conductor 218, a conductor forming the transistor 200, and the like are embedded in the insulators 358, 210, 212, and 216. Note that the conductor 218 functions as a plug or a wiring that is electrically connected to the capacitor 100 or the transistor 300. The conductor 218 can be formed using a material similar to those used for forming the conductor 328 and the conductor 330.

In particular, part of the conductor 218 which is in contact with the insulators 358 and 212 is preferably a conductor with a barrier property against oxygen, hydrogen, and water. When the conductor 205c with a barrier property against oxygen, hydrogen, and water is provided to cover the conductor 218, the transistors 300 and 200 can be completely separated by the layer with a barrier property against oxygen, hydrogen, and water. As a result, diffusion of hydrogen from the transistor 300 to the transistor 200 can be prevented.

The insulator 224 is provided over the conductor 205c and the insulator 216. The insulator 224 functions as a gate insulator of the transistor 200. Although the insulator 224 contains excess oxygen in some cases, the excess oxygen is blocked by the conductor 205c with a barrier property against oxygen, hydrogen, and water; therefore, the excess oxygen can be prevented from diffusing to the conductor 218, so that oxidation of the conductor 218 can be prevented.

The transistor 200 is provided over the insulator 216. Note that, for example, the structure of the transistor described in the above embodiment can be used as the structure of the transistor 200. Note that the transistor 200 in FIG. 36 is just an example and is not limited to the structure shown therein; an appropriate transistor may be used in accordance with a circuit configuration or a driving method.

The insulator 272 and the insulator 280 are provided over the transistor 200. The insulator 280 preferably includes oxide containing oxygen in excess of that in the stoichiometric composition. That is, in the insulator 280, a region containing oxygen in excess of that in the stoichiometric composition (hereinafter also referred to as an oxygen-excess region) is preferably formed. In particular, in the case where an oxide semiconductor is used in the transistor 200, when an insulator including an oxygen-excess region is provided in an interlayer film or the like in the vicinity of the transistor 200, oxygen vacancies in the transistor 200 are reduced, whereby the reliability can be improved.

As the insulator including the oxygen-excess region, specifically, an oxide material that releases part of oxygen by heating is preferably used. Oxide that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS. Note that the temperature of the film surface in the TDS is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 covering the transistor 200 may function as a planarization film that covers a roughness thereunder. The insulator 282 and the insulator 284 are stacked sequentially over the insulator 280.

A material having a barrier property against oxygen or hydrogen is preferably used for the insulator 282. Thus, the insulator 282 can be formed using a material similar to that used for forming the insulator 212. The insulator 284 can be formed using an insulator similar to that used for forming the insulator 212.

For example, when the conductor 285 is formed to have a layered structure, the conductor 285 preferably includes a conductor with high oxidation resistance. In particular, a conductor with high oxidation resistance is preferably provided in a region in contact with the insulator 280 including the oxygen-excess region. Such a structure can prevent the conductor 285 from absorbing excess oxygen from the insulator 280. Furthermore, the conductor 285 preferably includes a conductor having a barrier property against hydrogen. In particular, a conductor having a barrier property against an impurity such as hydrogen is provided in a region in contact with the insulator 280 including the oxygen-excess region, whereby diffusion of the impurity of the conductor 285, diffusion of part of the conductor 285, and diffusion of an impurity from the outside through the conductor 285 can be prevented.

An conductor 116 is provided over a conductor 112 with insulators 130, 132, and 134 positioned therebetween. Note that the conductor 116 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 116 is formed concurrently with another component such as a conductor, Cu (copper), Al (aluminum), or the like which is a low-resistance metal material may be used.

As illustrated in FIG. 36, the conductor 116 is provided to cover the top and side surfaces of the conductor 112 with the insulators 130, 132, and 134 positioned therebetween. That is, a capacitance is formed also on the side surface of the conductor 112, so that a capacitance per projected area of a capacitor can be increased. Thus, the semiconductor device can be reduced in area, highly integrated, and miniaturized.

An insulator 150 is provided over the conductor 116 and the insulator 134. The insulator 150 can be formed using a material similar to that used for forming the insulator 320. The insulator 150 covering the capacitor 100 may function as a planarization film that covers a roughness thereunder.

Note that in this structure, when the conductor 112 and the conductor 287 are formed, it is preferable to remove the top surface of the insulator 284 so that the depth of the removed part is greater than the total thickness of the insulators 130, 132, and 134. For example, by performing over-etching treatment, part of the insulator 284 can be removed concurrently. Furthermore, by forming the conductor 112 or the like by over-etching treatment, etching can be performed without leaving an etching residue.

By changing the kind of etching gas in the etching treatment, part of the insulator 284 can be removed efficiently.

After the conductor 112 and the conductor 287 are formed, part of the insulator 284 may be removed using the conductor 112 as a hard mask, for example.

After the conductor 112 is formed, a surface of the conductor 112 may be subjected to cleaning treatment. By the cleaning treatment, an etching residue or the like can be removed.

In this structure, the transistor 200 and the insulator 216 including the oxygen-excess region can be positioned between the insulator 212 and the insulator 272. The insulators 212 and 272 have a barrier property that prevents diffusion of oxygen or impurities such as hydrogen and water.

Thus, oxygen released from the insulator 216 and the transistor 200 can be prevented from diffusing into the capacitor 100 or the layer where the transistor 300 is formed. Furthermore, impurities such as hydrogen and water can be prevented from diffusing from the layer over the insulator 272 and the layer under the insulator 212 into the transistor 200.

That is, oxygen can be efficiently supplied from the oxygen-excess region of the insulator 216 to the oxide where the channel is formed in the transistor 200, so that oxygen vacancies can be reduced. Moreover, oxygen vacancies can be prevented from being formed by impurities in the oxide where the channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

In such a structure, the transistor 200 and the insulator 280 can be enclosed tightly. Thus, the oxide where the channel is formed in the transistor 200 can be an oxide semiconductor with a low density of defect states and stable characteristics. That is, a change in electrical characteristics of the transistor 200 can be prevented and the reliability can be improved.

Modification Example

FIG. 37 illustrates a modification example of this embodiment. FIG. 37 is different from FIG. 36 in the structure of the transistor 300.

In the transistor 300 illustrated in FIG. 37, the semiconductor region 312 (part of the substrate 311) in which the channel is formed has a protruding portion. Furthermore, the conductor 316 is provided to cover the top and side surfaces of the semiconductor region 312 with the insulator 314 positioned therebetween. Note that the conductor 316 may be formed using a material for adjusting the work function. The transistor 300 having such a structure is also referred to as a FIN transistor because the protruding portion of the semiconductor substrate is utilized. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing an SOI substrate.

Note that the transistor 300 shown in FIG. 37 is just an example and is not limited to the structure shown therein; an appropriate transistor may be used in accordance with a circuit configuration or a driving method. In the case of using the circuit configuration shown in FIG. 35B, the transistor 300 may be omitted.

The above is the description of the structure example With the use of the structure, a change in electrical characteristics can be prevented and reliability can be improved in a semiconductor device including a transistor including an oxide semiconductor. A transistor including an oxide semiconductor with large on-state current can be provided. A transistor including an oxide semiconductor with small off-state current can be provided. A semiconductor device with low power consumption can be provided.

Embodiment 4

In this embodiment, an example of a circuit of a semiconductor device including the transistor or the like of one embodiment of the present invention will be described.
<Circuit>

Examples of a circuit of a semiconductor device including the transistor or the like of one embodiment of the present invention will be described with reference to FIG. 38 and FIG. 39.
<Memory Device 1>

Figure 38:
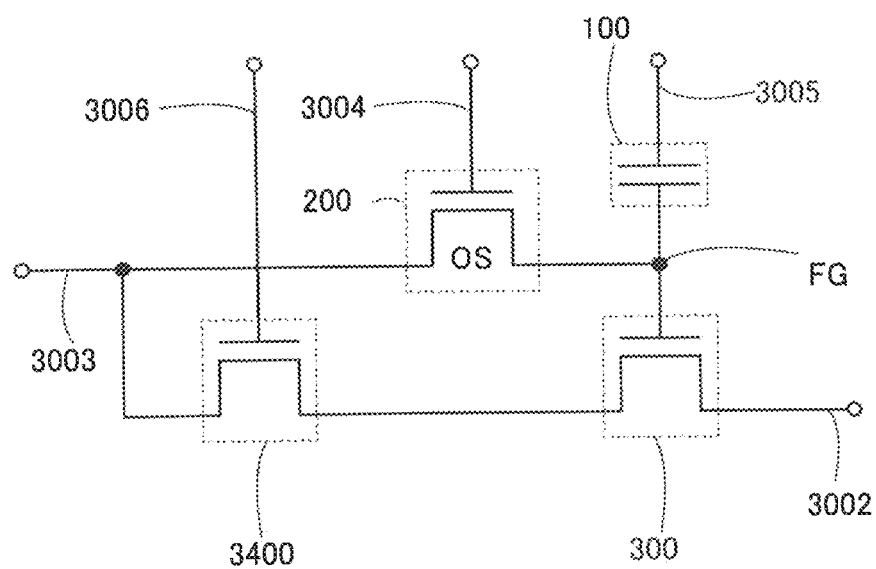
FIG. 38 is a circuit diagram illustrating a memory device of one embodiment of the present invention.

The semiconductor device in FIG. 38 is different from the semiconductor device described in the above embodiment in that a transistor 3400 and a sixth wiring 3006 are included. Also in this case, data can be written and retained in a manner similar to that of the semiconductor device described in the above embodiment. A transistor similar to the transistor 300 described above can be used as the transistor 3400.

The sixth wiring 3006 is electrically connected to a gate of the transistor 3400, one of a source and a drain of the transistor 3400 is electrically connected to one of a source and a drain of the transistor 300, and the other of the source and the drain of the transistor 3400 is electrically connected to the third wiring 3003.
<Memory Device 2>

A modification example of the semiconductor device (memory device) is described with reference to a circuit diagram in FIG. 39.

Figure 39:
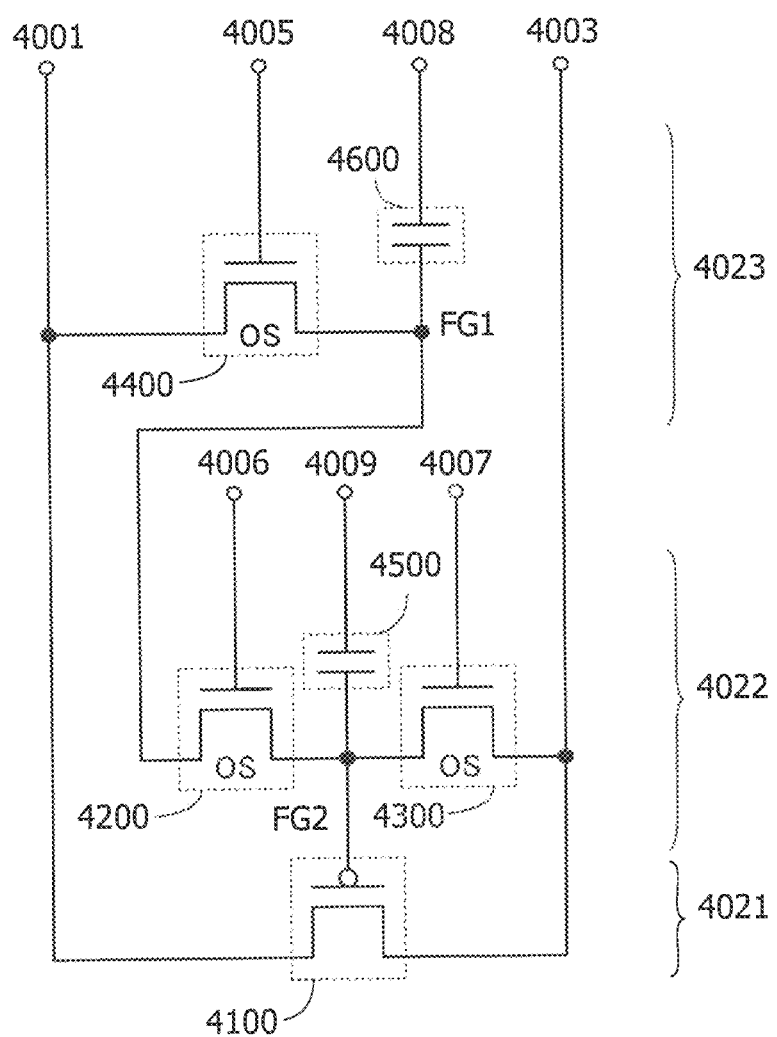
FIG. 39 is a circuit diagram illustrating a memory device of one embodiment of the present invention.

The semiconductor device illustrated in FIG. 39 includes transistors 4100, 4200, 4300, and 4400 and capacitors 4500 and 4600. Here, a transistor similar to the above-described transistor 300 can be used as the transistor 4100, and transistors similar to the above-described transistor 200 can be used as the transistors 4200 to 4400. Capacitors similar to the above-described capacitor 100 can be used as the capacitors 4500 and 4600. Although not illustrated in FIG. 39, a plurality of the semiconductor devices in FIG. 39 are provided in a matrix. The semiconductor device in FIG. 39 can control writing and reading of a data voltage in accordance with a signal or a potential supplied to a wiring 4001, a wiring 4003, and wirings 4005 to 4009.

One of a source and a drain of the transistor 4100 is connected to the wiring 4003. The other of the source and the drain of the transistor 4100 is connected to the wiring 4001. Although the transistor 4100 is a p-channel transistor in FIG. 39, the transistor 4100 may be an n-channel transistor.

The semiconductor device in FIG. 39 includes two data retention portions. For example, a first data retention portion retains a charge between one of a source and a drain of the transistor 4400, one electrode of the capacitor 4600, and one of a source and a drain of the transistor 4200 which are connected to a node FG1. A second data retention portion retains a charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining a charge. Note that, as each of the transistors 4200, 4300, and 4400, it is preferable to use a transistor having a small current that flows between a source and a drain in an off state (small off-state current). As an example of the transistor with a small off-state current, a transistor including an oxide semiconductor in its channel formation region (an OS transistor) is preferably used. Some advantages of an OS transistor are that it has a small off-state current and can be manufactured to overlap with a transistor including silicon, for example. Although the transistors 4200, 4300, and 4400 are n-channel transistors in FIG. 39, the transistors 4200, 4300, and 4400 may be p-channel transistors.

The transistor 4200 and the transistor 4300 are preferably provided in a layer different from the layer where the transistor 4400 is provided even when the transistor 4200, the transistor 4300, and the transistor 4400 are transistors including oxide semiconductors. In other words, in the semiconductor device in FIG. 39, the transistor 4100, the transistor 4200 and the transistor 4300, and the transistor 4400 are preferably stacked. That is, by integrating the transistors, the circuit area can be reduced, so that the size of the semiconductor device can be reduced.

Next, operation of writing data to the semiconductor device illustrated in FIG. 39 is described.

First, operation of writing a data voltage to the data retention portion connected to the node FG1 (hereinafter referred to as writing operation 1) is described. In the following description, the data voltage written to the data retention portion connected to the node FG1 is referred to as $V_{D1}$, and the threshold voltage of the transistor 4100 is referred to as $V_{th}$.

In the writing operation 1, the wiring 4003 is set at $V_{D1}$, and after the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. By the current flow, the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between the gate and the source of the transistor 4100 reaches the threshold voltage $V_{th}$ of the transistor 4100, the current flowing through the transistor 4100 is decreased. Accordingly, the increase in the potentials of the wiring 4001 and the nodes FG1 and FG2 is stopped, so that the potentials of the nodes FG1 and FG2 are fixed at "$V_{D1}-V_{th}$," which is lower than $V_{D1}$ by $V_{th}$.

In other words, when a current flows through the transistor 4100, $V_{D1}$ supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing a data voltage to the data retention portion connected to the node FG2 (hereinafter referred to as writing operation 2) is described. In the following description, the data voltage written to the data retention portion connected to the node FG2 is referred to as $V_{D2}$.

In the writing operation 2, the wiring 4001 is set at $V_{D2}$, and after the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is also decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, the increase in the potentials of the wiring 4003 and the node FG2 is stopped, so that the potential of the node FG2 is fixed at "$V_{D2}-V_{th}$," which is lower than $V_{D2}$ by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 39, after data voltages are written to the plurality of data retention portions, the wiring 4009 is set at the high level, so that the potentials of the nodes FG1 and FG2 are increased. Then, the transistors are turned off to stop the movement of charge; thus, the written data voltages are retained.

By the above-described writing operations of the data voltages to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multi-level data. Therefore, in the case where the data retention portions each retain 4-bit data, 16-level "$V_{D1}-V_{th}$" and 16-level "$V_{D2}-V_{th}$" can be obtained.

Next, operation of reading data from the semiconductor device illustrated in FIG. 39 is described.

First, operation of reading a data voltage from the data retention portion connected to the node FG2 (hereinafter referred to as reading operation 1) is described.

In the reading operation 1, the wiring 4003 which is brought into an electrically floating state after precharge is discharged. The wirings 4005 to 4008 are set at the low level. When the wiring 4009 is set at the low level, the potential of the node FG2 which is electrically floating is set at "$V_{D2}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$," which is higher than the potential "$V_{D2}-V_{th}$" of the node FG2 by $V_{th}$. The potential of the wiring 4003 corresponds to the data voltage of the data retention portion connected to the node FG2. The read analog data voltage is subjected to A/D conversion, so that data of the data retention portion connected to the node FG2 is obtained.

In other words, the wiring 4003 after precharge is brought into a floating state and the potential of the wiring 4009 is changed from the high level to the low level, whereby a current flows through the transistor 4100. When the current flows, the potential of the wiring 4003 which is in a floating state is decreased to be "$V_{D2}$". In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the charges retained in the node FG1 are distributed between the node FG1 and the node FG2, so that the data voltage in the data retention portion connected to the node FG1 is transferred to the data retention portion connected to the node FG2. The wirings 4001 and 4003 are set at the low level. The wiring 4006 is set at the high level. The wiring 4005 and the wirings 4007 to 4009 are set at the low level. When the transistor 4200 is turned on, the charges in the node FG1 are distributed between the node FG1 and the node FG2.

Here, the potential after the charge distribution is decreased from the written potential "$V_{D1}-V_{th}$". Thus, the capacitance of the capacitor 4600 is preferably larger than the capacitance of the capacitor 4500. Alternatively, the potential "$V_{D1}-V_{th}$" written to the node FG1 is preferably higher than the potential "$V_{D2}-V_{th}$" corresponding to the same data. By changing the ratio of the capacitances and setting the written potential higher in advance as described above, a decrease in potential after the charge distribution can be suppressed. The change in potential due to the charge distribution is described later.

Next, operation of reading a data voltage from the data retention portion connected to the node FG1 (hereinafter referred to as reading operation 2) is described.

In the reading operation 2, the wiring 4003 which is brought into an electrically floating state after precharge is discharged. The wirings 4005 to 4008 are set at the low level. The wiring 4009 is set at the high level at the time of precharge and then set at the low level. When the wiring 4009 is set at the low level, the node FG2 which is electrically floating is set at the potential "$V_{D1}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$", which is higher than the potential "$V_{D1}-V_{th}$" of the node FG2 by $V_{th}$. The potential of the wiring 4003 corresponds to the data voltage of the data retention portion connected to the node FG1. The read analog data voltage is subjected to A/D conversion, so that data of the data retention portion connected to the node FG1 is obtained. The above is the operation of reading the data voltage from the data retention portion connected to the node FG1.

In other words, the wiring 4003 after precharge is brought into a floating state and the potential of the wiring 4009 is changed from the high level to the low level, whereby a current flows through the transistor 4100. When the current flows, the potential of the wiring 4003 which is in a floating state is decreased to be "$V_{D1}$". In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operations of the data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although first to third layers 4021 to 4023 are provided in the structure illustrated in FIG. 39, the storage capacity can be increased by adding layers without increasing the area of the semiconductor device.

Note that the read potential can be read as a voltage higher than the written data voltage by $V_{th}$. Therefore, $V_{th}$ of "$V_{D1}-V_{th}$" or $V_{th}$ of "$V_{D2}-V_{th}$" written in the writing operation can be canceled out in reading. As a result, the storage capacity per memory cell can be improved and read data can be close to accurate data; thus, the data reliability becomes excellent.

The structure described in this embodiment can be used in appropriate combination with the structure described in any of the other embodiments.

Embodiment 5

In this embodiment, circuit configuration examples to which the OS transistors described in the above embodiment can be used are described with reference to FIGS. 40A to 40C, FIGS. 41A to 41C, FIGS. 42A and 42B, and FIGS. 43A and 43B.

Figure 40A:
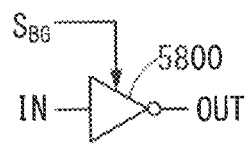
FIGS. 40A to 40C are circuit diagrams and a timing chart illustrating one embodiment of the present invention.

FIG. 40A is a circuit diagram of an inverter. An inverter 5800 outputs a signal whose logic is inverted from the logic of a signal supplied to an input terminal IN to an output terminal OUT. The inverter 5800 includes a plurality of OS transistors. A signal $S_{BG}$ can switch electrical characteristics of the OS transistors.

Figure 40B:
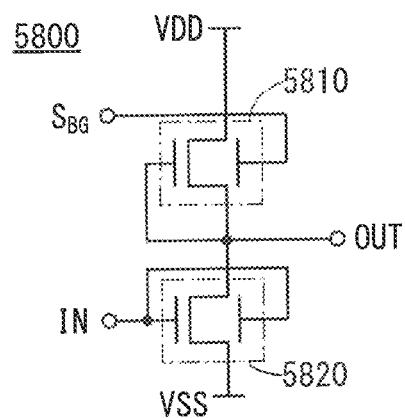

FIG. 40B illustrates an example of the inverter 5800. The inverter 5800 includes an OS transistor 5810 and an OS transistor 5820. The inverter 5800 can be formed using only n-channel transistors; thus, the inverter 5800 can be formed at lower cost than an inverter formed using a complementary metal oxide semiconductor (i.e., a CMOS inverter).

Here, the transistor 200 of the present invention can be used as the OS transistor 5810. In addition, the transistor 400 can be used as the OS transistor 5820. Two kinds of transistors (the transistors 200 and 400 in the present invention) having different characteristics can be separately formed at the same time; thus, a semiconductor device with high productivity can be provided.

Note that the inverter 5800 including the OS transistors can be provided over a CMOS circuit including Si transistors. Since the inverter 5800 can be provided so as to overlap with the CMOS circuit, no additional area is required for the inverter 5800, and thus, an increase in the circuit area can be suppressed.

Each of the OS transistors 5810 and 5820 includes a first gate functioning as a front gate, a second gate functioning as a back gate, a first terminal functioning as one of a source and a drain, and a second terminal functioning as the other of the source and the drain.

The first gate of the OS transistor 5810 is connected to its second terminal. The second gate of the OS transistor 5810 is connected to a wiring that supplies the signal $S_{BG}$. The first terminal of the OS transistor 5810 is connected to a wiring that supplies a voltage VDD. The second terminal of the OS transistor 5810 is connected to the output terminal OUT.

The first gate of the OS transistor 5820 is connected to the input terminal IN. The second gate of the OS transistor 5820 is connected to the input terminal IN. The first terminal of the OS transistor 5820 is connected to the output terminal OUT. The second terminal of the OS transistor 5820 is connected to a wiring that supplies a voltage VSS.

Figure 40C:
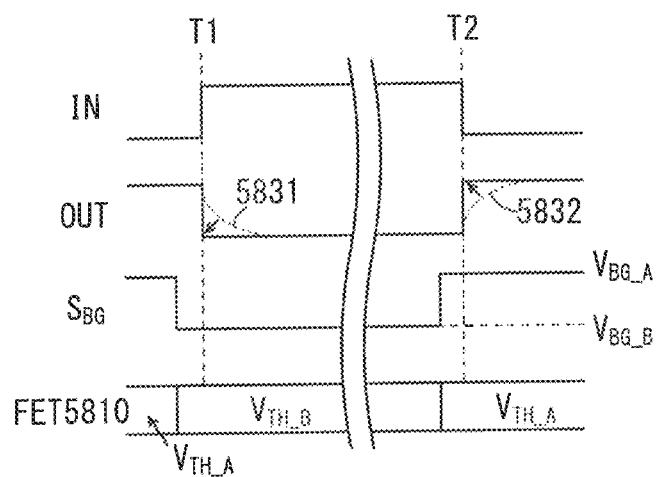

FIG. 40C is a timing chart illustrating the operation of the inverter 5800. The timing chart in FIG. 40C illustrates changes of a signal waveform of the input terminal IN, a signal waveform of the output terminal OUT, a signal waveform of the signal $S_{BG}$, and the threshold voltage of the OS transistor 5810 (FET 5810).

The signal $S_{BG}$ can be supplied to the second gate of the OS transistor 5810 to control the threshold voltage of the OS transistor 5810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 5810 can be shifted in the negative direction to be a threshold voltage $V_T$ A when the voltage $V_{BG\_A}$ is applied to the second gate. The threshold voltage of the OS transistor 5810 can be shifted in the positive direction to be a threshold voltage $V_{TH\_B}$ when the voltage $V_{BF\_B}$ is applied to the second gate.

Figure 41A:
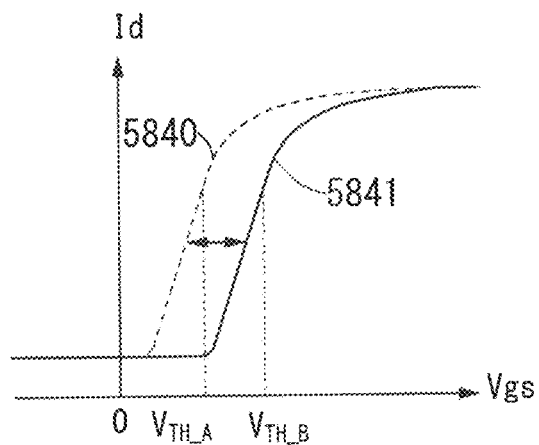
FIGS. 41A to 41C are a graph and circuit diagrams illustrating one embodiment of the present invention.

To visualize the above description, FIG. 41A shows a $V_g$–$I_d$ curve, which is one of indicators of the transistor's electrical characteristics.

When a high voltage such as the voltage $V_{BF\_A}$ is applied to the second gate, the electrical characteristics of the OS transistor 5810 can be shifted to match a curve shown by a dashed line 5840 in FIG. 41A. When a low voltage such as the voltage $V_{BG\_B}$ is applied to the second gate, the electrical characteristics of the OS transistor 5810 can be shifted to match a curve shown by a solid line 5841 in FIG. 41A. As shown in FIG. 41A, switching the signal $S_{BG}$ between the voltage $V_{BG\_A}$ and the voltage $V_{BG\_B}$ enables the threshold voltage of the OS transistor 5810 to be shifted in the negative direction or the positive direction.

Figure 41B:
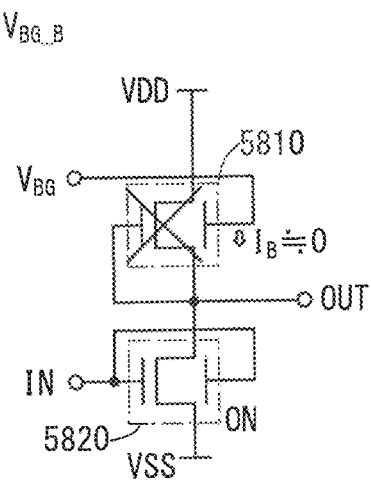

The shift of the threshold voltage in the positive direction to the threshold voltage $V_{TH\_B}$ can make a current less likely to flow in the OS transistor 5810. FIG. 41B visualizes the state. As illustrated in FIG. 41B, a current $I_B$ that flows in the OS transistor 5810 can be extremely small. Thus, when a signal supplied to the input terminal IN is at a high level and the OS transistor 5820 is on (ON), the voltage of the output terminal OUT can be sharply decreased.

Since a state in which a current is less likely to flow in the OS transistor 5810 as illustrated in FIG. 41B can be obtained, a signal waveform 5831 of the output terminal in the timing chart in FIG. 40C can be made steep. Shoot-through current between the wiring that supplies the voltage VDD and the wiring that supplies the voltage VSS can be small, leading to low-power operation.

Figure 41C:
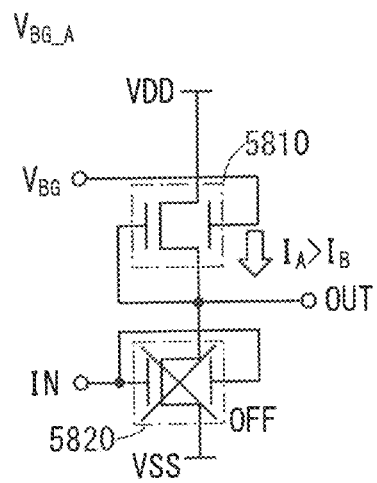

The shift of the threshold voltage in the negative direction to the threshold voltage $V_{TH\_A}$ can make a current flow easily in the OS transistor 5810. FIG. 41C visualizes the state. As illustrated in FIG. 41C, a current $I_A$ flowing at this time can be larger than at least the current $I_B$. Thus, when a signal supplied to the input terminal IN is at a low level and the OS transistor 5820 is off (OFF), the voltage of the output terminal OUT can be increased sharply.

Since a state in which a current is likely to flow in the OS transistor 5810 as illustrated in FIG. 41C can be obtained, a signal waveform 5832 of the output terminal in the timing chart in FIG. 40C can be made steep.

Note that the threshold voltage of the OS transistor 5810 is preferably controlled by the signal $S_{BG}$ before the state of the OS transistor 5820 is switched, i.e., before time T1 or time T2. For example, as in FIG. 40C, it is preferable that the threshold voltage of the OS transistor 5810 be switched from the threshold voltage $V_{TH\_A}$ to the threshold voltage $V_{TH\_B}$ before time T1 at which the level of the signal supplied to the input terminal IN is switched to the high level. Moreover, as in FIG. 40C, it is preferable that the threshold voltage of the OS transistor 5810 be switched from the threshold voltage $V_{TH\_B}$ to the threshold voltage $V_{TH\_A}$ before time T2 at which the level of the signal supplied to the input terminal IN is switched to the low level.

Figure 42A:
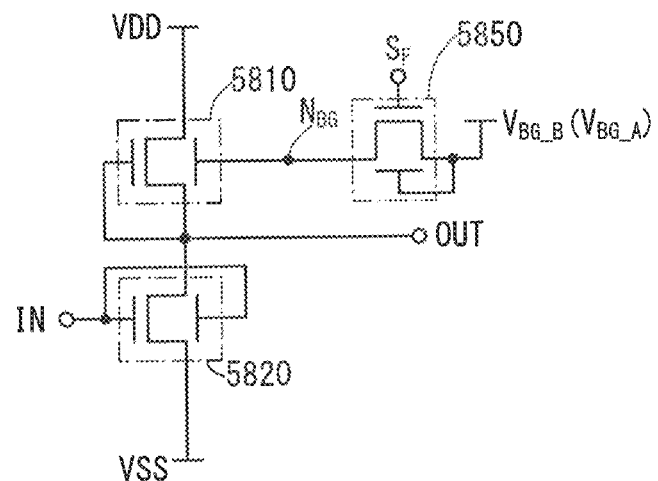
FIGS. 42A and 42B are a circuit diagram and a timing chart illustrating one embodiment of the present invention.

Although the timing chart in FIG. 40C illustrates the configuration in which the level of the signal $S_{BG}$ is switched in accordance with the signal supplied to the input terminal IN, a different configuration may be employed in which voltage for controlling the threshold voltage is held by the second gate of the OS transistor 5810 in a floating state, for example. FIG. 42A illustrates an example of such a circuit configuration.

The circuit configuration in FIG. 42A is the same as that in FIG. 40B, except that an OS transistor 5850 is added. Here, the transistor 400 of the present invention can be used as the OS transistor 5850. A first terminal of the OS transistor 5850 is connected to the second gate of the OS transistor 5810. A second terminal of the OS transistor 5850 is connected to a wiring that supplies the voltage $V_{BG\_B}$ (or the voltage $V_{BG\_A}$). A first gate of the OS transistor 5850 is connected to a wiring that supplies a signal $S_F$. A second gate of the OS transistor 5850 is connected to the wiring that supplies the voltage $V_{BG\_B}$ (or the voltage $V_{BG\_A}$).

Figure 42B:
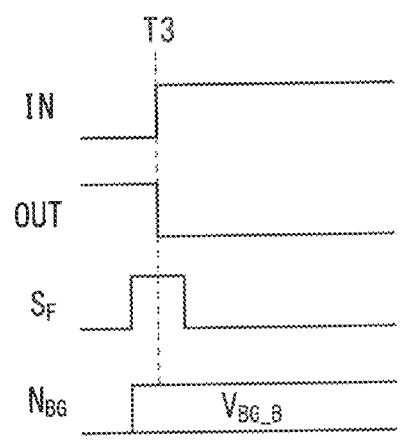

The operation with the circuit configuration in FIG. 42A is described with reference to a timing chart in FIG. 42B.

The voltage for controlling the threshold voltage of the OS transistor 5810 is supplied to the second gate of the OS transistor 5810 before time T3 at which the level of the signal supplied to the input terminal IN is switched to a high level. The signal $S_F$ is set to a high level and the OS transistor 5850 is turned on, so that the voltage $V_{BG\_B}$ for controlling the threshold voltage is supplied to a node $N_{BG}$.

The OS transistor 5850 is turned off after the voltage of the node $N_{BG}$ becomes $V_{BG\_B}$. Since the off-state current of the OS transistor 5850 is extremely small, the voltage $V_{BG\_B}$ held by the node $N_{BG}$ can be retained while the OS transistor 5850 remains off and the node $N_{BG}$ is in a state that is very close to a floating state. Therefore, the number of times the voltage $V_{BG\_B}$ is supplied to the second gate of the OS transistor 5850 can be reduced and accordingly, the power consumption for rewriting the voltage $V_{BG\_B}$ can be reduced.

Figure 43A:
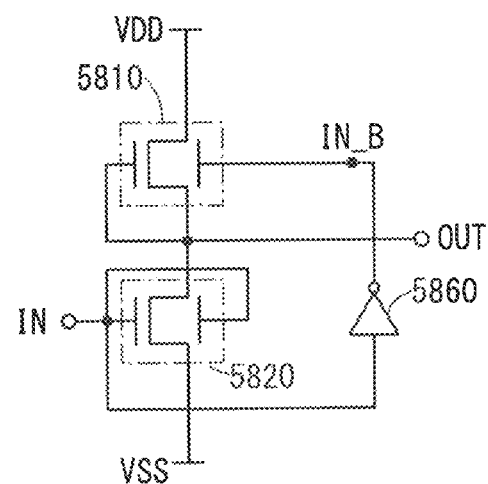
FIGS. 43A and 43B are a circuit diagram and a timing chart illustrating one embodiment of the present invention.

Although FIG. 40B and FIG. 42A each illustrate the configuration where the voltage is supplied to the second gate of the OS transistor 5810 by control from the outside, a different configuration may be employed in which voltage for controlling the threshold voltage is generated on the basis of the signal supplied to the input terminal IN and supplied to the second gate of the OS transistor 5810, for example. FIG. 43A illustrates an example of such a circuit configuration.

The circuit configuration in FIG. 43A is the same as that in FIG. 40B, except that a CMOS inverter 5860 is provided between the input terminal IN and the second gate of the OS transistor 5810. An input terminal of the CMOS inverter 5860 is connected to the input terminal IN. An output terminal of the CMOS inverter 5860 is connected to the second gate of the OS transistor 5810.

The operation with the circuit configuration in FIG. 43A is described with reference to a timing chart in FIG. 43B. The timing chart in FIG. 43B illustrates changes of a signal waveform of the input terminal IN, a signal waveform of the output terminal OUT, an output waveform IN_B of the CMOS inverter 5860, and the threshold voltage of the OS transistor 5810 (FET 5810).

The output waveform IN_B which corresponds to a signal whose logic is inverted from the logic of the signal supplied to the input terminal IN can be used as a signal that controls the threshold voltage of the OS transistor 5810. Thus, the threshold voltage of the OS transistor 5810 can be controlled as described with reference to FIGS. 40A to 40C. For example, the signal supplied to the input terminal IN is at a high level and the OS transistor 5820 is turned on at time T4 in FIG. 43B. At this time, the output waveform IN_B is at a low level. Accordingly, a current can be made less likely to flow in the OS transistor 5810; thus, the voltage of the output terminal OUT can be sharply decreased.

Figure 43B:
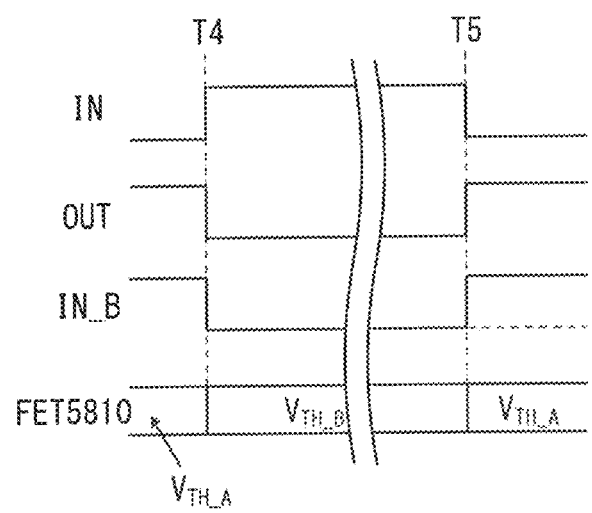

Moreover, the signal supplied to the input terminal IN is at a low level and the OS transistor 5820 is turned off at time T5 in FIG. 43B. At this time, the output waveform IN_B is at a high level. Accordingly, a current can easily flow in the OS transistor 5810; thus, the voltage of the output terminal OUT can be sharply increased.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

The structure described in this embodiment can be used in appropriate combination with the structure described in any of the other embodiments.

Embodiment 6

In this embodiment, examples of a semiconductor device which includes a plurality of circuits including the OS transistor 200 and/or the OS transistor 400 described in the above embodiments will be described with reference to FIGS. 44A to 44E, FIGS. 45A and 45B, FIGS. 46A and 46B, FIGS. 47A to 47C, FIGS. 48A and 48B, FIGS. 49A to 49C, and FIGS. 50A and 50B.

Figure 44A:
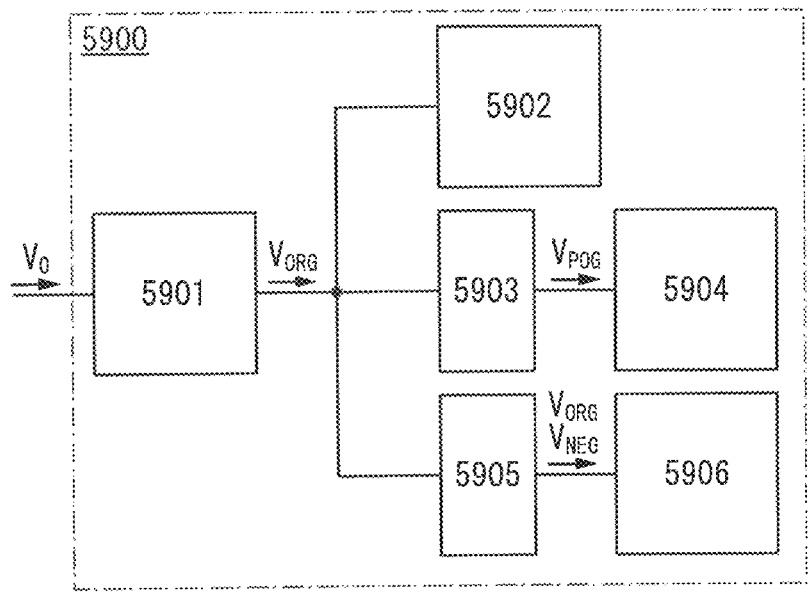
FIGS. 44A to 44E are a block diagram, circuit diagrams, and waveform diagrams illustrating one embodiment of the present invention.

FIG. 44A is a block diagram of a semiconductor device 5900. The semiconductor device 5900 includes a power supply circuit 5901, a circuit 5902, a voltage generation circuit 5903, a circuit 5904, a voltage generation circuit 5905, and a circuit 5906.

The power supply circuit 5901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 5900. The semiconductor device 5900 can generate the voltage $V_{ORG}$ on the basis of one power supply voltage supplied from the outside. Thus, the semiconductor device 5900 can operate without supply of a plurality of power supply voltages from the outside.

The circuits 5902, 5904, and 5906 operate with different power supply voltages. For example, the power supply voltage of the circuit 5902 is a voltage applied on the basis of the voltage $V_{ORG}$ and the voltage $V_{SS}$ ($V_{ORG} > V_{SS}$), the power supply voltage of the circuit 5904 is a voltage applied on the basis of a voltage $V_{POG}$ and the voltage $V_{SS}$ ($V_{POG} > V_{ORG}$), and the power supply voltages of the circuit 5906 are voltages applied on the basis of the voltage $V_{ORG}$, the voltage $V_{SS}$, and a voltage $V_{NEG}$ ($V_{ORG} > V_{SS} > V_{NEG}$). When the voltage $V_{SS}$ is set to a ground potential (GND), the kinds of voltages generated by the power supply circuit 5901 can be reduced.

The voltage generation circuit 5903 is a circuit that generates the voltage $V_{POG}$. The voltage generation circuit 5903 can generate the voltage $V_{POG}$ on the basis of the voltage $V_{ORG}$ supplied from the power supply circuit 5901. Thus, the semiconductor device 5900 including the circuit 5904 can operate on the basis of one power supply voltage supplied from the outside.

The voltage generation circuit 5905 is a circuit that generates the voltage $V_{NEG}$. The voltage generation circuit 5905 can generate the voltage $V_{NEG}$ on the basis of the voltage $V_{ORG}$ supplied from the power supply circuit 5901. Thus, the semiconductor device 5900 including the circuit 5906 can operate on the basis of one power supply voltage supplied from the outside.

Figure 44B:
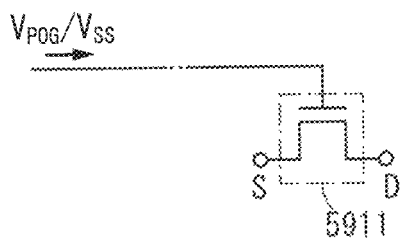
Figure 44C:
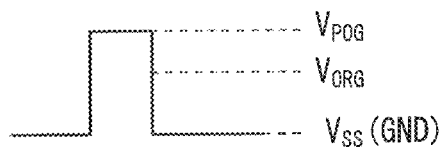

FIG. 44B shows an example of the circuit 5904 that operates with the voltage $V_{POG}$ and FIG. 44C shows an example of a waveform of a signal for operating the circuit 5904.

FIG. 44B illustrates a transistor 5911. A signal supplied to a gate of the transistor 5911 is generated on the basis of, for example, the voltage $V_{POG}$ and the voltage $V_{SS}$. The signal is generated on the basis of the voltage $V_{POG}$ to turn on the transistor 5911 and on the basis of the voltage $V_{SS}$ to turn off the transistor 5911. As shown in FIG. 44C, the voltage $V_{POG}$ is higher than the voltage $V_{ORG}$. Thus, a source (S) and a drain (D) of the transistor 5911 can be electrically connected to each other without fail. As a result, the frequency of malfunction of the circuit 5904 can be reduced.

Figure 44D:
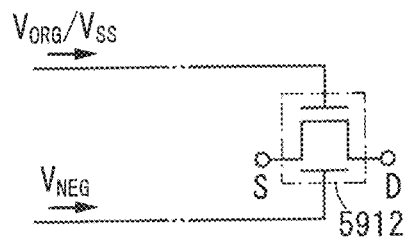
Figure 44E:
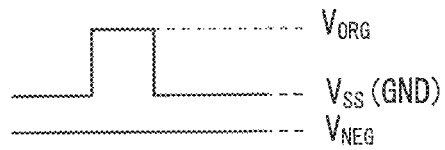

FIG. 44D shows an example of the circuit 5906 that operates with the voltage $V_{NEG}$ and FIG. 44E shows an example of a waveform of a signal for operating the circuit 5906.

FIG. 44D shows a transistor 5912 having a back gate. A signal supplied to a gate of the transistor 5912 is generated on the basis of, for example, the voltage $V_{ORG}$ and the voltage $V_{SS}$. The signal is generated on the basis of the voltage $V_{ORG}$ to turn on the transistor 5912 and on the basis of the voltage $V_{SS}$ to turn off the transistor 5912. A signal supplied to the back gate of the transistor 5912 is generated on the basis of the voltage $V_{NEG}$. As shown in FIG. 44E, the voltage $V_{NEG}$ is lower than the voltage $V_{SS}$ (GND). Thus, the threshold voltage of the transistor 5912 can be controlled to shift in the positive direction. Thus, the transistor 5912 can be turned off without fail and a current flowing between a source (S) and a drain (D) can be reduced. As a result, the frequency of malfunction of the circuit 5906 can be reduced and power consumption thereof can be reduced.

The voltage $V_{NEG}$ may be directly supplied to the back gate of the transistor 5912. Alternatively, a signal supplied to the gate of the transistor 5912 may be generated on the basis of the voltage $V_{ORG}$ and the voltage $V_{NEG}$ and the generated signal may also be supplied to the back gate of the transistor 5912.

Figure 45A:
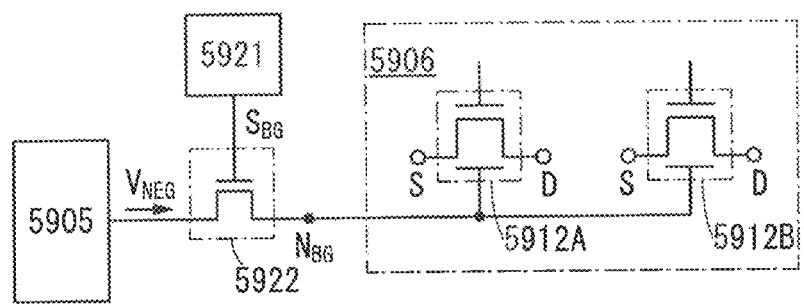
FIGS. 45A and 45B are a circuit diagram and a timing chart illustrating one embodiment of the present invention.
Figure 45B:
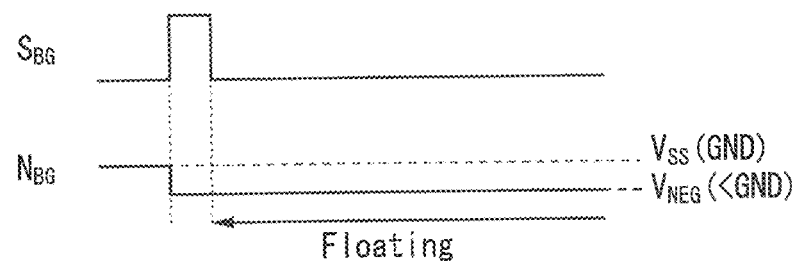

FIGS. 45A and 45B show a modification example of FIGS. 44D and 44E.

In a circuit diagram shown in FIG. 45A, a transistor 5922 whose on/off state can be controlled by a control circuit 5921 is provided between the voltage generation circuit 5905 and the circuit 5906. The transistor 5922 is an n-channel OS transistor. The control signal $S_{BG}$ output from the control circuit 5921 is a signal for controlling the on/off state of the transistor 5922. Transistors 5912A and 5912B included in the circuit 5906 are OS transistors like the transistor 5922.

A timing chart in FIG. 45B shows changes in a potential of the control signal $S_{BG}$ and a potential of the node $N_{BG}$. The potential of the node $N_{BG}$ indicates the states of potentials of back gates of the transistors 5912A and 5912B. When the control signal $S_{BG}$ is at a high level, the transistor 5922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 5922 is an OS transistor, its off-state current is small. Accordingly, even when the node $N_{BG}$ is in an electrically floating state, the voltage $V_{NEG}$ which has been supplied can be held.

Figure 46A:
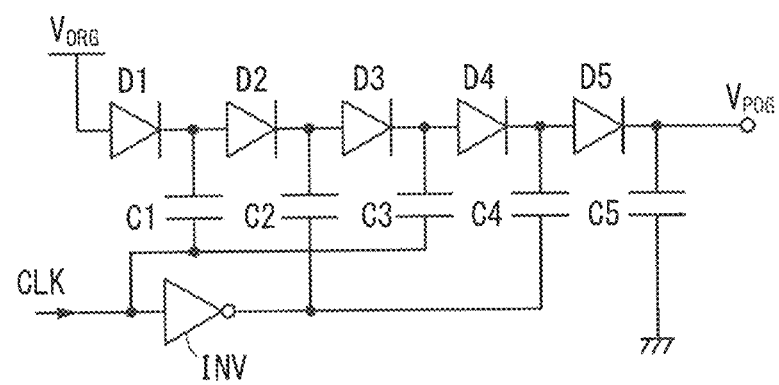
FIGS. 46A and 46B are circuit diagrams each illustrating one embodiment of the present invention.

FIG. 46A shows an example of a circuit configuration applicable to the above-described voltage generation circuit 5903. The voltage generation circuit 5903 shown in FIG. 46A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that the forward voltage of the diodes D1 to D5 is 0 V. The number of stages of the charge pump can be changed to obtain a desired voltage $V_{POG}$.

Figure 46B:
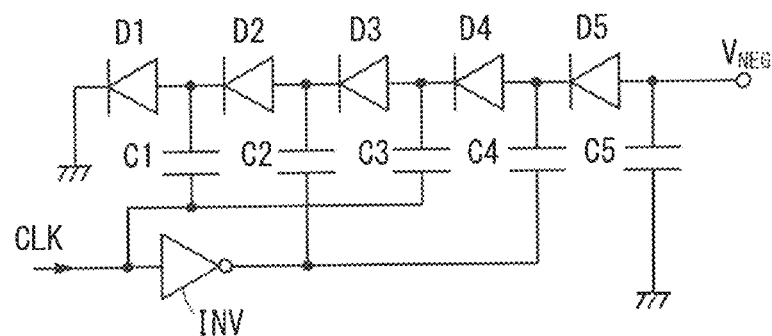

FIG. 46B shows an example of a circuit configuration applicable to the above-described voltage generation circuit 5905. The voltage generation circuit 5905 shown in FIG. 46B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$, which has been reduced from GND (i.e., the voltage $V_{SS}$) to a negative voltage having a negatively quadrupled value of the voltage $V_{ORG}$ by application of the clock signal CLK, can be obtained. Note that the forward voltage of the diodes D1 to D5 is 0 V. The number of stages of the charge pump can be changed to obtain a desired voltage $V_{NEG}$.

The circuit configuration of the voltage generation circuit 5903 is not limited to the configuration in the circuit diagram shown in FIG. 46A. Modification examples of the voltage generation circuit 5903 are shown in FIGS. 47A to 47C and FIGS. 48A and 48B.

Figure 47A:
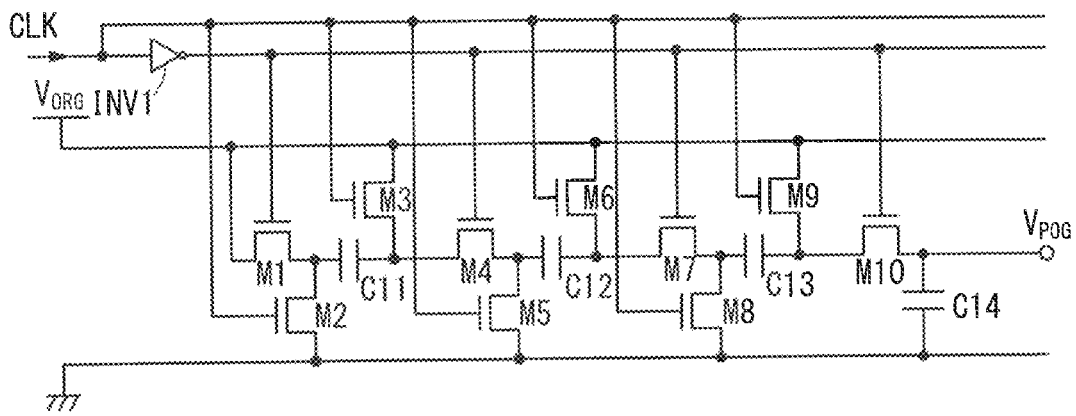
FIGS. 47A to 47C are circuit diagrams each illustrating one embodiment of the present invention.

A voltage generation circuit 5903A shown in FIG. 47A includes transistors M1 to M10, capacitors C11 to C14, and an inverter INV1. The clock signal CLK is supplied to gates of the transistors M1 to M10 directly or through the inverter INV1. By application of the clock signal CLK, the voltage $V_{POG}$, which has been increased to a positive voltage having a positively quadrupled value of the voltage $V_{ORG}$, can be obtained. The number of stages can be changed to obtain a desired voltage $V_{POG}$. In the voltage generation circuit 5903A in FIG. 47A, off-state current of each of the transistors M1 to M10 can be small when the transistors M1 to M10 are OS transistors, and leakage of charge held in the capacitors C11 to C14 can be suppressed. Accordingly, the voltage $V_{ORG}$ can be efficiently increased to the voltage $V_{POG}$.

Figure 47B:
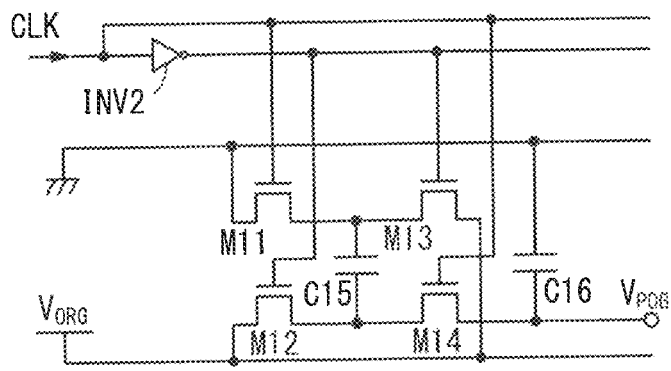

A voltage generation circuit 5903B shown in FIG. 47B includes transistors M11 to M14, capacitors C15 and C16, and an inverter INV2. The clock signal CLK is supplied to gates of the transistors M11 to M14 directly or through the inverter INV2. By application of the clock signal CLK, the voltage $V_{POG}$, which has been increased to a positive voltage having a positively doubled value of the voltage $V_{ORG}$, can be obtained. In the voltage generation circuit 5903B in FIG. 47B, off-state current of each of the transistors M11 to M14 can be small when the transistors M11 to M14 are OS transistors, and leakage of charge held in the capacitors C15 and C16 can be suppressed. Accordingly, the voltage $V_{ORG}$ can be efficiently increased to the voltage $V_{POG}$.

Figure 47C:
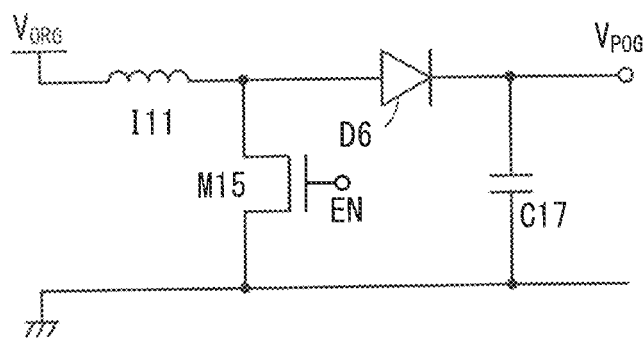

A voltage generation circuit 5903C shown in FIG. 47C includes an inductor I11, a transistor M15, a diode D6, and a capacitor C17. The on/off state of the transistor M15 is controlled by a control signal EN. Owing to the control signal EN, the voltage $V_{POG}$ increased from the voltage $V_{ORG}$ can be obtained. Since the voltage generation circuit 5903C in FIG. 47C increases the voltage using the inductor I11, the voltage can be efficiently increased.

Figure 48A:
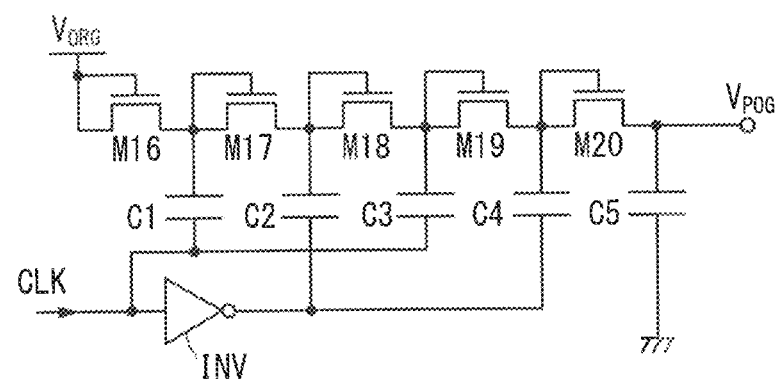
FIGS. 48A and 48B are circuit diagrams each illustrating one embodiment of the present invention.

A voltage generation circuit 5903D shown in FIG. 48A has a configuration in which the diodes D1 to D5 of the voltage generation circuit 5903 shown in FIG. 46A are replaced by diode-connected transistors M16 to M20. In the voltage generation circuit 5903D in FIG. 48A, off-state current of each of the transistors M16 to M20 can be small when the transistors M16 to M20 are OS transistors, and leakage of charge held in the capacitors C1 to C5 can be suppressed. Accordingly, the voltage $V_{ORG}$ can be efficiently increased to the voltage $V_{POG}$.

Figure 48B:
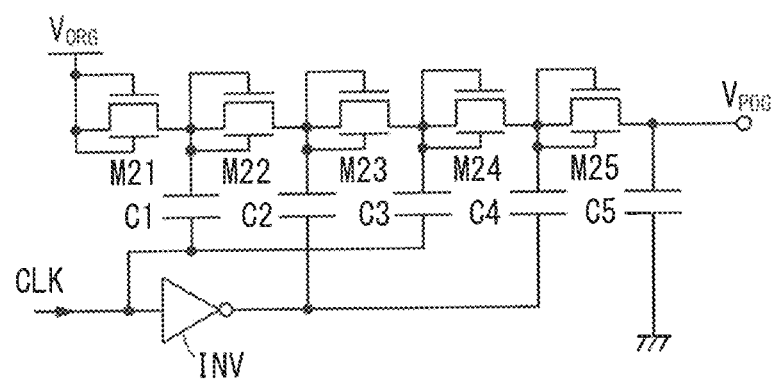
Figure 49A:
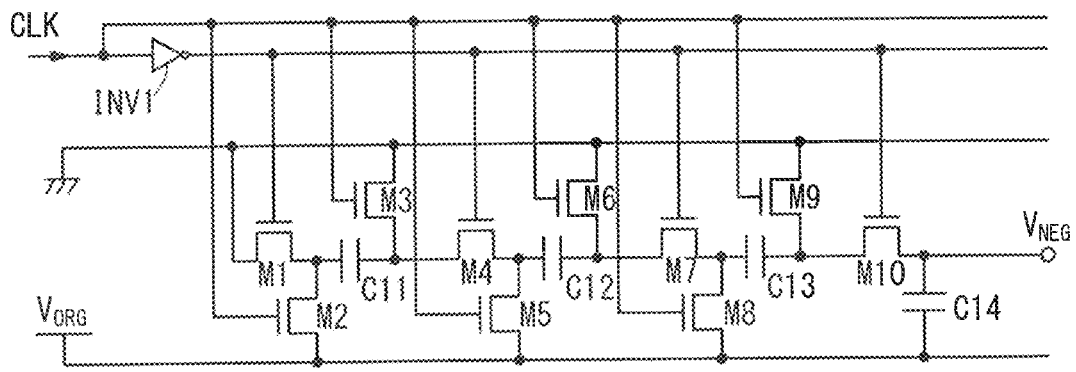
FIGS. 49A to 49C are circuit diagrams each illustrating one embodiment of the present invention.
Figure 49B:
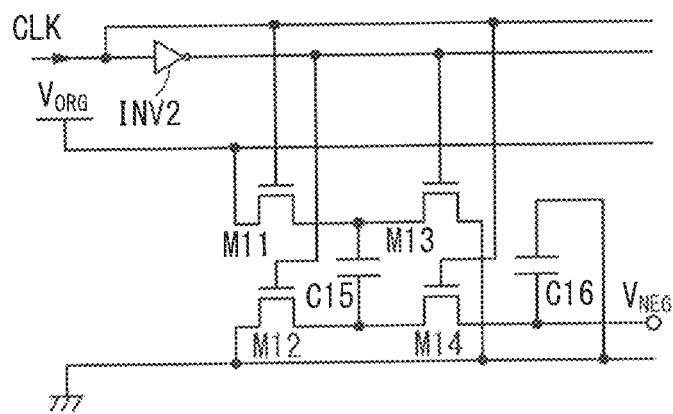
Figure 49C:
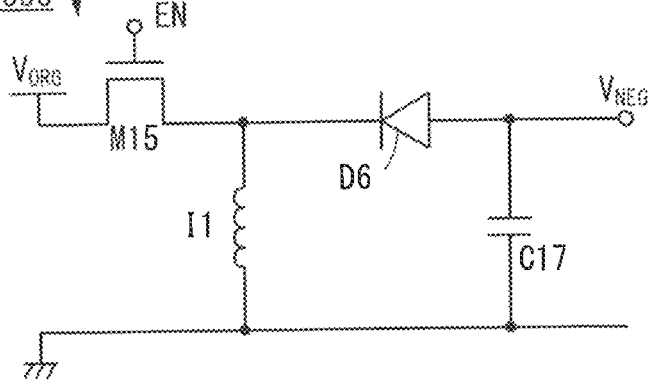
Figure 50A:
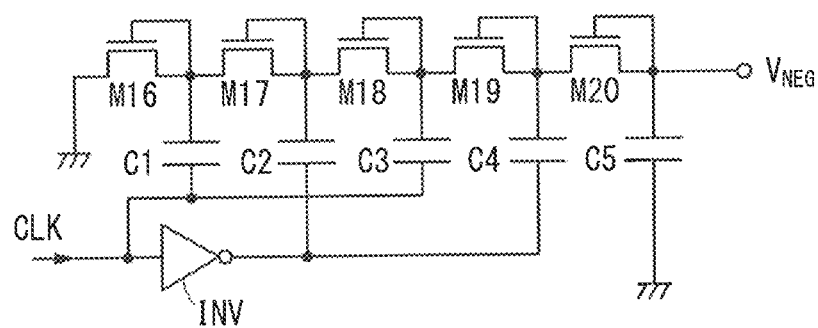
FIGS. 50A and 50B are circuit diagrams each illustrating one embodiment of the present invention.
Figure 50B:
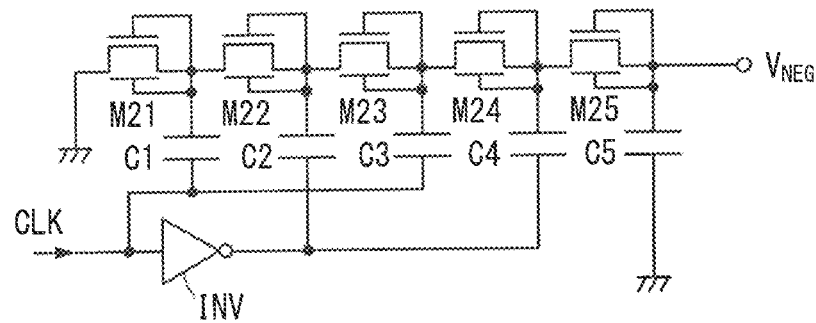

A voltage generation circuit 5903E shown in FIG. 48B has a configuration in which the transistors M16 to M20 of the voltage generation circuit 5903D shown in FIG. 48A are replaced by transistors M21 to M25 including back gates. In the voltage generation circuit 5903E shown in FIG. 48B, the back gates can be supplied with the same voltages as the respective gates; thus, the amount of current flowing in the transistor can be increased. Accordingly, the voltage $V_{ORG}$ can be efficiently increased to the voltage $V_{POG}$.

Note that the modification examples of the voltage generation circuit 5903 are also applicable to the voltage generation circuit 5905 shown in FIG. 46B. FIGS. 49A to 49C and FIGS. 50A and 50B are circuit diagrams showing configuration examples of such a case. In a voltage generation circuit 5905A shown in FIG. 49A, the voltage $V_{NEG}$, which has been reduced from the voltage $V_{SS}$ to a negative voltage having a negatively tripled value of the voltage $V_{ORG}$ by application of the clock signal CLK, can be obtained. In a voltage generation circuit 5905B shown in FIG. 49B, the voltage $V_{NEG}$, which has been reduced from the voltage $V_{SS}$ to a negative voltage having a negatively doubled value of the voltage $V_{ORG}$ by application of the clock signal CLK, can be obtained.

The voltage generation circuits 5905A to 5905E illustrated in FIGS. 49A to 49C and FIGS. 50A and 50B have configurations formed by changing the voltages applied to the wirings or the arrangement of the elements of the voltage generation circuits 5903A to 5903E illustrated in FIGS. 47A to 47C and FIGS. 48A and 48B. Similarly to the voltage generation circuits 5903A to 5903E, the voltage generation circuits 5905A to 5905E shown in FIGS. 49A to 49C and FIGS. 50A and 50B can perform efficient voltage reduction from the voltage $V_{SS}$ to the voltage $V_{NEG}$.

As described above, in any of the configurations of this embodiment, voltage required for circuits included in the semiconductor device can be internally generated. Thus, in the semiconductor device, the number of kinds of power supply voltages supplied from the outside can be reduced.

The structure described in this embodiment can be used in appropriate combination with the structure described in any of the other embodiments.

Embodiment 7

In this embodiment, examples of CPUs including semiconductor devices such as the transistor of one embodiment of the present invention and the above-described memory device will be described.

<Configuration of CPU>

Figure 51:
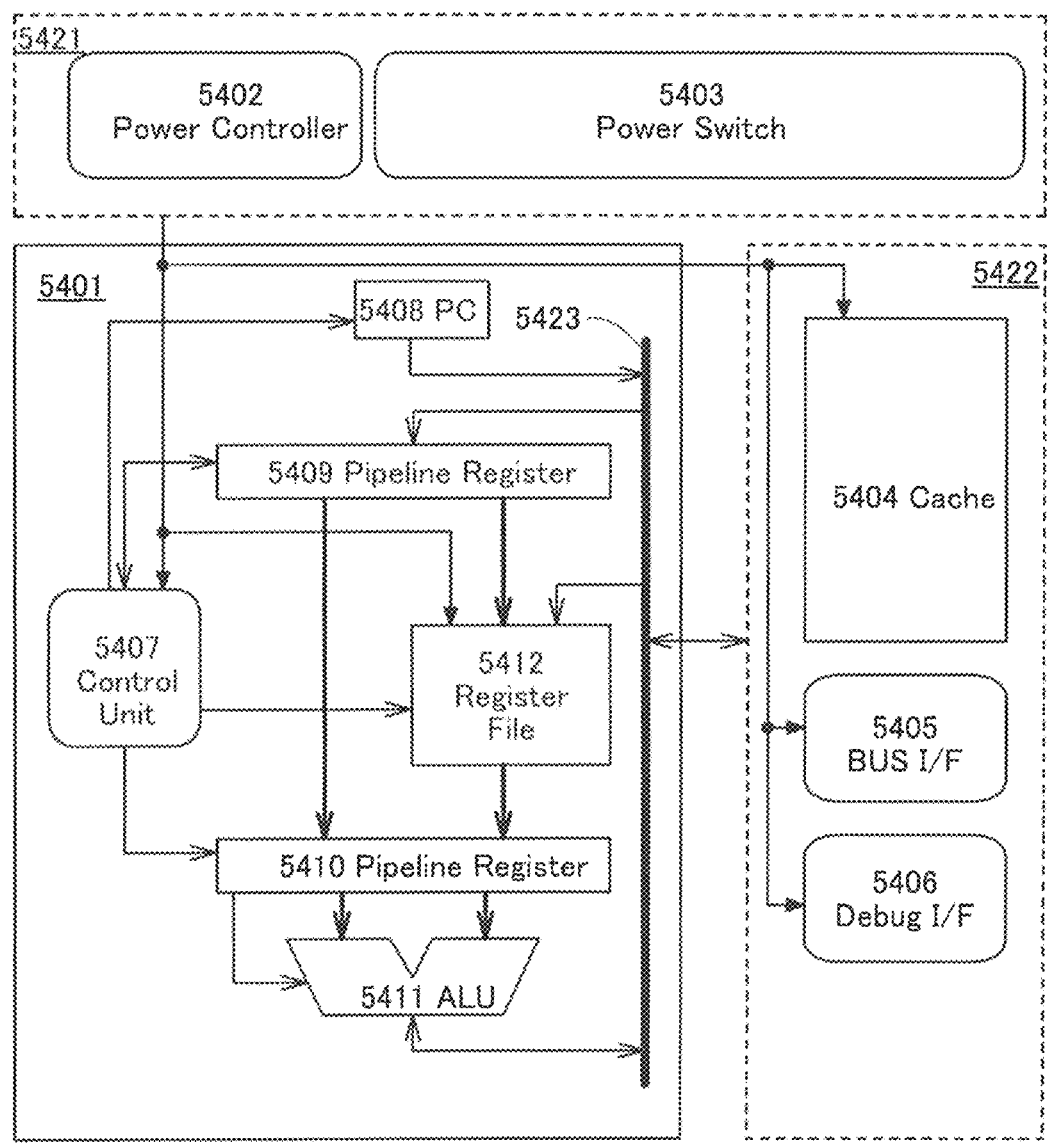
FIG. 51 is a block diagram illustrating a semiconductor device of one embodiment of the present invention.

A semiconductor device 5400 shown in FIG. 51 includes a CPU core 5401, a power management unit 5421, and a peripheral circuit 5422. The power management unit 5421 includes a power controller 5402 and a power switch 5403. The peripheral circuit 5422 includes a cache 5404 including cache memory, a bus interface (BUS I/F) 5405, and a debug interface (Debug I/F) 5406. The CPU core 5401 includes a data bus 5423, a control unit 5407, a PC (program counter) 5408, a pipeline register 5409, a pipeline register 5410, an ALU (arithmetic logic unit) 5411, and a register file 5412. Data is transmitted between the CPU core 5401 and the peripheral circuit 5422 such as the cache 5404 via the data bus 5423.

The semiconductor device (cell) can be used for many logic circuits typified by the power controller 5402 and the control unit 5407, particularly for all logic circuits that can be constituted using standard cells. Accordingly, the semiconductor device 5400 can be small. The semiconductor device 5400 can have reduced power consumption. The semiconductor device 5400 can have a higher operating speed. The semiconductor device 5400 can have a smaller power supply voltage variation.

When p-channel Si transistors and the transistor described in the above embodiment which includes an oxide semiconductor (preferably an oxide containing In, Ga, and Zn) in a channel formation region are used in the semiconductor device (cell) and the semiconductor device (cell) is used in the semiconductor device 5400, the semiconductor device 5400 can be small. The semiconductor device 5400 can have reduced power consumption. The semiconductor device 5400 can have a higher operating speed. Particularly when the Si transistors are only p-channel ones, the manufacturing cost can be reduced.

The control unit 5407 has functions of decoding and executing instructions contained in a program such as inputted applications by controlling the overall operations of the PC 5408, the pipeline registers 5409 and 5410, the ALU 5411, the register file 5412, the cache 5404, the bus interface 5405, the debug interface 5406, and the power controller 5402.

The ALU 5411 has a function of performing a variety of arithmetic operations such as four arithmetic operations and logic operations.

The cache 5404 has a function of temporarily storing frequently used data. The PC 5408 is a register having a function of storing an address of an instruction to be executed next. Note that although not shown in FIG. 51, the cache 5404 is provided with a cache controller for controlling the operation of the cache memory.

The pipeline register 5409 has a function of temporarily storing instruction data.

The register file 5412 includes a plurality of registers including a general-purpose register and can store data that is read from the main memory, data obtained as a result of arithmetic operations in the ALU 5411, or the like.

The pipeline register 5410 has a function of temporarily storing data used for arithmetic operations of the ALU 5411, data obtained as a result of arithmetic operations of the ALU 5411, or the like.

The bus interface 5405 has a function of a path for data between the semiconductor device 5400 and various devices outside the semiconductor device 5400. The debug interface 5406 has a function of a path of a signal for inputting an instruction to control debugging to the semiconductor device 5400.

The power switch 5403 has a function of controlling supply of a power supply voltage to various circuits included in the semiconductor device 5400 other than the power controller 5402. The above various circuits belong to several different power domains. The power switch 5403 controls whether the power supply voltage is supplied to the various circuits in the same power domain. In addition, the power controller 5402 has a function of controlling the operation of the power switch 5403.

The semiconductor device 5400 having the above structure is capable of performing power gating. A description will be given of an example of the power gating operation sequence.

First, by the CPU core 5401, timing for stopping the supply of the power supply voltage is set in a register of the power controller 5402. Then, an instruction of starting power gating is sent from the CPU core 5401 to the power controller 5402. Then, various registers and the cache 5404 included in the semiconductor device 5400 start data saving. Then, the power switch 5403 stops the supply of a power supply voltage to the various circuits other than the power controller 5402 included in the semiconductor device 5400. Then, an interrupt signal is input to the power controller 5402, whereby the supply of the power supply voltage to the various circuits included in the semiconductor device 5400 is started. Note that a counter may be provided in the power controller 5402 to be used to determine the timing of starting the supply of the power supply voltage regardless of input of an interrupt signal. Next, the various registers and the cache 5404 start data restoration. Then, execution of an instruction is resumed in the control unit 5407.

Such power gating can be performed in the whole processor or one or a plurality of logic circuits included in the processor. Furthermore, power supply can be stopped even for a short time. Consequently, power consumption can be reduced at a fine spatial or temporal granularity.

In performing power gating, data held by the CPU core 5401 or the peripheral circuit 5422 is preferably saved in a short time. In that case, the power can be turned on or off in a short time, and an effect of saving power becomes significant.

In order that the data held by the CPU core 5401 or the peripheral circuit 5422 be saved in a short time, the data is preferably saved in a flip-flop circuit itself (referred to as a flip-flop circuit capable of backup operation). Furthermore, the data is preferably saved in an SRAM cell itself (referred to as an SRAM cell capable of backup operation). The flip-flop circuit and SRAM cell which are capable of backup operation preferably include transistors including an oxide semiconductor (preferably an oxide containing In, Ga, and Zn) in a channel formation region. Consequently, the transistor has a small off-state current; thus, the flip-flop circuit and SRAM cell which are capable of backup operation can retain data for a long time without power supply. When the transistor has a high switching speed, the flip-flop circuit and SRAM cell which are capable of backup operation can save and restore data in a short time in some cases.

An example of the flip-flop circuit capable of backup operation is described with reference to FIG. 52.

Figure 52:
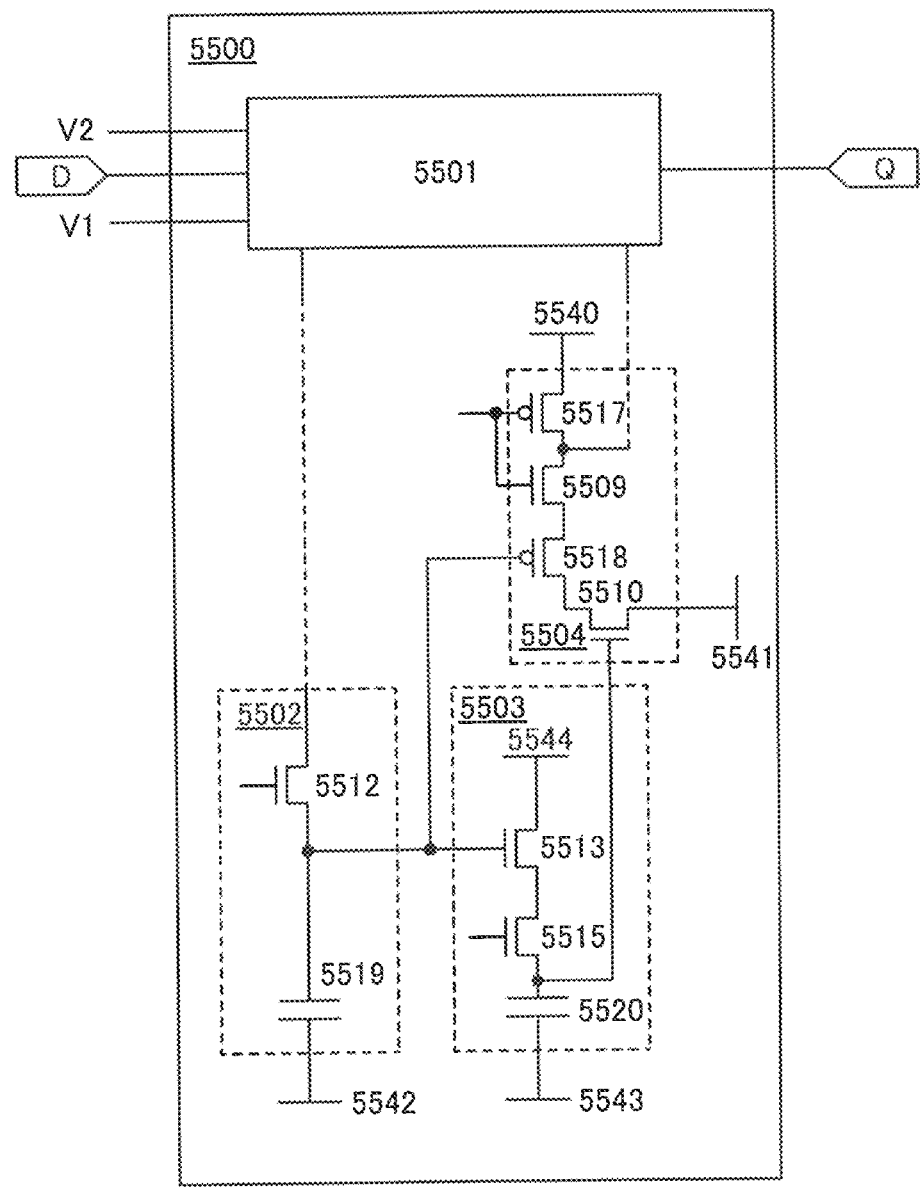
FIG. 52 is a circuit diagram illustrating a semiconductor device of one embodiment of the present invention.

A semiconductor device 5500 shown in FIG. 52 is an example of the flip-flop circuit capable of backup operation. The semiconductor device 5500 includes a first memory circuit 5501, a second memory circuit 5502, a third memory circuit 5503, and a read circuit 5504. As a power supply voltage, a potential difference between a potential V1 and a potential V2 is supplied to the semiconductor device 5500. One of the potential V1 and the potential V2 is at a high level, and the other is at a low level. An example of the structure of the semiconductor device 5500 when the potential V1 is at a low level and the potential V2 is at a high level will be described below.

The first memory circuit 5501 has a function of retaining data when a signal D including the data is input in a period during which the power supply voltage is supplied to the semiconductor device 5500. Furthermore, the first memory circuit 5501 outputs a signal Q including the retained data in the period during which the power supply voltage is supplied to the semiconductor device 5500. On the other hand, the first memory circuit 5501 cannot retain data in a period during which the power supply voltage is not supplied to the semiconductor device 5500. That is, the first memory circuit 5501 can be referred to as a volatile memory circuit.

The second memory circuit 5502 has a function of reading the data held in the first memory circuit 5501 to store (or save) it. The third memory circuit 5503 has a function of reading the data held in the second memory circuit 5502 to store (or save) it. The read circuit 5504 has a function of reading the data held in the second memory circuit 5502 or the third memory circuit 5503 to store (or restore) it in the first memory circuit 5501.

In particular, the third memory circuit 5503 has a function of reading the data held in the second memory circuit 5502 to store (or save) it even in the period during which the power supply voltage is not supplied to the semiconductor device 5500.

As shown in FIG. 52, the second memory circuit 5502 includes a transistor 5512 and a capacitor 5519. The third memory circuit 5503 includes a transistor 5513, a transistor 5515, and a capacitor 5520. The read circuit 5504 includes a transistor 5510, a transistor 5518, a transistor 5509, and a transistor 5517.

The transistor 5512 has a function of charging and discharging the capacitor 5519 in accordance with data held in the first memory circuit 5501. The transistor 5512 is desirably capable of charging and discharging the capacitor 5519 at a high speed in accordance with data held in the first memory circuit 5501. Specifically, the transistor 5512 desirably contains crystalline silicon (preferably polycrystalline silicon, still preferably single crystal silicon) in a channel formation region.

The conduction state or the non-conduction state of the transistor 5513 is determined in accordance with the charge held in the capacitor 5519. The transistor 5515 has a function of charging and discharging the capacitor 5520 in accordance with the potential of a wiring 5544 when the transistor 5513 is in a conduction state. It is desirable that the off-state current of the transistor 5515 be extremely small. Specifically, the transistor 5515 desirably contains an oxide semiconductor (preferably an oxide containing In, Ga, and Zn) in a channel formation region.

Specific connection relations between the elements will be described. One of a source and a drain of the transistor 5512 is connected to the first memory circuit 5501. The other of the source and the drain of the transistor 5512 is connected to one electrode of the capacitor 5519, a gate of the transistor 5513, and a gate of the transistor 5518. The other electrode of the capacitor 5519 is connected to a wiring 5542. One of a source and a drain of the transistor 5513 is connected to the wiring 5544. The other of the source and the drain of the transistor 5513 is connected to one of a source and a drain of the transistor 5515. The other of the source and the drain of the transistor 5515 is connected to one electrode of the capacitor 5520 and a gate of the transistor 5510. The other electrode of the capacitor 5520 is connected to a wiring 5543. One of a source and a drain of the transistor 5510 is connected to a wiring 5541. The other of the source and the drain of the transistor 5510 is connected to one of a source and a drain of the transistor 5518. The other of the source and the drain of the transistor 5518 is connected to one of a source and a drain of the transistor 5509. The other of the source and the drain of the transistor 5509 is connected to one of a source and a drain of the transistor 5517 and the first memory circuit 5501. The other of the source and the drain of the transistor 5517 is connected to a wiring 5540. Although a gate of the transistor 5509 is connected to a gate of the transistor 5517 in FIG. 52, it is not necessarily connected to the gate of the transistor 5517.

The transistor 200 and/or the transistor 400 described in the above embodiment as an example can be applied to the transistor 5515. Because of the small off-state current of the transistor 5515, the semiconductor device 5500 can retain data for a long time without power supply. The favorable switching characteristics of the transistor 5515 allow the semiconductor device 5500 to perform high-speed backup and recovery.

The structure described in this embodiment can be used in appropriate combination with the structure described in any of the other embodiments.

Embodiment 8

In this embodiment, an example of an imaging device including the transistor or the like of one embodiment of the present invention is described.

<Imaging Device>

An imaging device of one embodiment of the present invention is described below.

Figure 53A:
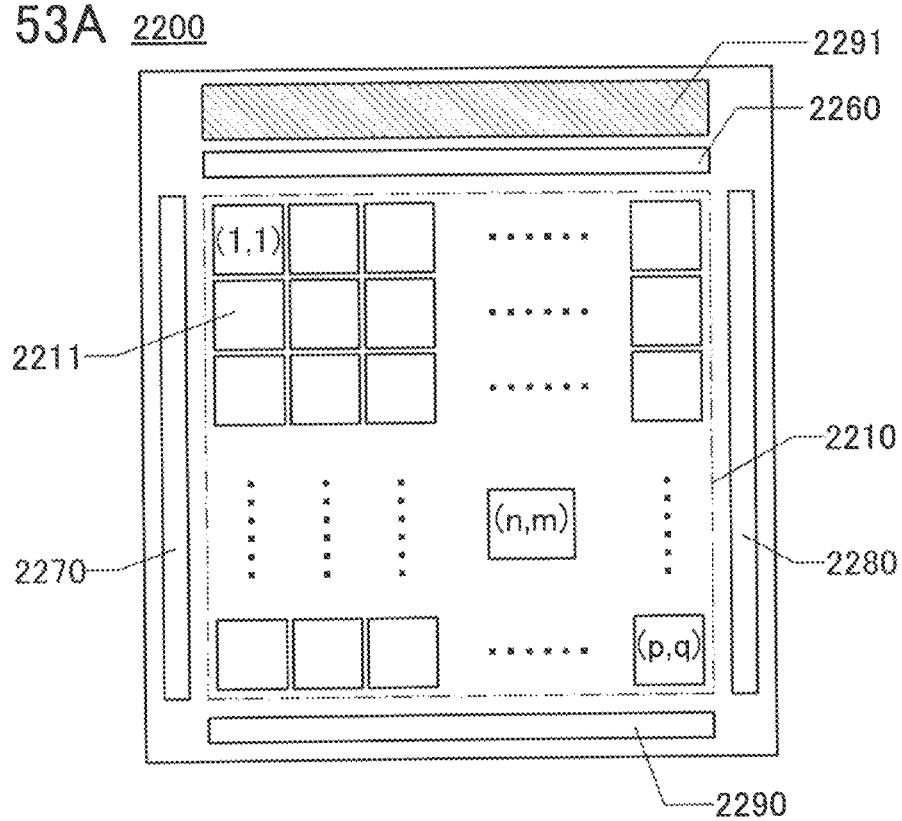
FIGS. 53A and 53B are top views each illustrating a semiconductor device of one embodiment of the present invention.

FIG. 53A is a plan view illustrating an example of an imaging device 2200 of one embodiment of the present invention. The imaging device 2200 includes a pixel portion 2210 and peripheral circuits for driving the pixel portion 2210 (a peripheral circuit 2260, a peripheral circuit 2270, a peripheral circuit 2280, and a peripheral circuit 2290). The pixel portion 2210 includes a plurality of pixels 2211 arranged in a matrix with p rows and q columns (p and q are each an integer of 2 or more). The peripheral circuit 2260, the peripheral circuit 2270, the peripheral circuit 2280, and the peripheral circuit 2290 are each connected to the plurality of pixels 2211 and have a function of supplying a signal for driving the plurality of pixels 2211. In this specification and the like, in some cases, a "peripheral circuit" or a "driver circuit" indicates all of the peripheral circuits 2260, 2270, 2280, and 2290 and the like. For example, the peripheral circuit 2260 can be regarded as part of the peripheral circuit.

The imaging device 2200 preferably includes a light source 2291. The light source 2291 can emit detection light P1.

The peripheral circuit includes at least one of a logic circuit, a switch, a buffer, an amplifier circuit, and a converter circuit. The peripheral circuit may be formed over a substrate where the pixel portion 2210 is formed. A semiconductor device such as an IC chip may be used as part or the whole of the peripheral circuit. Note that as the peripheral circuit, one or more of the peripheral circuits 2260, 2270, 2280, and 2290 may be omitted.

Figure 53B:
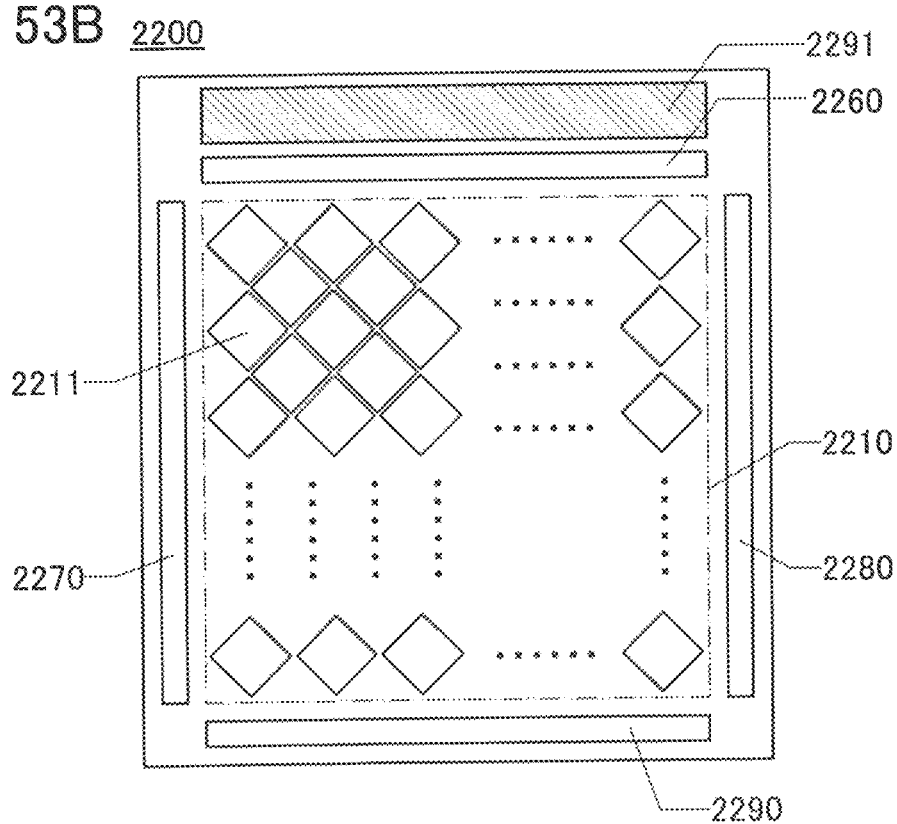

As illustrated in FIG. 53B, the pixels 2211 may be provided to be inclined in the pixel portion 2210 included in the imaging device 2200. When the pixels 2211 are obliquely arranged, the distance between pixels (pitch) can be shortened in the row direction and the column direction. Accordingly, the quality of an image taken with the imaging device 2200 can be improved.

Configuration Example 1 of Pixel

The pixel 2211 included in the imaging device 2200 is formed with a plurality of subpixels 2212, and each of the subpixels 2212 is combined with a filter (a color filter) which transmits light in a specific wavelength band, whereby data for achieving color image display can be obtained.

Figure 54A:
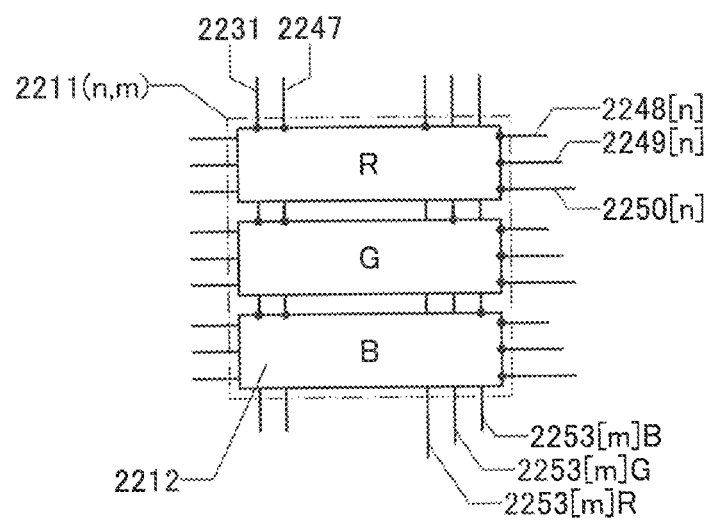
FIGS. 54A and 54B are block diagrams each illustrating a semiconductor device of one embodiment of the present invention.

FIG. 54A is a plan view showing an example of the pixel 2211 with which a color image is obtained. The pixel 2211 illustrated in FIG. 54A includes a subpixel 2212 provided with a color filter that transmits light in a red (R) wavelength band (also referred to as a subpixel 2212R), a subpixel 2212 provided with a color filter that transmits light in a green (G) wavelength band (also referred to as a subpixel 2212G), and a subpixel 2212 provided with a color filter that transmits light in a blue (B) wavelength band (also referred to as a subpixel 2212B). The subpixel 2212 can function as a photosensor.

The subpixels 2212 (the subpixel 2212R, the subpixel 2212G, and the subpixel 2212B) are electrically connected to a wiring 2231, a wiring 2247, a wiring 2248, a wiring 2249, and a wiring 2250. In addition, the subpixel 2212R, the subpixel 2212G, and the subpixel 2212B are connected to respective wirings 2253 which are independently provided. In this specification and the like, for example, the wiring 2248, the wiring 2249, and the wiring 2250 that are connected to the pixel 2211 in the n-th row are referred to as a wiring 2248[n], a wiring 2249[n], and a wiring 2250[n]. For example, the wiring 2253 connected to the pixel 2211 in the m-th column is referred to as a wiring 2253[m]. Note that in FIG. 54A, the wirings 2253 connected to the subpixel 2212R, the subpixel 2212G, and the subpixel 2212B in the pixel 2211 in the m-th column are referred to as a wiring 2253[m]R, a wiring 2253[m]G, and a wiring 2253[m]B. The subpixels 2212 are electrically connected to the peripheral circuit through the above wirings.

Figure 54B:
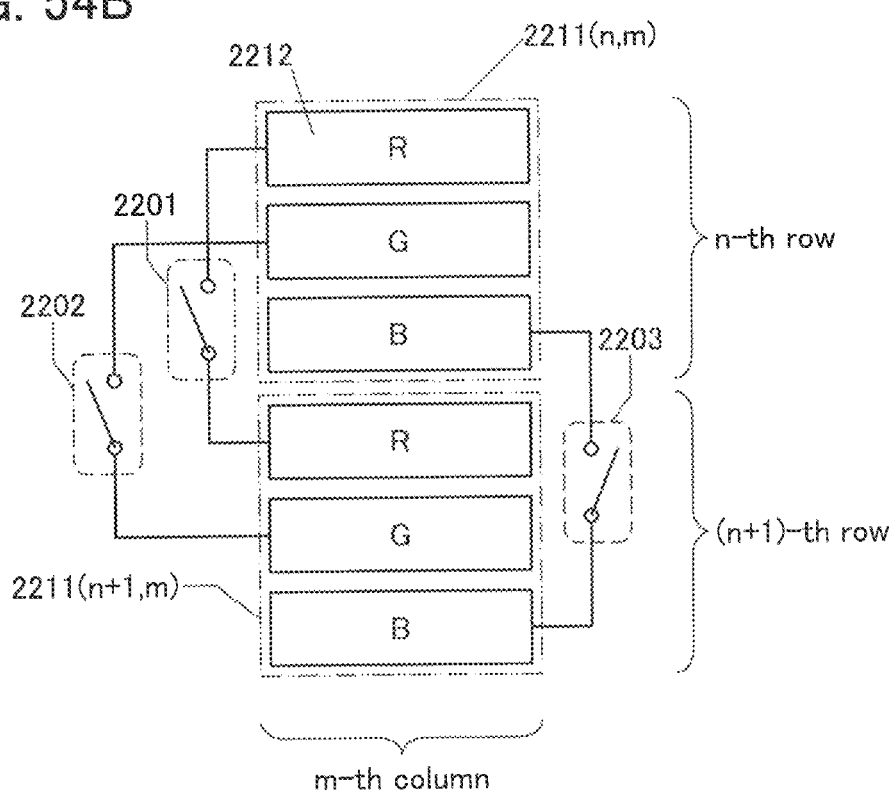

The imaging device 2200 has a structure in which the subpixel 2212 is electrically connected to the subpixel 2212 in an adjacent pixel 2211 which is provided with a color filter transmitting light in the same wavelength band as the subpixel 2212, via a switch. FIG. 54B shows a connection example of the subpixels 2212: the subpixel 2212 in the pixel 2211 provided in the n-th row (n is an integer greater than or equal to 1 and less than or equal to p) and the m-th column (m is an integer greater than or equal to 1 and less than or equal to q) and the subpixel 2212 in the adjacent pixel 2211 provided in an (n+1)-th row and the m-th column In FIG. 54B, the subpixel 2212R provided in the n-th row and the m-th column and the subpixel 2212R provided in the (n+1)-th row and the m-th column are connected to each other via a switch 2201. The subpixel 2212G provided in the n-th row and the m-th column and the subpixel 2212G provided in the (n+1)-th row and the m-th column are connected to each other via a switch 2202. The subpixel 2212B provided in the n-th row and the m-th column and the subpixel 2212B provided in the (n+1)-th row and the m-th column are connected to each other via a switch 2203.

Note that the color filter used in the subpixel 2212 is not limited to red (R), green (G), and blue (B) color filters, and color filters that transmit light of cyan (C), yellow (Y), and magenta (M) may be used. By provision of the subpixels 2212 that sense light in three different wavelength bands in one pixel 2211, a full-color image can be obtained.

The pixel 2211 including the subpixel 2212 provided with a color filter transmitting yellow (Y) light may be provided, in addition to the subpixels 2212 provided with the color filters transmitting red (R), green (G), and blue (B) light. The pixel 2211 including the subpixel 2212 provided with a color filter transmitting blue (B) light may be provided, in addition to the subpixels 2212 provided with the color filters transmitting cyan (C), yellow (Y), and magenta (M) light. When the subpixels 2212 sensing light in four different wavelength bands are provided in one pixel 2211, the reproducibility of colors of an obtained image can be increased.

For example, in FIG. 54A, the pixel number ratio (or the light receiving area ratio) of the subpixel 2212 sensing light in a red wavelength band to the subpixel 2212 sensing light in a green wavelength band and the subpixel 2212 sensing light in a blue wavelength band is not necessarily 1:1:1. For example, the Bayer arrangement in which the pixel number ratio (the light receiving area ratio) of red to green and blue is 1:2:1 may be employed. Alternatively, the pixel number ratio (the light receiving area ratio) of red to green and blue may be 1:6:1.

Note that the number of subpixels 2212 provided in the pixel 2211 may be one, but is preferably two or more. For example, when two or more subpixels 2212 sensing light in the same wavelength band are provided, the redundancy is increased, and the reliability of the imaging device 2200 can be increased.

When an infrared (IR) filter that transmits infrared light and absorbs or reflects visible light is used as the filter, the imaging device 2200 that senses infrared light can be achieved.

Furthermore, when a neutral density (ND) filter (dark filter) is used, output saturation which occurs when a large amount of light enters a photoelectric conversion element (a light-receiving element) can be prevented. With a combination of ND filters with different dimming capabilities, the dynamic range of the imaging device can be increased.

Besides the above-described filter, the pixel 2211 may be provided with a lens. An arrangement example of the pixel 2211, a filter 2254, and a lens 2255 is described with reference to cross-sectional views in FIGS. 55A and 55B. With the lens 2255, a photoelectric conversion element provided in the subpixel 2212 can receive incident light efficiently. Specifically, as illustrated in FIG. 55A, light 2256 enters a photoelectric conversion element 2220 through the lens 2255, the filter 2254 (a filter 2254R, a filter 2254G, and a filter 2254B), a pixel circuit 2230, and the like which are provided in the pixel 2211.

As indicated by a region surrounded with dashed-dotted lines, however, part of the light 2256 indicated by arrows might be blocked by some wirings 2257. Thus, a preferable structure is that the lens 2255 and the filter 2254 are provided on the photoelectric conversion element 2220 side as illustrated in FIG. 55B, whereby the photoelectric conversion element 2220 can efficiently receive the light 2256. When the light 2256 enters the photoelectric conversion element 2220 from the photoelectric conversion element 2220 side, the imaging device 2200 with high sensitivity can be provided.

Figure 55A:
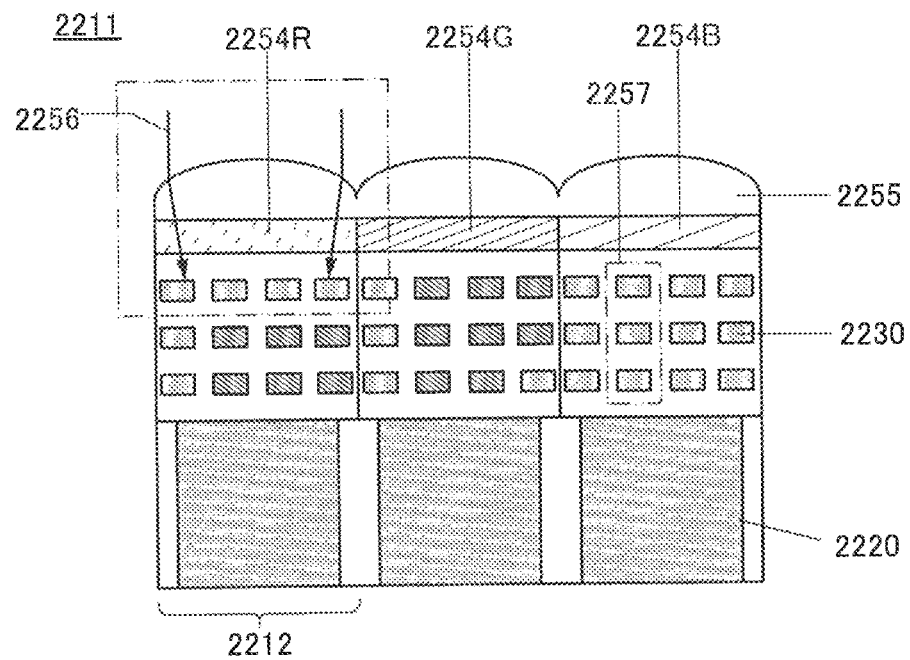
FIGS. 55A and 55B are cross-sectional views each illustrating a semiconductor device of one embodiment of the present invention.
Figure 55B:
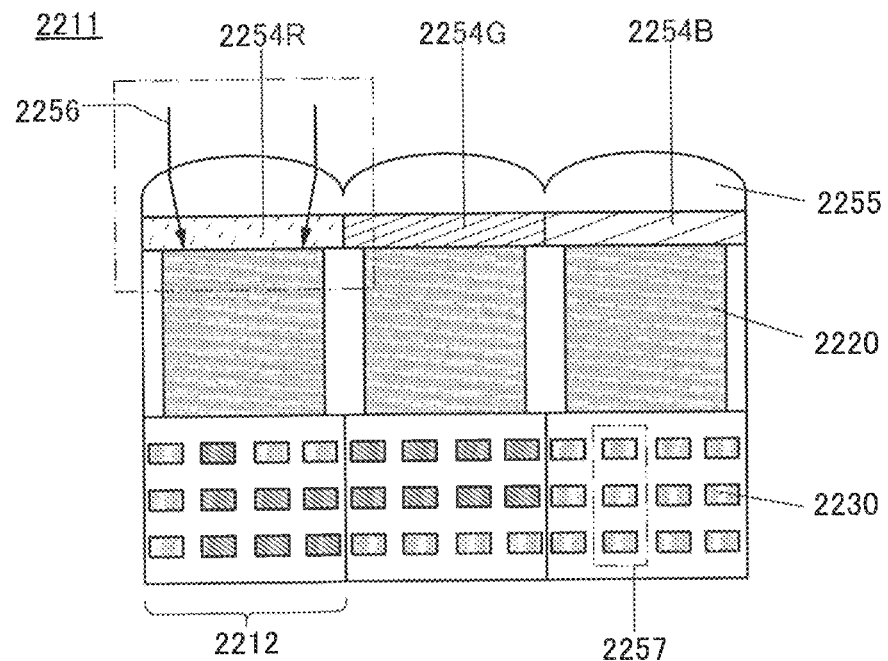

As the photoelectric conversion element 2220 illustrated in FIGS. 55A and 55B, a photoelectric conversion element in which a p-n junction or a p-i-n junction is formed may be used.

The photoelectric conversion element 2220 may be formed using a substance that has a function of absorbing radiation and generating charges. Examples of the substance that has a function of absorbing radiation and generating charges include selenium, lead iodide, mercury iodide, gallium arsenide, cadmium telluride, and a cadmium zinc alloy.

For example, when selenium is used for the photoelectric conversion element 2220, the photoelectric conversion element 2220 can have a light absorption coefficient in a wide wavelength band, such as visible light, ultraviolet light, infrared light, X-rays, and gamma rays.

One pixel 2211 included in the imaging device 2200 may include the subpixel 2212 with a first filter in addition to the subpixel 2212 illustrated in FIGS. 54A and 54B.

Configuration Example 2 of Pixel

An example of a pixel including a transistor including silicon and a transistor including an oxide semiconductor is described below. A transistor similar to any of the transistors described in the above embodiments can be used as each of the transistors.

Figure 56:
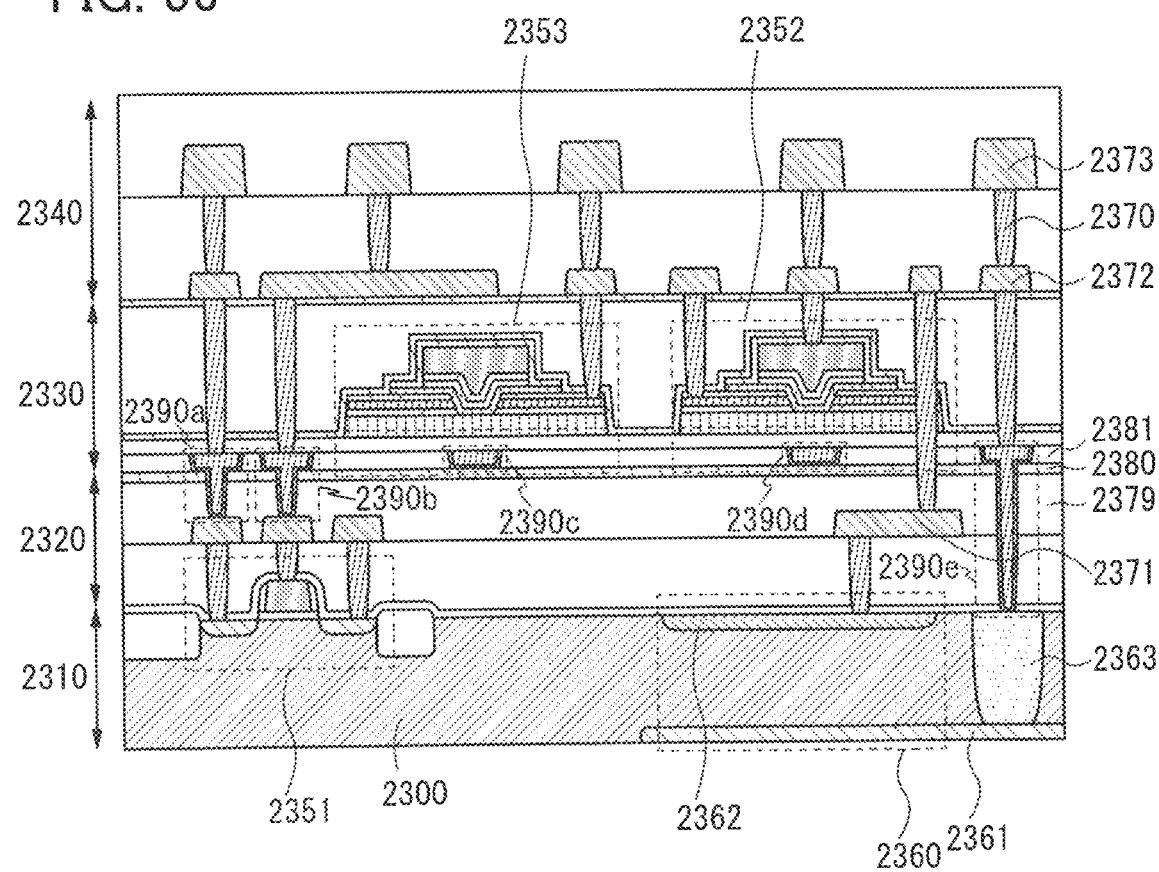
FIG. 56 is a cross-sectional view illustrating a semiconductor device of one embodiment of the present invention.

FIG. 56 is a cross-sectional view of an element included in an imaging device. The imaging device illustrated in FIG. 56 includes a transistor 2351 including silicon on a silicon substrate 2300, transistors 2352 and 2353 which include an oxide semiconductor and are stacked over the transistor 2351, and a photodiode 2360 provided in the silicon substrate 2300. The transistors and a cathode 2362 of the photodiode 2360 are electrically connected to various plugs 2370 and wirings 2371. In addition, an anode 2361 of the photodiode 2360 is electrically connected to the plug 2370 through a low-resistance region 2363.

The imaging device includes a layer 2310 including the transistor 2351 provided on the silicon substrate 2300 and the photodiode 2360 provided in the silicon substrate 2300, a layer 2320 which is in contact with the layer 2310 and includes the wirings 2371, a layer 2330 which is in contact with the layer 2320 and includes the transistors 2352 and 2353, and a layer 2340 which is in contact with the layer 2330 and includes wirings 2372 and wirings 2373.

In the example of the cross-sectional view in FIG. 56, a light-receiving surface of the photodiode 2360 is provided on the side opposite to a surface of the silicon substrate 2300 where the transistor 2351 is formed. With this structure, a light path can be secured without an influence of the transistors and the wirings. Thus, a pixel with a high aperture ratio can be formed. Note that the light-receiving surface of the photodiode 2360 can be the same as the surface where the transistor 2351 is formed.

In the case where a pixel is formed with the use of only transistors including an oxide semiconductor, the layer 2310 may include the transistor including an oxide semiconductor. Alternatively, the layer 2310 may be omitted, and the pixel may include only transistors including an oxide semiconductor.

Note that the silicon substrate 2300 may be an SOI substrate. Furthermore, the silicon substrate 2300 can be replaced with a substrate including germanium, silicon germanium, silicon carbide, gallium arsenide, aluminum gallium arsenide, indium phosphide, gallium nitride, or an organic semiconductor.

Here, an insulator 2380 is provided between the layer 2310 including the transistor 2351 and the photodiode 2360 and the layer 2330 including the transistors 2352 and 2353. However, there is no limitation on the position of the insulator 2380. An insulator 2379 is provided under the insulator 2380, and an insulator 2381 is provided over the insulator 2380.

Conductors 2390a to 2390e are provided in openings formed in the insulators 2379 to 2381. The conductors 2390a, 2390b, and 2390e function as plugs and wirings. The conductor 2390c functions as a back gate of the transistor 2353. The conductor 2390d functions as a back gate of the transistor 2352.

Hydrogen in an insulator provided in the vicinity of a channel formation region of the transistor 2351 terminates dangling bonds of silicon; accordingly, the reliability of the transistor 2351 can be improved. In contrast, hydrogen in the insulator provided in the vicinity of the transistor 2352, the transistor 2353, and the like becomes one of factors generating a carrier in the oxide semiconductor. Thus, the hydrogen may cause a reduction of the reliability of the transistor 2352, the transistor 2353, and the like. For this reason, in the case where the transistor including an oxide semiconductor is provided over the transistor including a silicon-based semiconductor, it is preferable that the insulator 2380 having a function of blocking hydrogen be provided between the transistors. When hydrogen is confined in layers below the insulator 2380, the reliability of the transistor 2351 can be improved. In addition, hydrogen can be prevented from diffusing from the layers below the insulator 2380 into layers above the insulator 2380; thus, the reliability of the transistor 2352, the transistor 2353, and the like can be increased. The conductors 2390a, 2390b, and 2390e can prevent hydrogen from diffusing into the layers provided thereover through the via holes formed in the insulator 2380, which results in improvement in the reliability of the transistors 2352 and 2353 and the like.

In the cross-sectional view in FIG. 56, the photodiode 2360 in the layer 2310 and the transistor in the layer 2330 can be formed so as to overlap with each other. Thus, the degree of integration of pixels can be increased. In other words, the resolution of the imaging device can be increased.

Part or the whole of the imaging device may be bent. The bent imaging device enables the curvature of field and astigmatism to be reduced. Thus, the optical design of a lens or the like, which is used in combination with the imaging device, can be facilitated. For example, the number of lenses used for aberration correction can be reduced; accordingly, a reduction in size or weight of electronic devices using the imaging device, and the like, can be achieved. In addition, the quality of a captured image can be improved.

The structure described in this embodiment can be used in appropriate combination with the structure described in any of the other embodiments.

Embodiment 9

In this embodiment, a semiconductor wafer, a chip, and an electronic component of one embodiment of the present invention will be described.

<Semiconductor Wafer and Chip>

Figure 57A:
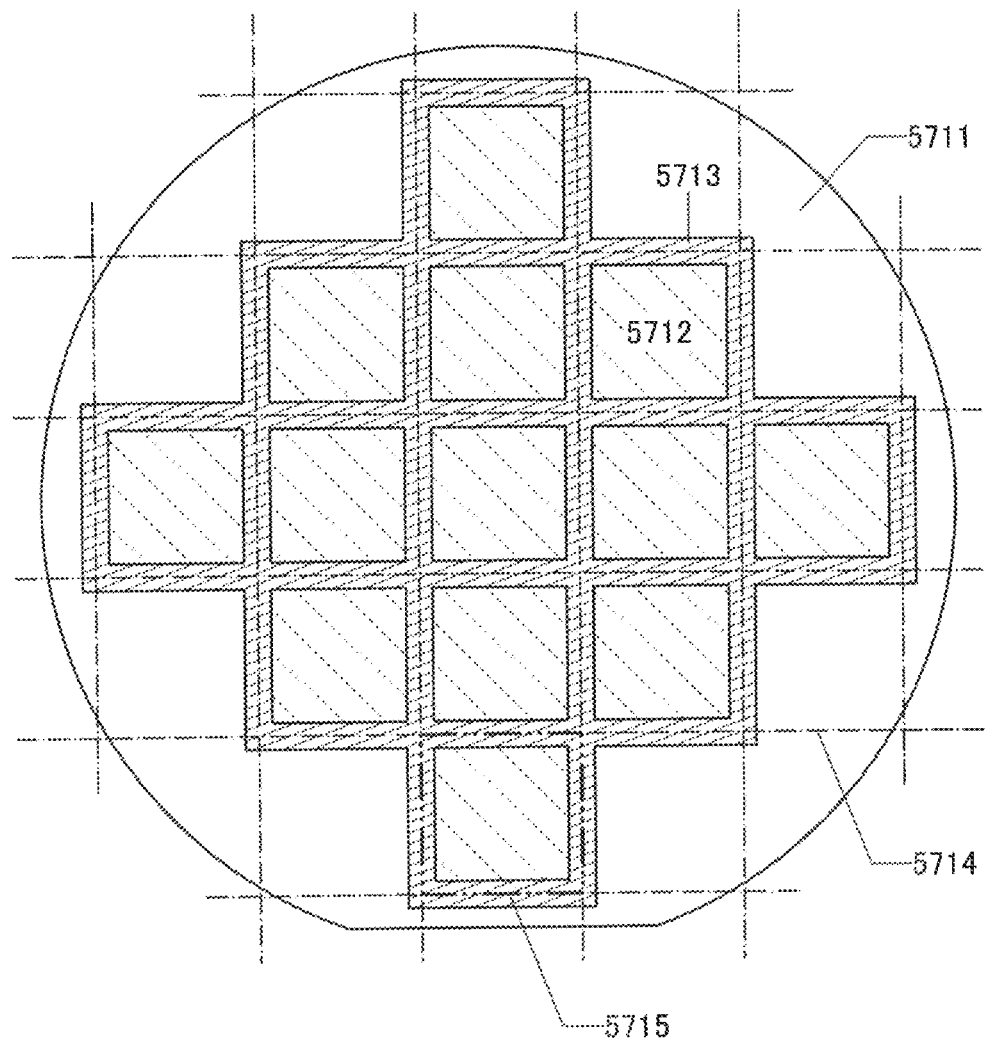
FIGS. 57A and 57B are top views illustrating a semiconductor device of one embodiment of the present invention.

FIG. 57A is a top view illustrating a substrate 5711 before dicing treatment. As the substrate 5711, a semiconductor substrate (also referred to as a "semiconductor wafer") can be used, for example. A plurality of circuit regions 5712 are provided over the substrate 5711. The semiconductor device of one embodiment of the present invention, a CPU, an RF tag, an image sensor, or the like can be provided in the circuit region 5712.

Figure 57B:
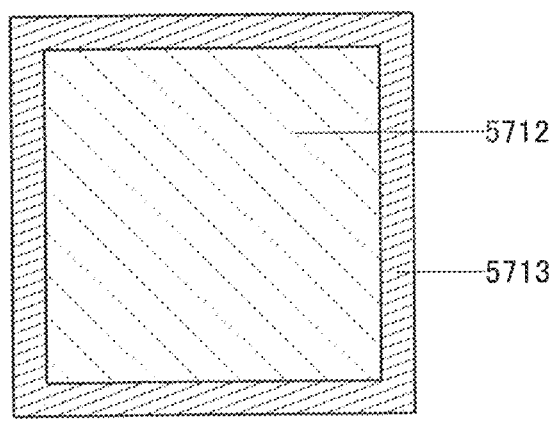

The plurality of circuit regions 5712 are each surrounded by a separation region 5713. Separation lines (also referred to as "dicing lines") 5714 are set at a position overlapping with the separation region 5713. The substrate 5711 can be cut along the separation lines 5714 into chips 5715 including the circuit regions 5712. FIG. 57B is an enlarged view of the chip 5715.

A conductive layer or a semiconductor layer may be provided in the separation region 5713. Providing a conductive layer or a semiconductor layer in the separation region 5713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example Providing a conductive layer or a semiconductor layer in the separation region 5713 allows a reduction in the usage of the pure water. Therefore, the cost of manufacturing semiconductor devices can be reduced. Thus, semiconductor devices can be manufactured with improved productivity.

For a semiconductor layer provided in the separation region 5713, a material having a band gap greater than or equal to 2.5 eV and less than or equal to 4.2 eV, preferably greater than or equal to 2.7 eV and less than or equal to 3.5 eV is preferably used. The use of such a material allows accumulated charges to be released slowly; thus, the rapid move of charges due to ESD can be suppressed and electrostatic breakdown is less likely to occur.

<Electronic Component>

Figure 58A:
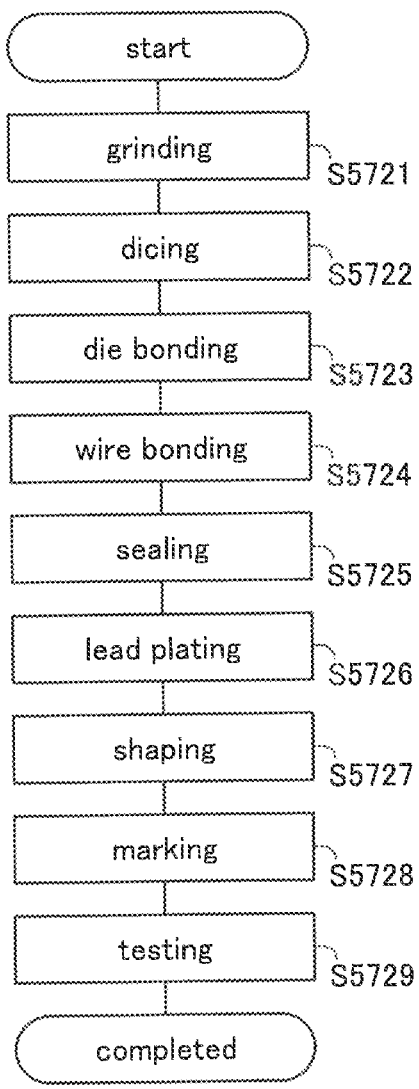
FIG. 58A is a flowchart for describing one embodiment of the present invention and FIG. 58B is a perspective view illustrating a semiconductor device.
Figure 58B:
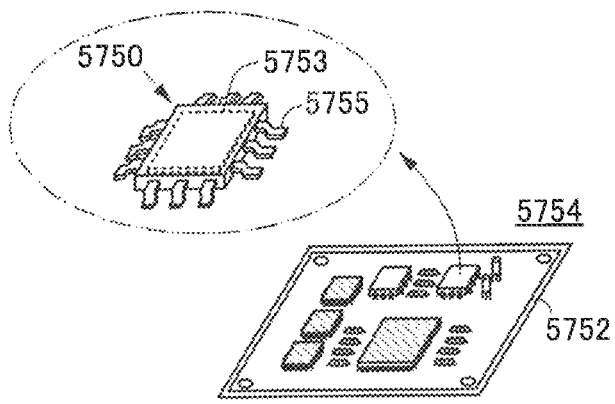

FIGS. 58A and 58B show an example where the chip 5715 is used to make an electronic component. Note that the electronic component is also referred to as a semiconductor package or an IC package. This electronic component has a plurality of standards and names depending on a terminal extraction direction and a terminal shape.

The electronic component is completed when the semiconductor device described in the above embodiment is combined with components other than the semiconductor device in an assembly process (post-process).

The post-process will be described with reference to a flow chart in FIG. 58A. After an element substrate including the semiconductor device described in the above embodiment is completed in a pre-process, a back surface grinding step in which a back surface (a surface where the semiconductor device and the like are not formed) of the element substrate is ground is performed (Step S5721). When the element substrate is thinned by grinding, warpage or the like of the element substrate is reduced, so that the size of the electronic component can be reduced.

Next, the element substrate is divided into a plurality of chips (chips 5715) in a dicing step (Step S5722). Then, the separated chips are individually picked up to be bonded to a lead frame in a die bonding step (Step S5723). To bond a chip and a lead frame in the die bonding step, a method such as bonding with a resin or a tape is selected as appropriate depending on products. Note that the chip may be bonded to an interposer substrate instead of the lead frame.

Next, a wire bonding step for electrically connecting a lead of the lead frame and an electrode on the chip through a metal fine line (wire) is performed (Step S5724). A silver line or a gold line can be used as the metal fine line. Ball bonding or wedge bonding can be used as the wire bonding.

The wire-bonded chip is subjected to a sealing step (a molding step) of sealing the chip with an epoxy resin or the like (Step S5725). Through the sealing step, the inside of the electronic component is filled with a resin, so that a circuit portion incorporated in the chip and a wire for connecting the chip to the lead can be protected from external mechanical force, and deterioration of characteristics (a decrease in reliability) due to moisture or dust can be reduced.

Subsequently, the lead of the lead frame is plated in a lead plating step (Step S5726). This plating process prevents rust of the lead and facilitates soldering at the time of mounting the chip on a printed circuit board in a later step. Then, the lead is cut and processed in a shaping step (Step S5727).

Next, a printing (marking) step is performed on a surface of the package (Step S5728). After a testing step (Step S5729) for checking whether an external shape is good and whether there is a malfunction, for example, the electronic component is completed.

FIG. 58B is a schematic perspective diagram of a completed electronic component. The schematic perspective diagram in FIG. 58B illustrates a quad flat package (QFP) as an example of the electronic component. An electronic component 5750 in FIG. 58B includes a lead 5755 and a semiconductor device 5753. As the semiconductor device 5753, the semiconductor device described in the above embodiment or the like can be used.

The electronic component 5750 in FIG. 58B is mounted on a printed circuit board 5752, for example. A plurality of electronic components 5750 are combined and electrically connected to each other over the printed circuit board 5752; thus, a substrate on which the electronic components are mounted (a circuit board 5754) is completed. The completed circuit board 5754 is provided in an electronic device or the like.

The structure described in this embodiment can be used in appropriate combination with the structure described in any of the other embodiments.

Embodiment 10

In this embodiment, electronic devices including the transistor or the like of one embodiment of the present invention are described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 59A to 59F illustrate specific examples of these electronic devices.

Figure 59A:
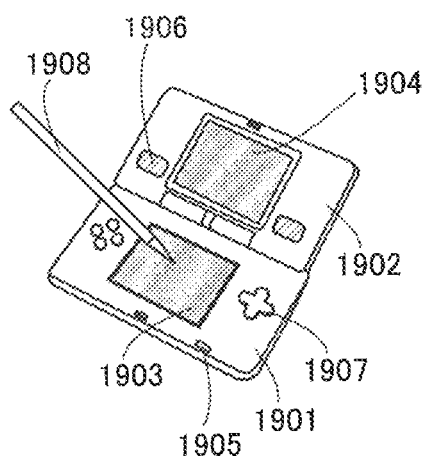
FIGS. 59A to 59F are perspective views each illustrating an electronic device of one embodiment of the present invention.

FIG. 59A illustrates a portable game machine, which includes a housing 1901, a housing 1902, a display portion 1903, a display portion 1904, a microphone 1905, a speaker 1906, an operation key 1907, a stylus 1908, and the like. Although the portable game machine in FIG. 59A has the two display portions 1903 and 1904, the number of display portions included in a portable game machine is not limited to this.

Figure 59B:
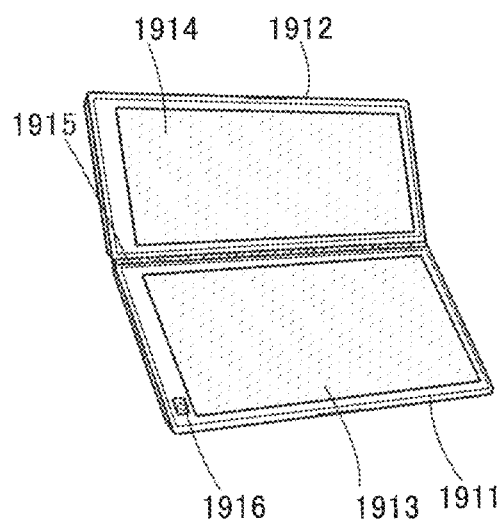

FIG. 59B illustrates a portable data terminal, which includes a first housing 1911, a second housing 1912, a first display portion 1913, a second display portion 1914, a joint 1915, an operation key 1916, and the like. The first display portion 1913 is provided in the first housing 1911, and the second display portion 1914 is provided in the second housing 1912. The first housing 1911 and the second housing 1912 are connected to each other with the joint 1915, and the angle between the first housing 1911 and the second housing 1912 can be changed with the joint 1915. Images displayed on the first display portion 1913 may be switched in accordance with the angle at the joint 1915 between the first housing 1911 and the second housing 1912. A display device with a position input function may be used as at least one of the first display portion 1913 and the second display portion 1914. Note that the position input function can be added by providing a touch panel in a display device. Alternatively, the position input function can be added by providing a photoelectric conversion element also called a photosensor in a pixel portion of a display device.

Figure 59C:
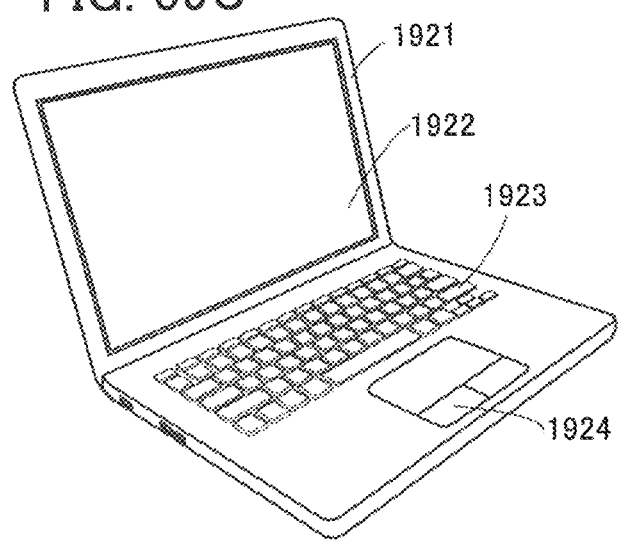

FIG. 59C illustrates a notebook personal computer, which includes a housing 1921, a display portion 1922, a keyboard 1923, a pointing device 1924, and the like.

Figure 59D:
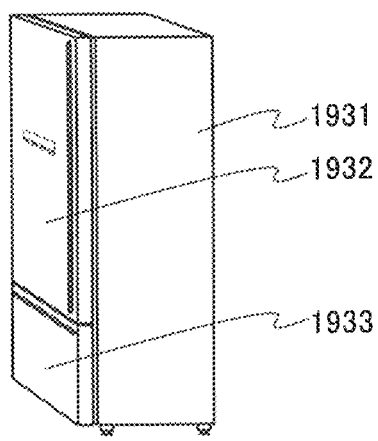

FIG. 59D illustrates an electric refrigerator-freezer, which includes a housing 1931, a refrigerator door 1932, a freezer door 1933, and the like.

Figure 59E:
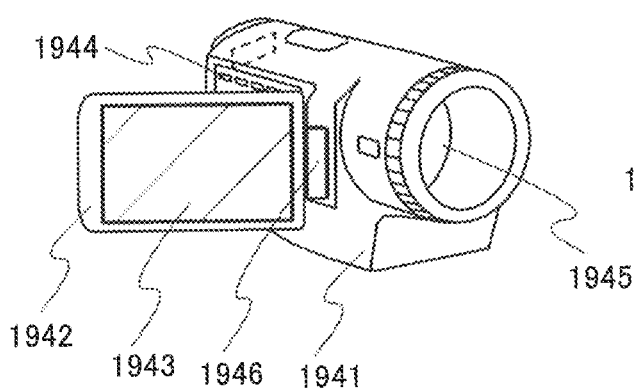

FIG. 59E illustrates a video camera, which includes a first housing 1941, a second housing 1942, a display portion 1943, operation keys 1944, a lens 1945, a joint 1946, and the like. The operation keys 1944 and the lens 1945 are provided for the first housing 1941, and the display portion 1943 is provided for the second housing 1942. The first housing 1941 and the second housing 1942 are connected to each other with the joint 1946, and the angle between the first housing 1941 and the second housing 1942 can be changed with the joint 1946. Images displayed on the display portion 1943 may be switched in accordance with the angle at the joint 1946 between the first housing 1941 and the second housing 1942.

Figure 59F:
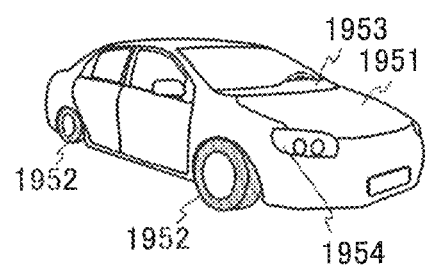

FIG. 59F illustrates a passenger car, which includes a car body 1951, wheels 1952, a dashboard 1953, lights 1954, and the like.

In this embodiment, one embodiment of the present invention has been described. Note that one embodiment of the present invention is not limited thereto. In other words, since various embodiments of the invention are described in this embodiment and the like, one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, source and drain regions of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, source and drain regions of a transistor, or the like of one embodiment of the present invention. Alternatively, depending on circumstances or conditions, an oxide semiconductor is not necessarily included in various transistors, a channel formation region of a transistor, source and drain regions of a transistor, or the like of one embodiment of the present invention, for example.

The structure described in this embodiment can be used in appropriate combination with the structure described in any of the other embodiments.

This application is based on Japanese Patent Application serial no. 2016-056297 filed with Japan Patent Office on Mar. 18, 2016, the entire contents of which are hereby incorporated by reference.

What is claimed is:

1. A method for manufacturing a semiconductor device, comprising the steps of:
    forming a second insulator over a first insulator;
    forming a first opening whose bottom portion reaches the first insulator in the second insulator;
    forming a first gate electrode in the first opening;
    forming a first gate insulator over the second insulator and the first gate electrode;
    forming a first oxide over the first gate insulator;
    forming a second oxide over the first oxide;
    forming a third oxide over the second oxide;
    forming a conductor over the third oxide;
    forming a first layer over the conductor;
    forming a second opening by processing the first layer by a lithography method so that the conductor is exposed in a bottom portion of the second opening;
    forming a second layer comprising the second opening, the third oxide, the conductor, and the first layer by processing the third oxide, the conductor, and the first layer by a lithography method;
    processing the second oxide and the first oxide with use of the second layer as an etching mask;
    removing the third oxide and the conductor exposed in the bottom portion of the second opening to expose the second oxide in the bottom portion of the second opening, to divide the conductor into a source electrode and a drain electrode, the third oxide into a fourth oxide and a fifth oxide, and the first layer into a third layer and a fourth layer, and to form a fifth layer comprising the first oxide, the second oxide, the source electrode, the drain electrode, the fourth oxide, the fifth oxide, the third layer, and the fourth layer;

performing plasma treatment using an oxidizing gas to release and reduce an impurity included in the first oxide and the second oxide;

performing heat treatment in an atmosphere comprising a nitrogen gas and heat treatment in an atmosphere comprising an oxygen gas to release and reduce hydrogen and water included in the first oxide and the second oxide;

forming a sixth oxide over the fifth layer;

forming a second gate insulator over the sixth oxide;

forming a seventh oxide over the second gate insulator; and forming a second gate electrode over the seventh oxide, wherein oxygen is added to the second gate insulator in the step of forming the seventh oxide.

2. The method according to claim 1, wherein the oxidizing gas comprises dinitrogen monoxide.

3. The method according to claim 1, wherein the fourth oxide, the fifth oxide, and the seventh oxide each comprise a metal and oxygen.

4. A method for manufacturing a module, the module comprising:
a semiconductor device manufactured by the method according to claim 1; and
a printed circuit board.

5. A method for manufacturing an electronic device, the electronic device comprising:
a semiconductor device manufactured by the method according to claim 1; and
one of a speaker and an operation key.

6. A method for manufacturing a semiconductor device, comprising the steps of:
forming a first oxide;
forming a second oxide over the first oxide;
forming a third oxide over the second oxide;
forming a first conductor over the third oxide;
dividing the third oxide and the first conductor to form source and drain electrodes;
forming a fourth oxide over the second oxide and the source and drain electrodes;
forming a gate insulating layer over the fourth oxide;
forming a fifth oxide over the gate insulating layer; and
forming a second conductor over the fifth oxide.

7. The method according to claim 6, wherein plasma containing oxygen is used to form the third oxide and the fifth oxide.

8. The method according to claim 6, wherein the third oxide and the fifth oxide each comprise a metal and oxygen.

9. The method according to claim 6, wherein the first oxide, the second oxide, and the fourth oxide each comprise an oxide semiconductor.

10. A method for manufacturing a module, the module comprising:
a semiconductor device manufactured by the method according to claim 6; and
a printed circuit board.

11. A method for manufacturing an electronic device, the electronic device comprising:
a semiconductor device manufactured by the method according to claim 6; and
one of a speaker and an operation key.

12. The method according to claim 6, wherein the fifth oxide and the second conductor function as a gate electrode.

13. The method according to claim 6, wherein the third oxide and the first conductor function as the source and drain electrodes.

14. The method according to claim 6, wherein the first to third oxides comprise a channel formation region.

* * * * *